United States Patent
Molaire

(10) Patent No.: US 10,593,886 B2
(45) Date of Patent: Mar. 17, 2020

(54) OLED DEVICES WITH IMPROVED LIFETIME USING NON-CRYSTALLIZABLE MOLECULAR GLASS MIXTURE HOSTS

(71) Applicant: Molecular Glasses, Inc., Rochester, NY (US)

(72) Inventor: Michel Frantz Molaire, Rochester, NY (US)

(73) Assignee: Molecular Glasses, Inc., Rochester, NY (US)

( * ) Notice: Subject to any disclaimer, the term of this patent is extended or adjusted under 35 U.S.C. 154(b) by 251 days.

(21) Appl. No.: 15/473,193

(22) Filed: Mar. 29, 2017

(65) Prior Publication Data

US 2017/0237004 A1    Aug. 17, 2017

Related U.S. Application Data

(63) Continuation-in-part of application No. PCT/US2016/052884, filed on Sep. 21, 2016, and a
(Continued)

(51) Int. Cl.
*H01L 51/50* (2006.01)
*H01L 51/00* (2006.01)
*C09K 11/02* (2006.01)

(52) U.S. Cl.
CPC .......... *H01L 51/006* (2013.01); *C09K 11/025* (2013.01); *H01L 51/0052* (2013.01);
(Continued)

(58) Field of Classification Search
None
See application file for complete search history.

(56) References Cited

U.S. PATENT DOCUMENTS 3,180,730 A    4/1965    Klupfel et al.
3,567,450 A    3/1971    Fox et al.
(Continued)

FOREIGN PATENT DOCUMENTS

EP    891121 A1    1/1999
EP    1009041 A2    6/2000
(Continued)

OTHER PUBLICATIONS

International Search Report and Written Opinion pertaining to PCT/US2016/052884 dated Dec. 19, 2016.
(Continued)

*Primary Examiner* — Gregory D Clark
(74) *Attorney, Agent, or Firm* — Dinsmore & Shohl LLP

(57) ABSTRACT

An OLED multilayer electroluminescent device includes a cathode, an anode, a light-emitting layer (LEL) disposed therebetween, and charge-transporting layers disposed between (A) the cathode and the light-emitting layer, (B) the anode and the light-emitting layer, or (C) both (A) and (B). The light-emitting layer (LEL) includes a host material and an emitter. The host material includes a high-entropy non-crystallizable molecular glass mixture, which includes hole-transporting capabilities, electron-transporting capabilities, or ambipolar capabilities. The ambipolar capabilities include hole-transporting capabilities and electron-transporting capabilities.

11 Claims, 6 Drawing Sheets

Related U.S. Application Data continuation-in-part of application No. 14/664,899, filed on Mar. 22, 2015, and a continuation-in-part of application No. 14/578,482, filed on Dec. 21, 2014, and a continuation-in-part of application No. 14/467,143, filed on Aug. 25, 2014, now Pat. No. 9,859,505.

(60) Provisional application No. 62/316,690, filed on Apr. 1, 2016, provisional application No. 62/221,605, filed on Sep. 21, 2015, provisional application No. 62/116,352, filed on Feb. 13, 2015, provisional application No. 61/970,348, filed on Mar. 25, 2014, provisional application No. 61/919,252, filed on Dec. 20, 2013, provisional application No. 61/869,742, filed on Aug. 25, 2013, provisional application No. 61/869,745, filed on Aug. 25, 2013, provisional application No. 61/869,747, filed on Aug. 25, 2013.

(52) U.S. Cl.
CPC ...... *H01L 51/0053* (2013.01); *H01L 51/0054* (2013.01); *H01L 51/0058* (2013.01); *H01L 51/0061* (2013.01); *H01L 51/0067* (2013.01); *H01L 51/0068* (2013.01); *H01L 51/0072* (2013.01); *H01L 51/0085* (2013.01); *H01L 51/5012* (2013.01); *H01L 51/5016* (2013.01); *H01L 51/5056* (2013.01); *H01L 51/5072* (2013.01); *H01L 51/5096* (2013.01); *H01L 2251/5384* (2013.01)

(56) References Cited

U.S. PATENT DOCUMENTS

| | | |
|---|---|---|
| 3,658,520 A | 4/1972 | Brantly et al. |
| 3,725,070 A | 4/1973 | Hamb et al. |
| 3,779,750 A | 12/1973 | Merrill et al. |
| 3,803,096 A | 4/1974 | Wilson |
| 3,856,751 A | 12/1974 | Wilson |
| 3,859,097 A | 1/1975 | Hamb et al. |
| 3,859,254 A | 1/1975 | Hamb et al. |
| 3,859,364 A | 1/1975 | Wilson et al. |
| 3,886,124 A | 5/1975 | Wilson |
| 3,897,253 A | 7/1975 | Wilson et al. |
| 3,902,904 A | 9/1975 | Hamb et al. |
| 3,915,939 A | 10/1975 | Wilson et al. |
| 4,356,429 A | 10/1982 | Tang |
| 4,395,475 A | 7/1983 | Noonan et al. |
| 4,416,890 A | 11/1983 | Woltersdorf, Jr. |
| 4,499,165 A | 2/1985 | Molaire |
| 4,588,666 A | 5/1986 | Stolka et al. |
| 4,609,606 A | 9/1986 | Noonan et al. |
| 4,619,890 A | 10/1986 | Molaire et al. |
| 4,626,361 A | 12/1986 | Molaire |
| 4,720,432 A | 1/1988 | Vanslyke et al. |
| 4,767,883 A | 8/1988 | Molaire |
| 4,769,292 A | 9/1988 | Tang et al. |
| 4,902,605 A | 2/1990 | Klein et al. |
| 4,992,349 A | 2/1991 | Chen et al. |
| 5,011,939 A | 4/1991 | Limburg et al. |
| 5,061,569 A | 10/1991 | Vanslyke et al. |
| 5,141,671 A | 8/1992 | Bryan et al. |
| 5,150,006 A | 9/1992 | Van Slyke et al. |
| 5,151,629 A | 9/1992 | Vanslyke |
| 5,176,977 A | 1/1993 | Molaire et al. |
| 5,262,512 A | 11/1993 | Yanus et al. |
| 5,405,709 A | 4/1995 | Littman et al. |
| 5,484,922 A | 1/1996 | Moore et al. |
| 5,593,788 A | 1/1997 | Shi et al. |
| 5,645,948 A | 7/1997 | Shi et al. |
| 5,683,823 A | 11/1997 | Shi et al. |
| 5,747,204 A | 5/1998 | Anzai et al. |
| 5,755,999 A | 5/1998 | Shi et al. |
| 5,928,802 A | 7/1999 | Shi et al. |
| 5,935,720 A | 8/1999 | Chen et al. |
| 5,935,721 A | 8/1999 | Shi et al. |
| 5,976,744 A | 11/1999 | Fuller et al. |
| 6,020,078 A | 2/2000 | Chen et al. |
| 6,066,357 A | 5/2000 | Tang et al. |
| 6,208,075 B1 | 3/2001 | Hung et al. |
| 7,579,127 B2 | 8/2009 | Molaire |
| 7,629,097 B2 | 12/2009 | Molaire |
| 7,776,500 B2 | 8/2010 | Molaire |
| 2004/0170863 A1* | 9/2004 | Kim ............... C07C 13/72 428/690 |
| 2004/0185297 A1 | 9/2004 | Klubek et al. |
| 2005/0067949 A1 | 3/2005 | Natarajan et al. |
| 2005/0072971 A1 | 4/2005 | Marrocco et al. |
| 2007/0292796 A1 | 12/2007 | Molaire |
| 2007/0292799 A1 | 12/2007 | Molaire |
| 2008/0007156 A1* | 1/2008 | Gibson ............ B82Y 20/00 313/503 |
| 2009/0136859 A1 | 5/2009 | Molaire et al. |
| 2011/0129951 A1 | 6/2011 | Kondo et al. |
| 2011/0279020 A1 | 11/2011 | Inoue et al. |
| 2012/0189347 A1 | 7/2012 | Tong |
| 2012/0267618 A1 | 10/2012 | Monkman et al. |
| 2013/0207088 A1 | 8/2013 | Seo |
| 2014/0138669 A1 | 5/2014 | Nakagawa et al. |
| 2014/0145149 A1 | 5/2014 | Lin et al. |
| 2014/0145151 A1 | 5/2014 | Xia et al. |
| 2015/0053894 A1 | 2/2015 | Molaire |
| 2015/0069303 A1 | 3/2015 | Eckes et al. |
| 2015/0179714 A1 | 6/2015 | Molaire |
| 2015/0275076 A1 | 10/2015 | Molaire |

FOREIGN PATENT DOCUMENTS

| | | |
|---|---|---|
| EP | 1029909 A1 | 8/2000 |
| EP | 1162674 A2 | 3/2004 |
| JP | 2013235950 A | 11/2013 |
| WO | 9855561 A1 | 12/1998 |
| WO | 0018851 A1 | 4/2000 |
| WO | 0057676 A1 | 9/2000 |
| WO | 0070655 A2 | 11/2000 |
| WO | 2015031242 A1 | 3/2015 |
| WO | 2015095859 A1 | 6/2015 |
| WO | 2015117100 A1 | 8/2015 |
| WO | 2015148327 A2 | 10/2015 |

OTHER PUBLICATIONS

International Search Report and Written Opinion pertaining to PCT/US2014/052493 dated Jan. 29, 2015.

International Search Report and Written Opinion pertaining to PCT/US2015/021913 dated Oct. 14, 2015.

International Search Report and Written Opinion pertaining to PCT/US2014/071833 dated Apr. 1, 2015.

European Search Report pertaining to EP14840140.9 dated May 2, 2017.

Braun et al., "Visible Light Emission from Semiconducting Polymer Diodes", Appl. Phys. Lett., 1991, 58(18), p. 1982, Ameican Institute of Physics.

Cho et al., "Diversification of Carbazoles by LiCl-Mediated Catalytic CuI Reaction", Bull. Korean Chem. Soc., 2011, 32(7), p. 2461.

Damaceanu et al., "Polymers Containing 1,3,4-Oxadiazole Rings for Advanced Materials", Memoirs of the Scientific Sections of the Romanian Academy, 2011.

Evans et al., "Triplet Energy Back Transfer in Conjugated Polymers with Pendant Phosphorescent Iridium Complexes", J. Am. Chem. Soc., 2006, 128, 6647-6656, American Chemical Society.

Foguth, Alexandra Lee, "Novel Oxadiazole Containing Monomers for Polymeric Light Emitting Devices", Dissertation, 2011, Graduate School of Clemson University.

Gagnon et al., "Triarylamines Designed to Form Molecular Glasses. Derivative of Tris(p-terphenyl-4-yl)amine with Multiple Contiguous Phenyl Substituents", Organic Letters, 2010, 12(3), 404-407, American Chemical Society.

Greczmiel et al., "Polymethacrylates with Pendant Oxadiazole Units Synthesis and Application in Organic LEDs", Macromolecules, 1997, 30, 6042-6046, American Chemical Society.

(56) References Cited

OTHER PUBLICATIONS

Kim et al., "Electroluminescenece of Devices Fabricated Using a Soluble Alq3 Pendent Polymer", Journal of Korean Physical Society, 2008, 53, 3563-3567.

Kohle et al., J. Phys. Chem. B, 2010, 114, 16694-16704, American Chemical Society.

Kraft et al., "Electroluminescent Conjugated Polymers—Seeing Polymers in a New Light", Angew. Chem. Int. Ed., 1998, 37, 402-428, Wiley-VCH Verlag GmbH.

Kulkarni et al., "Electron Transport Materials for Organic Light-Emitting Diodes", Chem. Mater., 2004, 16, 4556-4573, American Chemical Society.

Molaire et al., "Organic Monomeric Glasses: A Novel Class of Materials", Journal of Polymer Science: Part A: Polymer Chemistry, 1989, 27, 2569-2592, John Wiley & Sons, Inc.

Molaire, Michel F., "Influence of Melt Viscosity on the Writing Sensitivity of Organic Dye-Binder Optical-Disk Recording Media", Applied Optics, 1988, 27(4), p. 743.

Ng et al., "Electronic and Light-Emitting Properties of Some Polyimides Based on Bis(2,2':6',2" -terpyridine) Ruthenium(II) Complex", Chem. Mater., 1999, 11, 1165-1170, American Chemical Society.

Nishimoto et al., "A Six-Carbazole-Decorated Cyclophosphazene as a Host with High Triplet Energy to Realize Efficient Delayed-Fluorescence OLEDs", Mater. Horiz., 2014, 1, 264-269, The Royal Society of Chemistry.

Paik et al., "White Light-Emitting Diodes from Novel Silicon-Based Copolymers Containing Both Electron-Transport Oxadiazole and Hole-Transport Carbazole Moieties in the Main Chain", Macromolecules, 2002, 35, 6782-6791, American Chemical Society.

Polikarpov et al., "Achieving High Efficiency in Organic Light-Emitting Devices", Material Matters, accessed 2011, vol. 2, Art. 3.

Popovic et al., "Improving the Efficiency and Stability of Organic Light Emitting Devices by Using Mixed Emitting Layers", SPIE Conference on Organic Light-Emitting Materials and Devices II, 1998, vol. 3476.

Reineke et al., "Recent Progress in the Understanding of Exciton Dynamics within Phosphorescent OLEDs", Phys. Status Solidi A, 2012, 209, 12, 2341-2353, Wiley-VCH Verlag GmbH.

Shi et al., "Doped Organic Electroluminescent Devices with Improved Stability", Appl. Phys. Lett., 1997, 70, p. 1665.

Shirota et al., "Charge Carrier Transporting Molecular Materials and Their Applications in Devices", Chem. Rev., 2007, 107, 953-1010, American Chemical Society.

Tang et al., "Electroluminescence of Doped Organic Thin Films", J. Appl. Phys., 1989, 85(9), American Institute of Physics.

Zhu et al., "Blue Fluorescent Emitters: Design Tactics and Applications in Organic Light-Emitting Diodes", Chem. Soc. Rev., 2013, 42, 4963-4976, The Royal Society of Chemistry.

Zuniga, Carlos A., "Solution-Processable Charge Transport Layers for Phosphorescent Oleds", 2011, Dissertation, Georgia Institute of Technology.

* cited by examiner

OLED DEVICES WITH IMPROVED LIFETIME USING NON-CRYSTALLIZABLE MOLECULAR GLASS MIXTURE HOSTS

CROSS-REFERENCES TO RELATED APPLICATIONS

This application claims the benefit of priority to U.S. Provisional Application Ser. No. 62/316,690, filed Apr. 1, 2016; and is also a continuation-in-part of International Application No. PCT/US2016/052884, filed Sep. 21, 2016, which designates the United States and claims the benefit of priority to U.S. Provisional Application Ser. No. 62/221,605, filed Sep. 21, 2015; and is also a continuation-in-part of U.S. patent application Ser. No. 14/664,899, filed Mar. 22, 2015, which claims the benefit of priority to U.S. Provisional Application Ser. No. 62/116,352, filed Feb. 13, 2015, and to U.S. Provisional Application Ser. No. 61/970,348, filed Mar. 25, 2014; and is also a continuation-in-part of U.S. patent application Ser. No. 14/578,482, filed Dec. 21, 2014, which claims the benefit of priority to U.S. Provisional Application Ser. No. 61/919,252, filed Dec. 20, 2013; and is also a continuation-in-part of U.S. patent application Ser. No. 14/467,143, filed Aug. 25, 2014, which claims the benefit of priority to U.S. Provisional Application Ser. No. 61/869,742, filed Aug. 25, 2013, to U.S. Provisional Application Ser. No. 61/869,745, filed Aug. 25, 2013, and to U.S. Provisional Application Ser. No. 61/869,747, filed Aug. 25, 2013. All of the foregoing applications are incorporated by reference herein in their entirety.

TECHNICAL FIELD

Embodiments of the present disclosure generally relate to organic light emitting diode-containing devices comprising a light emitting layer that contains a high-entropy non-crystallizable molecular glass mixture as host material that improves the operating stability of the device.

BACKGROUND

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. The organic layers in earlier devices, usually composed of a polycyclic aromatic hydrocarbon, were very thick (much greater than 1 μm). Consequently, operating voltages were very high, often greater than 100V.

More recent organic EL devices include an organic EL element consisting of extremely thin layers (e.g. <1.0 μm) between the anode and the cathode. Herein, the organic EL element encompasses the layers between the anode and cathode electrodes. Reducing the thickness lowered the resistance of the organic layer and has enabled devices that operate at much lower voltage. In a basic two-layer EL device structure, described first in U.S. Pat. No. 4,356,429, one organic layer of the EL element adjacent to the anode is specifically chosen to transport holes, therefore, it is referred to as the hole-transporting layer, and the other organic layer is specifically chosen to transport electrons, referred to as the electron-transporting layer. The interface between the two layers provides an efficient site for the recombination of the injected hole/electron pair and the resultant electroluminescence.

There have also been proposed three-layer organic EL devices that contain an organic light-emitting layer (LEL) between the hole-transporting layer and electron-transporting layer, such as that disclosed by Tang et al [J. Applied Physics, Vol. 65, Pages 3610-3616, 1989]. The light-emitting layer commonly consists of a host material doped with a guest material—dopant, which results in an efficiency improvement and allows color tuning.

Since these early inventions, further improvements in device materials have resulted in improved performance in attributes such as operational lifetime, color, luminance efficiency and manufacturability.

Notwithstanding these developments, there are continuing needs for organic EL device components that will provide better performance and, particularly, long operational lifetimes. This is especially true for phosphorescent emitter-containing LEL, particularly blue phosphorescent emitter-containing LEL. There are a number of approaches to achieve better operational lifetimes disclosed in prior publications. An improvement in operational stability due to admixing hole transport material to emissive electron transport was reported by Z. Popovic et al. in Proceeding of the SPIE, vol. 3476, 1998, p. 68-73. An improvement in both device efficiency and operational lifetime was reported to result from doping emissive layer by fluorescent dye such as dimethylquinacridone [J. Shi and C. W. Tang Appl. Phys. Lett., vol. 70, 1997, p. 1665-1667]. Further improvements in operational lifetime of the devices doped with fluorescent dyes were realized by co-doping emissive layer with anthracene derivatives [JP 99273861, JP 284050]. Co-doping by rubrene has been reported to result in 60% increase in operational half-life of the device doped with red fluorescent dye DCJTB [EP 1162674]. This improvement is still insufficient for many commercial applications of the OLED devices. It is desirable to achieve further improvements in OLED stability.

The conversion of electrical energy into light is mediated by excitons. An exciton is like a two particle system: one is an electron excited into an unfilled higher energy orbital of a molecule while the second is a hole created in the ground state due to the excitation of the electron. However, excitons also play an important role in the failure of high efficiency OLED devices. Thus exciton management is essential for improved OLED performance. In their 2012 review, S. Reineke, and M. A. Baldo (S. Reineke and M. A. Baldo, Phys. Status Solidi A 209, 12. 2012 2341-2353) identified three processes that account for triplet exciton quenching: (1) Triplet-polaron quenching (TPA); (2) Electric field induced exciton dissociation; (3) Triplet-triplet annihilation (TTA).

Of the three processes, TTA is the only process that scales with the square of the exciton density, and dominates the decrease in efficiency at high exciton densities (efficiency roll-off). TTA in a doped film can have different underlying mechanisms. One of them is a single-step long-range interaction (dipole-dipole coupling), based on Förster-type energy transfer. The rate of TTA energy transfer is proportional to the spectral overlap of the phosphorescent emission of the donor and the absorption of the acceptor excited triplet state. In a host-guest system where the triplet level of the host is higher than the guest, the single-step long-range mechanism should be the only channel of TTA for typical guest concentrations ranging from 1 to 10 mole %.

An additional TTA channel is mediated by hopping-assisted migration (Dexter-type energy transfer) of triplet excitons in clusters of guest molecules. This mechanism was identified in a TCTA:Ir(ppy)3 guest-host system at concentration around 10 mole %. High angle annular dark field (HAAD) TEM has indeed revealed the presence of Ir(ppy) clusters and aggregation.

More recently, Y. Zhang, and H. Aziz (Yingjie Zhang, and Hany Aziz, *ACS Appl. Mater. Interfaces,* 2016) reported that the degradation mechanisms in blue PHOLEDs are fundamentally the same as those in green PHOLEDs. Their investigations show that quantum yield of both the host and the emitter in the EML degrade due to exciton-polaron interactions, and that the deterioration in material quantum yield plays the primary role in device degradation under operation. The results show that charge balance is also affected by exciton-polaron interactions, but the phenomenon plays a secondary role in comparison. They concluded that the limited stability of the blue devices is a result of faster deterioration in the quantum yield of the emitter.

SUMMARY

The OLED devices according to this disclosure contain a light emitting layer exhibiting improved operational stability.

In embodiments, the OLED multilayer electroluminescent device includes a cathode, an anode, a light-emitting layer (LEL) disposed therebetween, and charge-transporting layers disposed between (A) the cathode and the light-emitting layer, (B) the anode and the light-emitting layer, or (C) both (A) and (B). The light-emitting layer (LEL) includes a host material and an emitter. The host material includes a high-entropy non-crystallizable molecular glass mixture, which includes hole-transporting capabilities, electron-transporting capabilities, or ambipolar capabilities. The ambipolar capabilities include hole-transporting capabilities and electron-transporting capabilities.

In embodiments, the high-entropy non-crystallizable molecular glass mixture of the OLED multilayer electroluminescent device includes three or more components, and at least two of the three or more than three components comprise a structure according to formula (I):

$(R^1Y^1)_p[(R^2Y^2)_mR^2Y^3]_nZ^2Y^4R^3$ (I)

In formula (I), subscript m is zero or one; subscript n is zero to eight; and subscript p is one to eight. $R^3$ and each $R^1$ independently represent a monovalent aliphatic or cycloaliphatic hydrocarbon group having 1 to 20 carbon atoms or an aromatic group or a multicyclic aromatic nucleus. Each $R^2$, $Z^1$, and $Z^2$ independently represents multivalent aliphatic or cycloaliphatic hydrocarbon groups having 1 to 20 carbon atoms or an aromatic group. Each $Y^1$, $Y^2$, $Y^3$, and $Y^4$ independently represents a triple bond, a double bond, or a single bond link, provided that at least one of $R^1$, $Z^1$, $R^2$, $Z^2$ and $R^3$ is a multicyclic aromatic nucleus.

DETAILED DESCRIPTION

Figure 1:
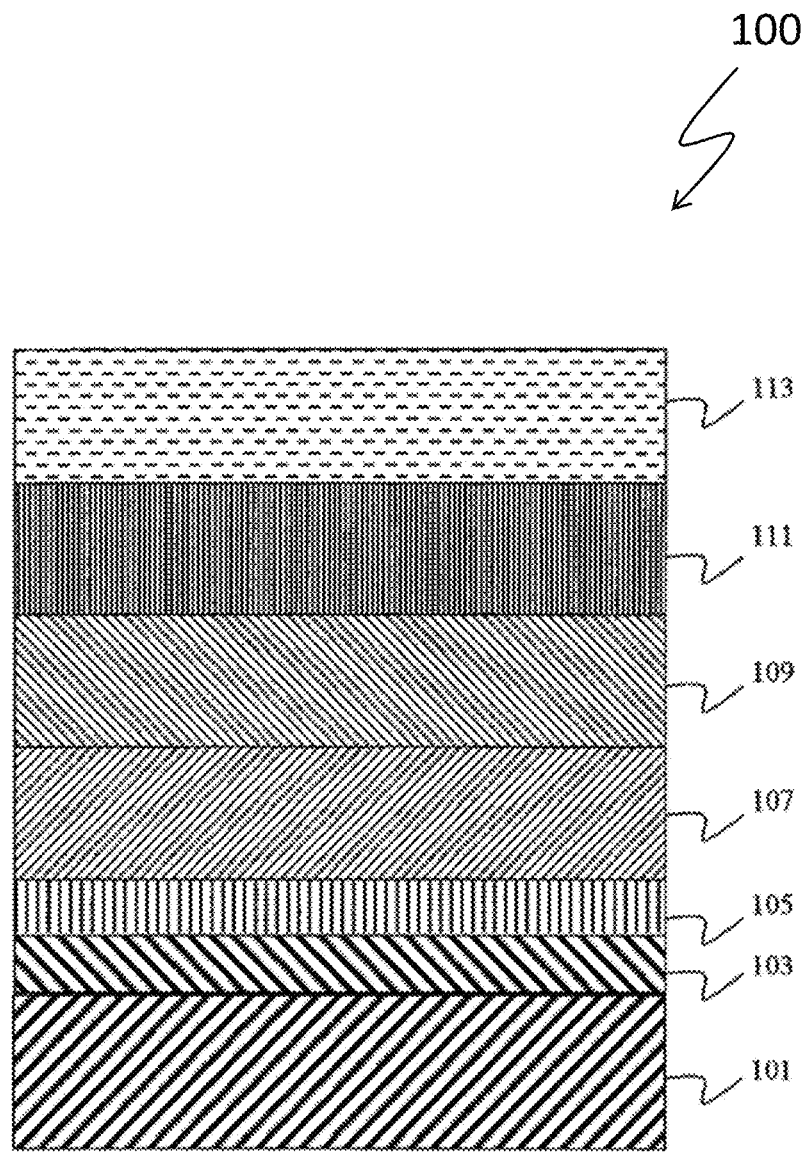
FIG. 1 shows a cross-section of a typical OLED device in which this invention may be used.

Throughout this document, the following terms will have the following meanings.

The term "amorphous" means that the mixture is non-crystalline. That is, the mixture has no molecular lattice structure.

The term "non-equilibrium molecular glass" means a glass forming material that is crystallizable under certain conditions, for example above their glass transition temperature, or in contact with certain solvents.

The term "non-crystallizable molecular glass" means a glass composition that will never crystallize under any circumstances and is amorphous.

The term "asymmetric glass mixture" means a glass mixture where all the components are asymmetric, i.e. have all distinct substituents.

The term "isomeric glass mixture" means a glass mixture where all the components have the same molecular weight.

The term "high-entropy" when referring to a glass mixture means that the glass mixture has high level of disorganization. The higher the number of components, the higher the entropy.

A hole transporting material may conduct positive charge.

An electron-transporting material may conduct negative charge (electrons).

An ambipolar material may conduct both positive and negative charges (electrons).

The term "hole-trapping emitter" refers to an emitter that can transport positive charges.

The term "electron-trapping emitter" refers to an emitter that can transport negative charges (electrons).

The term "isomeric glass mixture" refers to a glass mixture where all the components have the same molecular weight.

The term "multicyclic aromatic nucleus" refers to a nucleus comprising at least two cyclic groups one of which is aromatic, including aromatic heterocyclic ring groups. The cyclic group may be substituted with substituents such as aliphatic hydrocarbons, including cycloaliphatic hydrocarbons, other aromatic ring groups such as aryl, and heterocyclic ring groups such as substituted or fused thiazole, oxazole, imide, pyrazole, triazole, oxadiazole, pyridine, pyrimidine, pyrazine, triazine, tetrazine and quinoline groups. The substituents are fused or non-fused and mono or polycyclic. Examples of multicyclic aromatic nuclei include 9,9-bis(4-hydroxy-3,5-dichlorophenyl)fluorene, 4,4'-hexahydro-4,7-methanoindan-5-ylidenebis(2,6-dichlorophenol); 9,9-bis(4-hydroxy-3,5-dibromophenyl(fluorene, 4,4'-hexahydro-4,7-methanoindan-5-ylidenebis(2,6-dibromophenol); 3',3",5',5"-tetrabromophenolphthalein, 9,9-bis(4-aminophenyl)fluorene, phenylindandiols; 1,1'-spirobiindandiols, 1,1'-spirobiindandiamines, 2,2'-spirobichromans; 7,7-dimethyl-7H-dibenzo[c,h]xanthenediol; xanthylium salt diols; 9,9-dimethylxanthene-3,6-bis(oxyacetic acids); 4,4'(3-phenyl-1-indanylidene)diphenol and other bisphenols; 3',3"-dibromo-5',5"-dinitro-2',2"-oxaphenolphthalein; 9-phenyl-3-oxo-2,6,7-trihydroxyxanthene; and the like.

"Aliphatic hydrocarbon group" refers to monovalent or divalent, alkanes, alkenes, alkadienes and alkynes having from 1 to 20 carbon atoms. The groups are straight or branched chain and include carbohydrate, carboxylic acid, alcohol, ether aldehyde and ketone functions.

"Cycloaliphatic" refers to cyclic aliphatic hydrocarbon groups. The groups may be substituted with halogen, alkoxy, amide, nitro, esters and aromatic groups.

Exemplary aliphatic groups include methyl, ethyl, propyl, isopropyl, butyl, hexyl, 2-ethylhexyl, methoxyethyl, ethoxycarbonylpropyl, 3-oxobutyl, 3-thiapentyl, furfuryl, 2-thiazolylmethyl, cyclohexylmethyl, benzyl, phenethyl, phenoxyethyl, vinyl (—CH═CH—), 2-methylvinyl, allyl, allylidene, butadienyl, butenylidene, propargyl, and the like.

"Aromatic" and "aromatic heterocyclic" group refers to organic groups which undergo the same type of substitution reaction as benzene. In benzene, substitution reactions are preferred over addition reactions. Such groups preferably have from 6 to about 40 nuclear atoms and are mono- and polycyclic.

Exemplary aromatic groups include quinolinyl, pyrimidinyl, pyridyl, phenyl, tolyl, xylyl, naphthyl, anthryl, triptycenyl, p-chlorophenyl, p-nitrophenyl, p-bromophenyl, 2,4-dichlorophenyl, 2-chlorophenyl, 3,5-dinitrophenyl, p-(tetrabromophthalimido)phenyl, p-(tetrachlorophthalimido)phenyl, p-tetraphenylphthalimido)phenyl, p-naphthalimidophenyl, p-(4-nitrophthalimido)phenyl, p-phthalimidophenyl, 1-hydroxy-2-naphthyl, 3,5-dibromo-4-(4-bromobenzoyloxyl)phenyl, 3,5-dibromo-4-(3,5-dinitrobenzoyloxyl)phenyl, 3,5-dibromo-4-(1-naphthoyloxyl)phenyl, thiazolyl, oxazolyl, imidazolyl, pyrazolyl, triazolyl, oxadiazolyl, pyrazinyl, etc and their corresponding multivalent and fused ring configurations.

In some embodiments, the high-entropy non-crystallizable material includes three or more components, and at least two of the three or more components are structures according to formula (1):

(R$^1$Y$^1$)$_p$[(R$^2$Y$^2$)$_m$R$^2$Y$^3$]$_n$Z$^2$Y$^4$R$^3$  (I)

In formula (I), subscript m is zero or one; subscript n is zero to eight; and subscript p is one to eight. R$^3$ and each R$^1$ independently represents a monovalent aliphatic or cycloaliphatic hydrocarbon group having 1 to 20 carbon atoms or an aromatic group or a multicyclic aromatic nucleus. Each R$^2$, Z$^1$, and Z$^2$ independently represents multivalent aliphatic or cycloaliphatic hydrocarbon groups having 1 to 20 carbon atoms or an aromatic group. Each Y$^1$, Y$^2$, Y$^3$, and Y$^4$ independently represents a triple bond, a double bond, or a single bond link, provided that at least one of R$^1$, Z$^1$, R$^2$, Z$^2$ and R$^3$ is a multicyclic aromatic nucleus.

An OLED device of this disclosure includes a multilayer electroluminescent device comprising a cathode, an anode, an optional charge-injecting layers, charge-transporting layers, and a light-emitting layer (LEL) comprising a neat host or a mixed-host, wherein the neat host or at least one member of the mixed host is a high-entropy non-crystallizable molecular glass mixture comprising three or more than three components. The host material can be hole-transporting, electron-transporting, or ambipolar, that is capable on transporting both positive and negative charges (electrons).

In some embodiments, the host material includes a mixed-host, which is a mixture of a hole-transporting high-entropy non-crystallizable material and an electron-transporting high-entropy non-crystallizable material. However, in some embodiments of the OLED, as demonstrated in U.S. Patent Publication No. 2015/0053894, the high-entropy non-crystallizable materials can be mixed with highly crystalline materials at high concentration to yield a new mixture that is non-crystallizable. Thus, the mixed-host may be either a mixture a high-entropy hole-transporting material, as described herein, and an electron-transporting crystallizable material, or a high-entropy electron-transporting material and a hole-transporting crystallizable material.

To achieve a highly efficient phosphorescent OLED, triplet emitter-dopants are usually embedded in a suitable host to reduce concentration quenching. A good host material should fulfill the following requirements: (1) the triplet energy must be higher compared to the emitter, which prevents energy back transfer to the host material, (2) suitable energy levels aligned with the neighboring layers for efficient charge carrier injection to obtain a low driving voltage; (3) decent charge carrier transporting abilities to increase the chance for hole and electron recombination within the emitting layer; and (4) the HOMO (highest occupied molecular orbital) of the host materials should be deeper than that of the emitters, while the LUMO (lowest unoccupied molecular orbital) of the host materials should be shallower than that of the emitters.

Blue phosphorescent and thermally assisting delayed fluorescent emitters have higher triplet energy than green, yellow and red emitters, in that order. Thus blue emitters require higher triplet host (2.8 eV to 3.0 eV) than green, yellow and red emitters.

In mixed-host systems, the triplet energy of the individual host should meet the requirements described above such that the triplet energy of the mixed host is greater than the emitter. The triplet energy of the host materials is estimated from the phosphorescence emission of the host at or below 77 K.

In some embodiments, the light-emitting layer of the device includes host material and an emitter-dopant. The emitter-dopant may be present in an amount of up to 20 wt. % of the host, from 0.1 to 18.0 wt. % of the host, from 0.5 to 10 wt. % of the host, or from 0.1 to 5 wt. %. The emitter-dopant may include a fluorescent emitter, a phosphorescent emitter, a thermally delayed fluorescent emitter, or a combination thereof.

The emitter dopant can be a fluorescent emitter, a phosphorescent emitter, or a thermally delayed fluorescent emitter. The composition of the host is adjusted for the type of emitter. For example, high-triplet energy host is required for phosphorescent and thermally activated delayed fluorescence (TADF) emitters.

Examples of fluorescent emitters include coumarin dyes such as 2,3,5,6-1H,4H-tetrahydro-8-trichloromethylquinolizino(9,9a,1gh) coumarin, cyanine-based dyes such as 4-dicyanomethylene-2-methyl-6-(p-dimethylaminostyrrylene)-4H-pyran, pyridine-based dyes such as 1-ethyl-2-(4-(p-dimethylaminophenyl)-1,3-butadienyl)-pyridium perchlorate, xanthene-based dyes such as rhodamine B, and oxazine-based dyes. The fluorescent material can also include inorganic phosphors.

Examples of phosphorescent emitters include Ir(ppy); (fac tris(2-phenylpyridine) iridium) (green) or FIrpic (iridium(III)bis[4,6-di-(fluorophenyl)-pyridinato-N,C2']picolinate) (blue), a red phosphorescent dopant RD61 available from UDC. Other blue phosphorescence emitter include iridium (III) bis(4',6'-difluorophenylpyridinato) tetrakis(1-pyrazolyl)borate (FIr6) (HOMO level=6.1 eV, LUMO level=3.1 eV, $T_1$=2.71 eV), iridium (III) bis[4,6-(di-fluorophenyl)-pyridinato-N,C2']picolinate (FIrpic), iridium (III) tris[N-(4'-cyanophenyl)-N'-methylimidazole-2-ylidene-C2, C2'](Ir(cn-pmic)$_3$), tris((3,5-difluoro-4-cyanophenyl)pyridine)iridium (FCNIr), and Ir(cnbic)$_3$, and complexes of heavy atom metals such as platinum (Pt), rhenium (Re), ruthenium (Ru), copper (Cu), and osmium (Os). (2,4-Pentanedionato)bis[2-(2-quinolinyl)phenyl]iridium(III), Bis[5-methyl-2-(2-pyridinyl-N)phenyl-C](2,4-pentanedionato-$O^2$, $O^4$)iridium(III), Bis[2-(2-benzothiazolyl-N3)phenolato-O]zinc, Bis[2-(4,6-difluorophenyl)pyridinato-C2,N](picolinato)iridium(III), Bis[2-(1-isoquinolinyl-N)phenyl-C](2,4-pentanedionato-$O^2$,$O^4$)iridium(III), Tris[2-(benzo[b]thiophen-2-yl)pyridinato-$C^3$,N]iridium(III), Bis[2-(1-isoquinolinyl-N)phenyl-C](2,4-pentanedionato-$O^2$,$O^4$) iridium(III), Bis[2-(2-pyridinyl-N)phenyl-C](2,4-pentanedionato-$O^2$,$O^4$)iridium(III), Dichlorotris(1,10-phenanthroline)ruthenium(II) hydrate, Bis(2-benzo[b]thiophen-2-ylpyridine)(acetylacetonate)iridium(III), Lithium tetra(2-methyl-8-hydroxyquinolinato)boron, bis(2,2'-bipyridyl)dichlororuthenium(II) hexahydrate, and other emitting materials capable of phosphorescence.

Examples of thermally activated delayed fluorescence (TAM') emitter-dopants include but are not limited to: 2,5-bis(carbazol-9-yl)-1,4-dicyanobenzene (4CzTPN described in *Mater. Horiz.*, 2014, 1, 264-269; the Organic Luminescent Compound with Delayed Fluorescence of US application 20140145149 to Lin; Chun et al; the delayed fluorescence material of US application 20140138669 to Nakagawa, and Tetsuya (Fukuoka, T P) Adachi, Chihaya (Fukuoka, J P) the benzothiophene or benzofuran fused to a carbazoles delayed fluorescent material of US application 20140145151 to Xia;

The high-entropy non-crystallizable molecular glass mixture of this invention can increase the operational lifetime of the OLED device when present in an amount of up to 99 wt. % of the emitter-dopant. The increase in operational lifetime is relative to the situation where the non-crystallizable molecular glass mixture is absent. Operational lifetime is commonly defined as the time to reach defined ratio (90%, 70%, or 50%) of the initial luminance at a given temperature and current density.

High-entropy non-crystallizable molecular glass mixtures are defined as a mixture of compatible organic monomeric molecules with an infinitely low crystallization rate under the most favorable conditions. These mixtures can be formed in a one-part reaction of a multifunctional nucleus with a mixture of substituents. The "non-crystallizability" and the "high-entropy" of the mixture is controlled by the structural dissymmetry of the nucleus, the substituents, or a combination thereof, and the number of components making up the mixture. In cases, where the nucleus is highly symmetric and rigid, the components with similar (non-distinct) substituents might crystallize out under the right conditions. Thus it is advantageous when possible to avoid those components, by designing an asymmetric glass mixture, wherein all the components of the mixture have distinct substituents. Without being bound to theory, we predict that the asymmetric mixtures are more likely to be fully non-crystallizable.

Increasing the number of components of the glass mixture, by adding more substituents, is another way to enhance the non-crystallizability and the entropy of the glass mixtures having highly symmetric and rigid nuclei.

The high-entropy non-crystallizable glass mixtures of this invention are described by Molaire in United States Patent Application 2015/0275076, Non-crystallizable Pi-conjugated Molecular Glass Mixtures, Charge Transporting Molecular Glass Mixtures, Luminescent Molecular Glass Mixtures, or Combinations Thereof for Organic Light Emitting Diodes and other Organic Electronics and Photonics Applications; United States Patent Application 20150053894 Charge-transporting Molecular Glass Mixtures, Luminescent Molecular Glass Mixtures, or Combinations Thereof for Organic Light Emitting Diodes and other Organic Electronics and Photonics Applications; United States Patent Application 20150179714 Crosslinkable/Polymerizable and Combinations Thereof Charge-transporting Molecular Glass Mixtures, Luminescent Molecular Glass Mixtures, or Combinations Thereof for Organic Light Emitting Diodes and other Organic Electronics and Photonics Applications and Method of Making Same; WIPO Patent Publication No. WO/2015/148327 PI-CONJUGATED SEMICONDUCTIVE ORGANIC GLASS MIXTURES FOR OLED AND OEDS; WIPO Patent Publication No. WO/2015/117100 NONCRYSTALLIZABLE SENSITIZED LAYERS FOR OLED AND OEDS; WIPO Patent Publication No. WO/2015/031242 MOLECULAR GLASS MIXTURES FOR ORGANIC ELECTRONICS APPLICATIONS; WIPO Patent Publication No. WO/2015/095859 MOLECULAR GLASS MIXTURES FOR ORGANIC ELECTRONICS APPLICATIONS. International PCT Application No. PCT/US2016/052884, "Isomeric and Asymmetric Molecular Glass Mixtures for OLED and Other Organic Electronics and Photonics Applications."

In some embodiments, the light-emitting layer includes the high-entropy non-crystallizable glass mixture hosts and dopant-emitter. The high-entropy non-crystallizable glass mixture hosts may include hole-transporting, electron-transporting, or ambipolar. The high-entropy non-crystallizable glass mixture host and the emitter dopant should be chosen so that a hole-transporting host is combined with an electron-trapping emitter-dopant or an electron-transporting host with a hole-trapping emitter-dopant. Ambipolar host can be used with either type of emitter-dopant.

Specific examples of high-entropy non-crystallizable hosts include those disclosed in International PCT Application No. PCT/US2016/052884, which is incorporated by reference herein in its entirety. Specific examples of high-entropy non-crystallizable hosts include the isomeric hole-transporting materials.

Hole-Transporting Isomeric Asymmetric Glass Mixture 7 contains the following compounds:

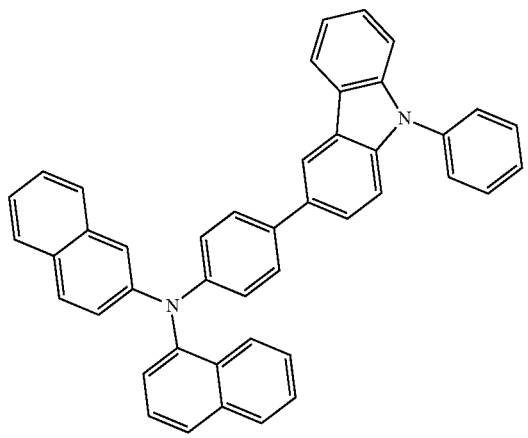

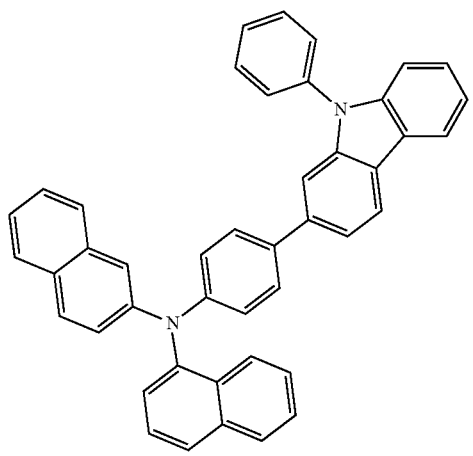
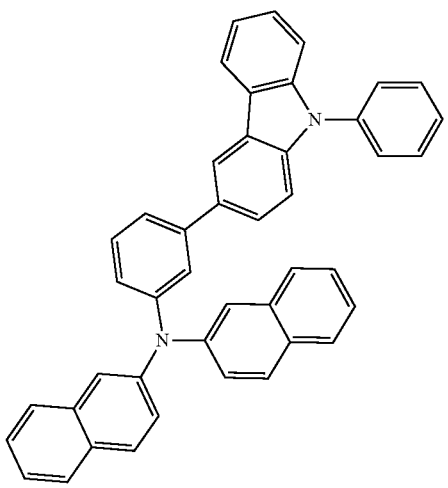
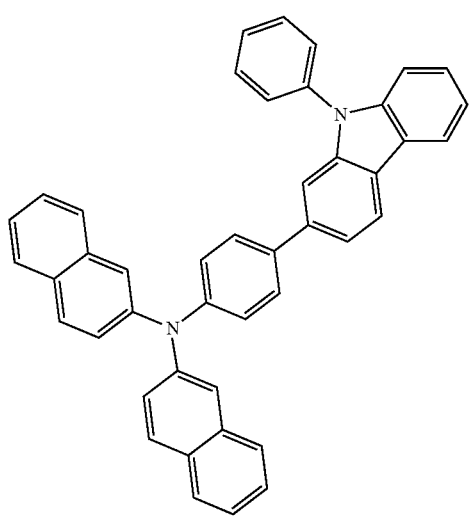
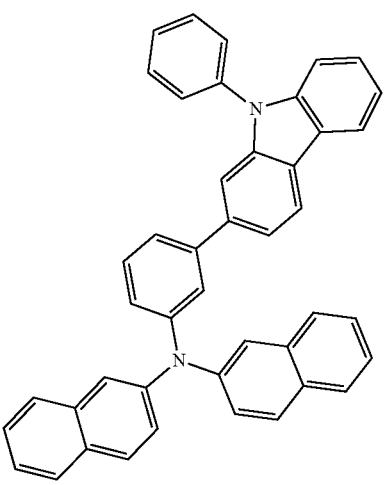
Ambipolar Isomeric Asymmetric Glass Mixture 8 contains the following compounds:
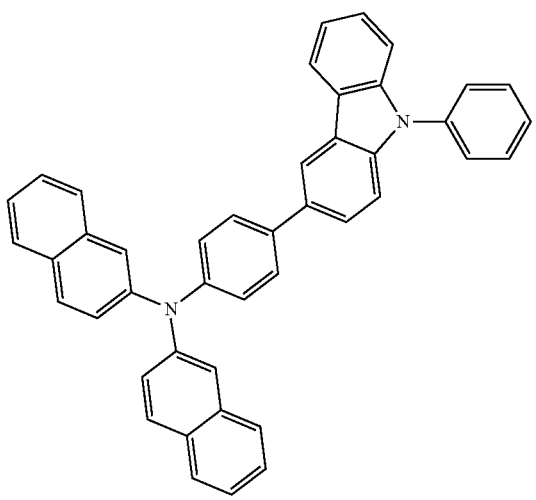
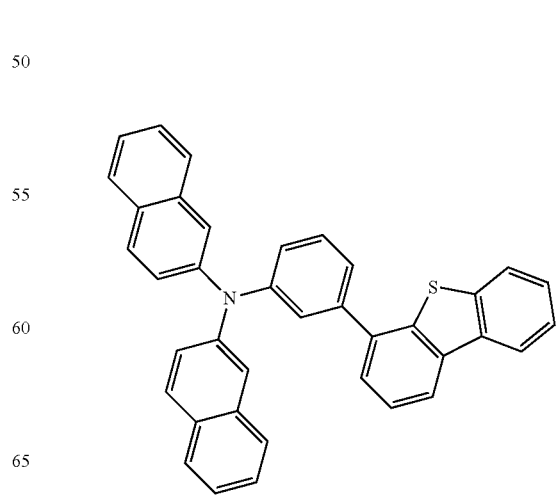

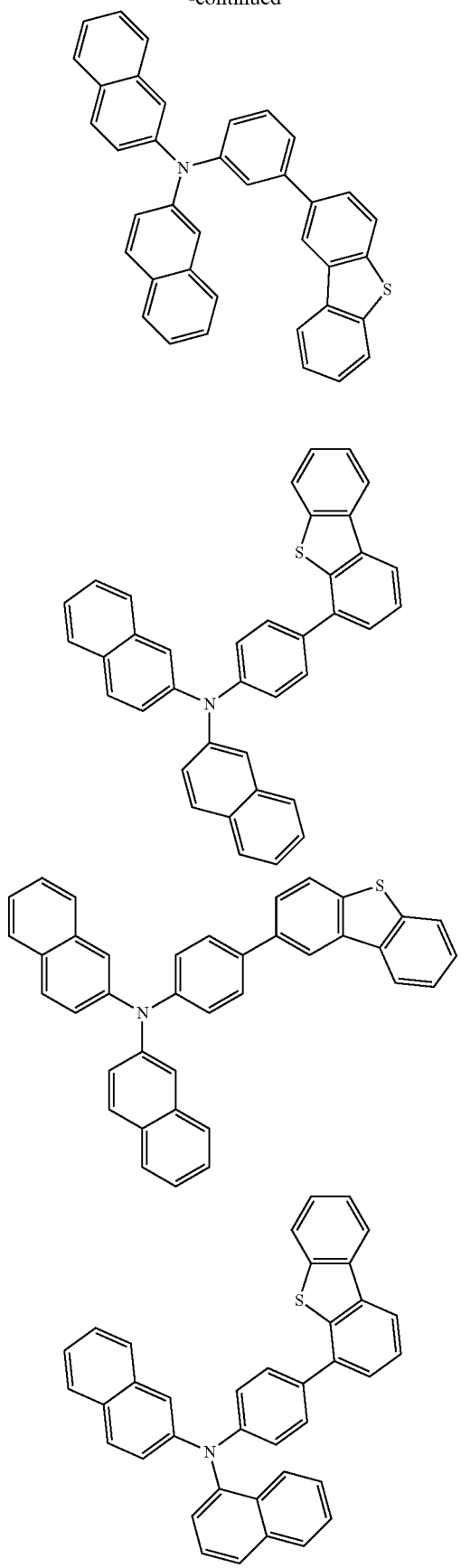
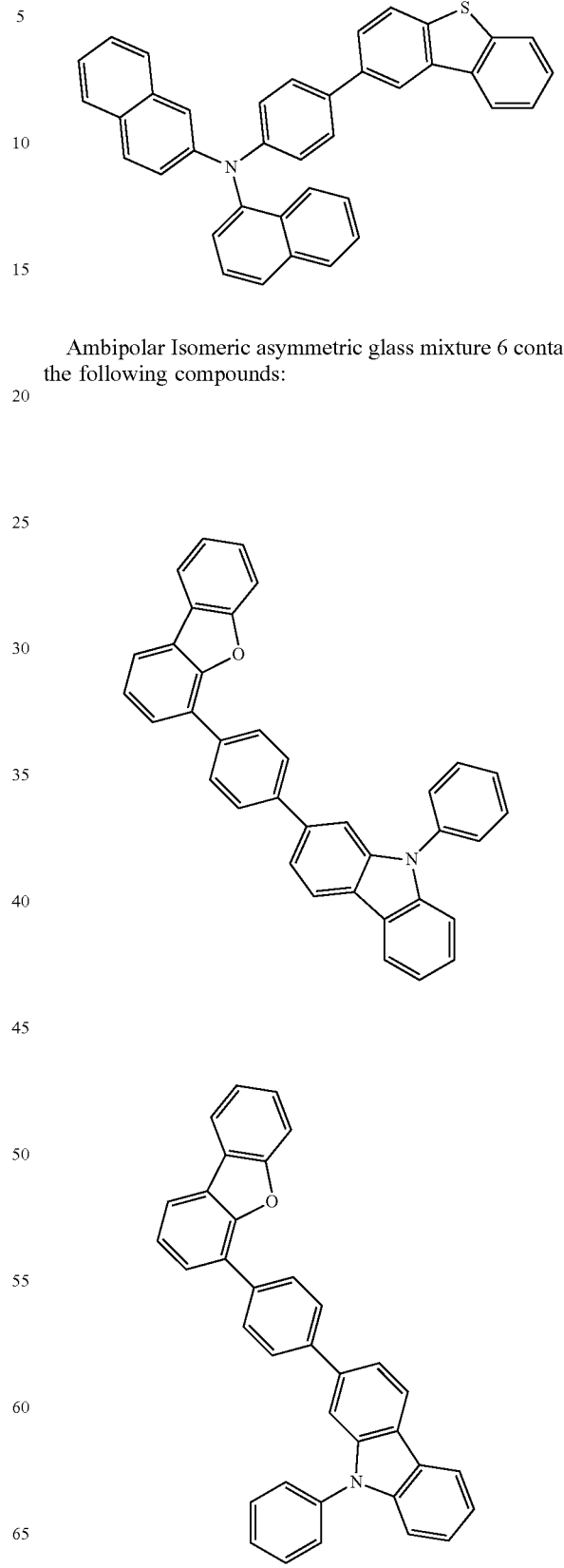
Ambipolar Isomeric asymmetric glass mixture 6 contains the following compounds:

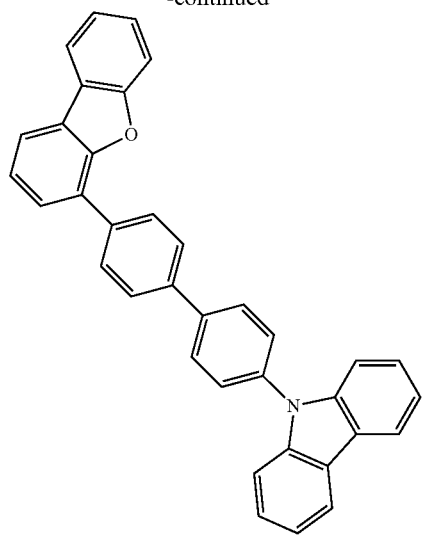
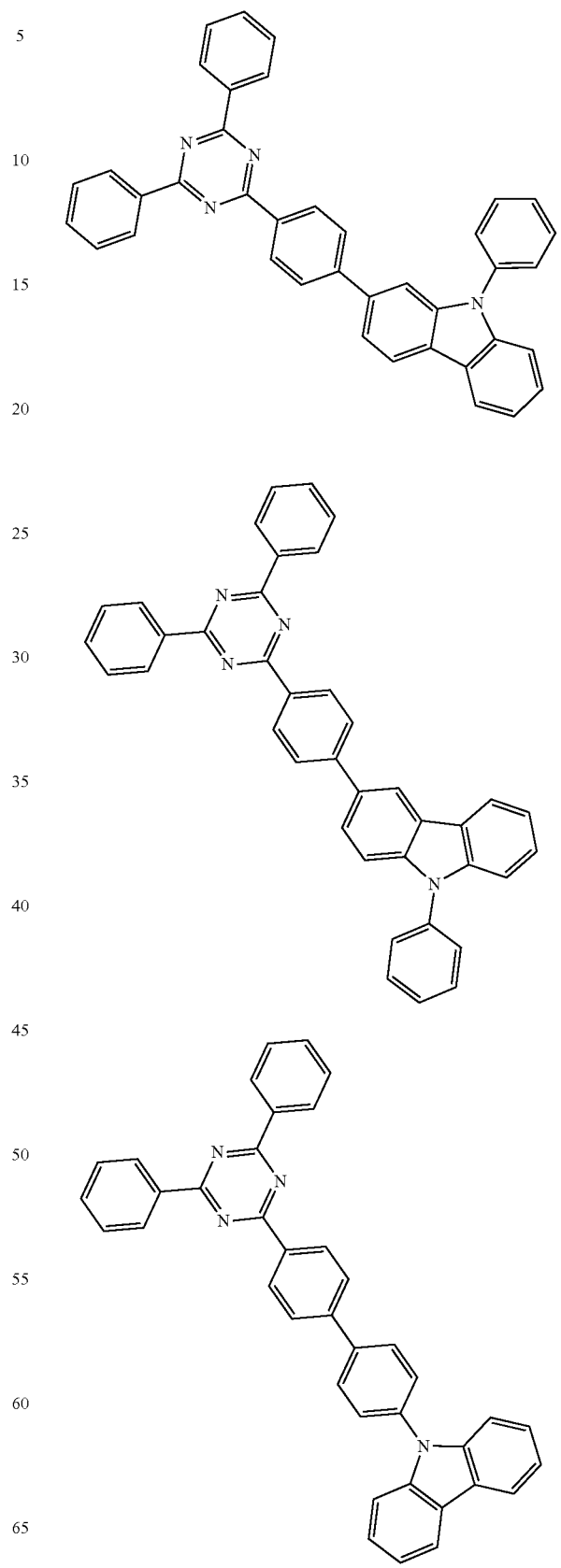
Ambipolar Isomeric asymmetric glass mixture 4 contains the following compounds:

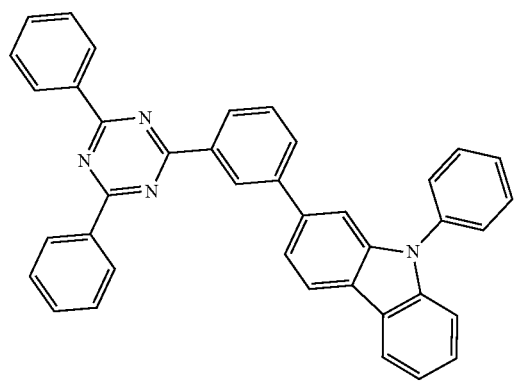
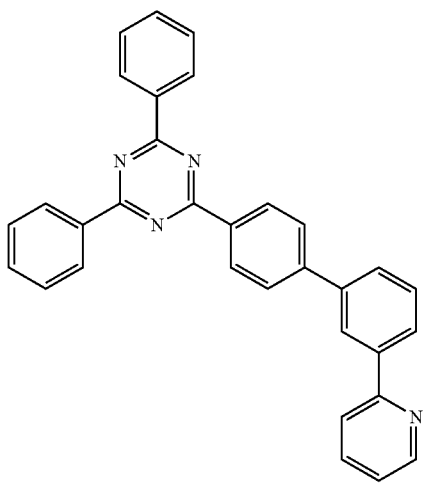
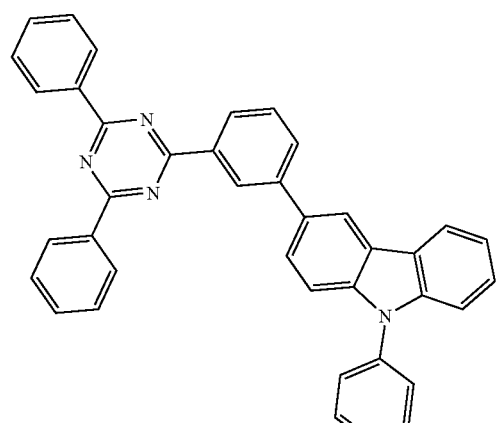
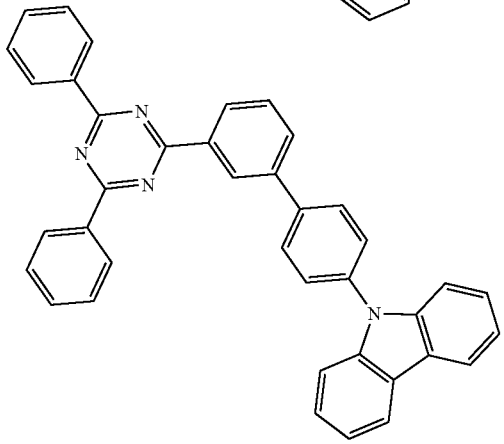
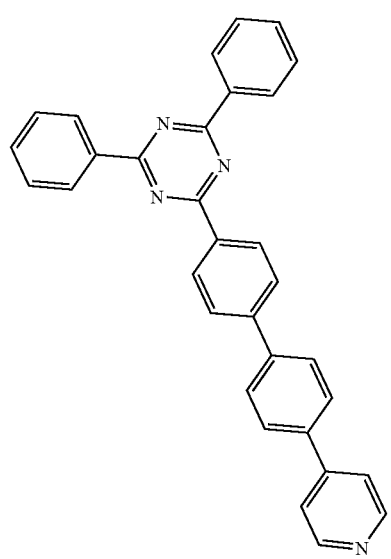
Electron-Transporting Isomeric Asymmetric Glass Mixture 9 contains the following compounds:
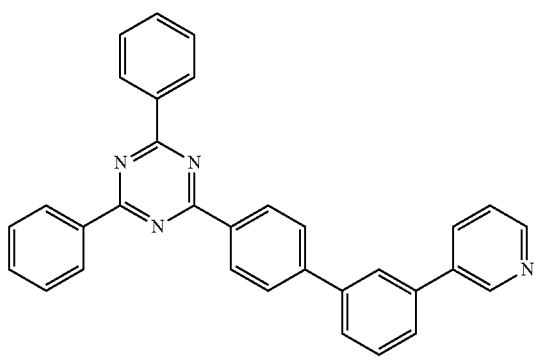
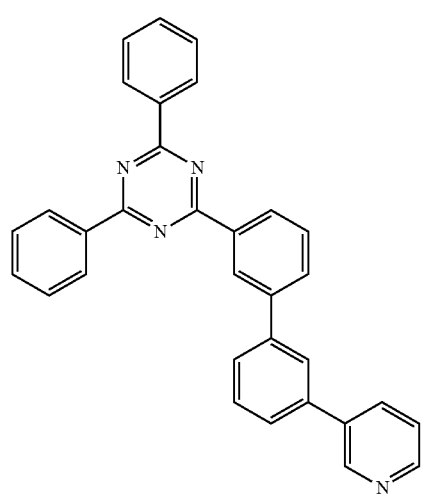

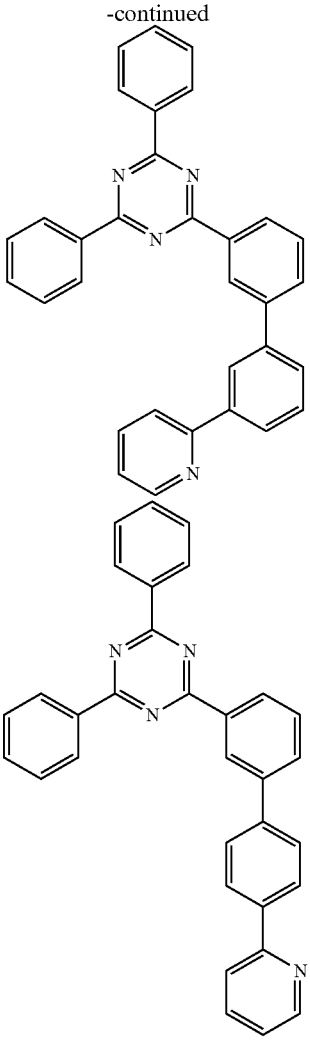

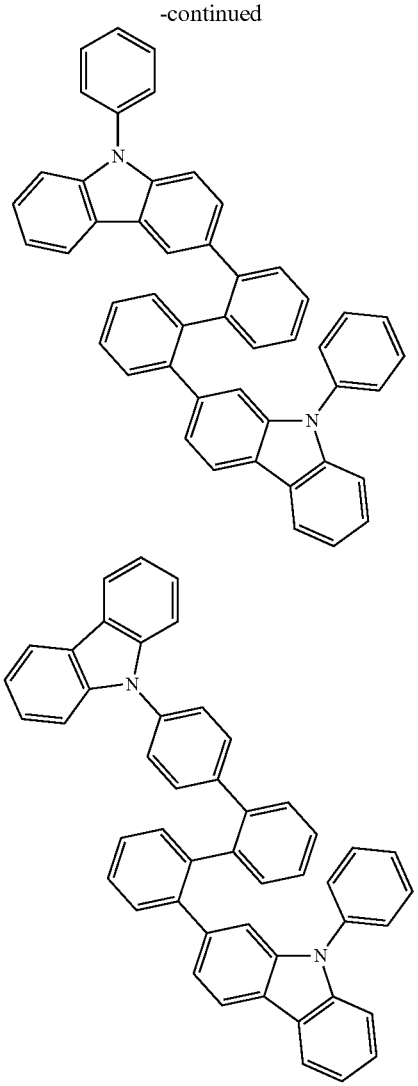

The non-crystallizable hole-transporting materials of United States Patent Application 2015/0275076, Non-crystallizable Pi-conjugated Molecular Glass Mixtures, Charge Transporting Molecular Glass Mixtures, Luminescent Molecular Glass Mixtures, or Combinations Thereof for Organic Light Emitting Diodes and other Organic Electronics and Photonics Applications.

Hole-Transporting Isomeric Glass Mixture 22 contains the following compounds:

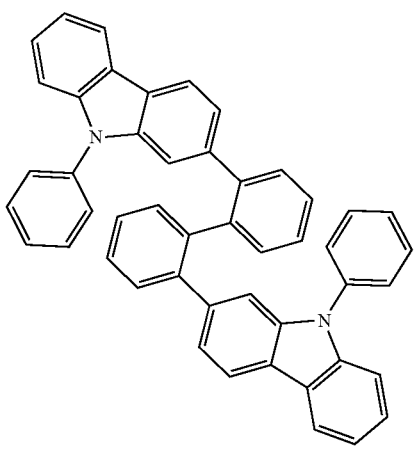

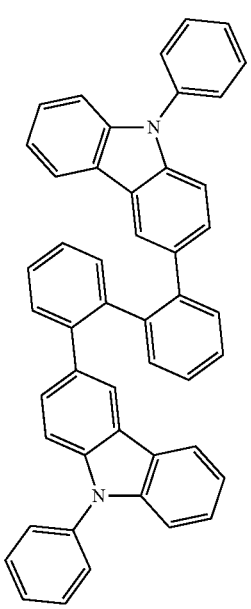

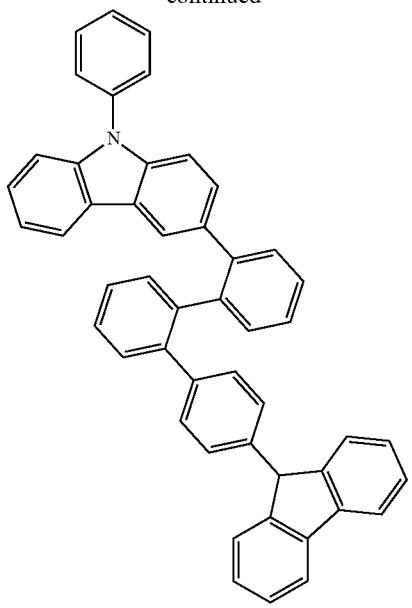
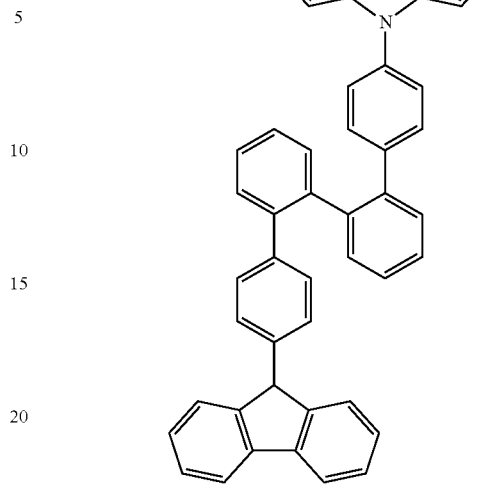
Ambipolar Isomeric Glass Mixture 32 contains the following compounds:
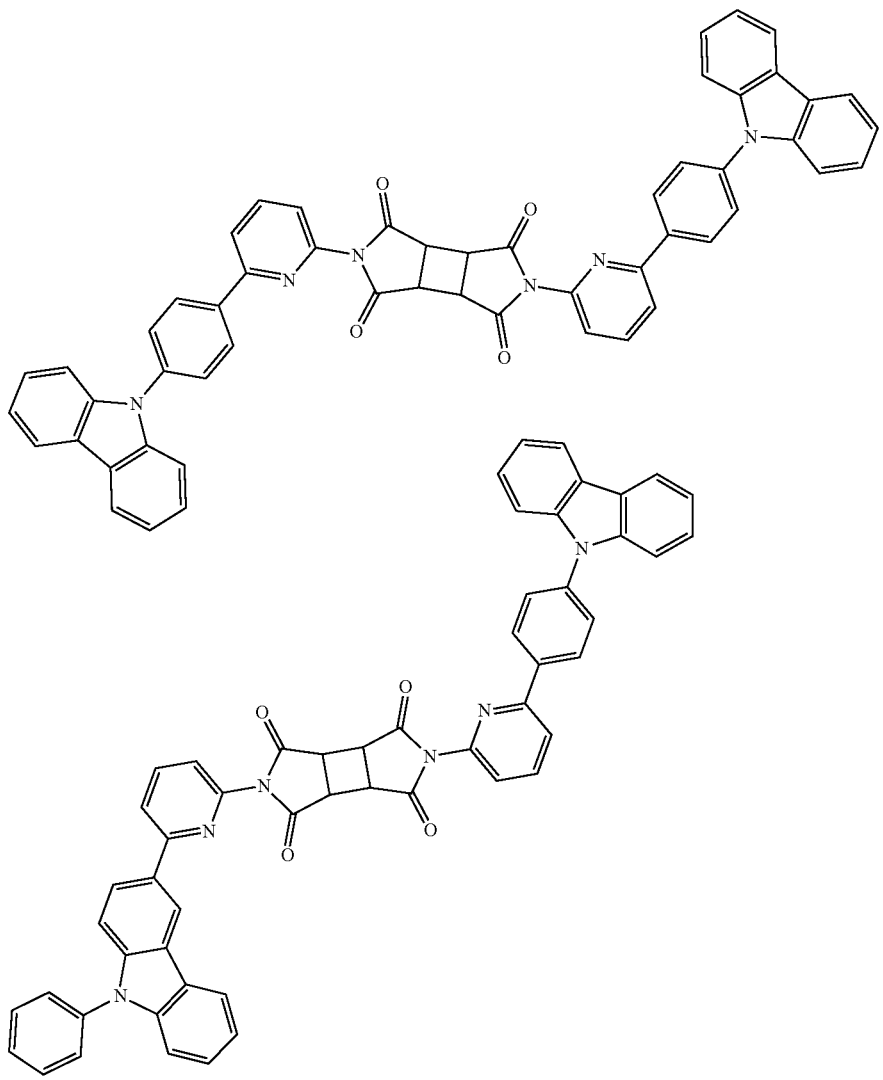

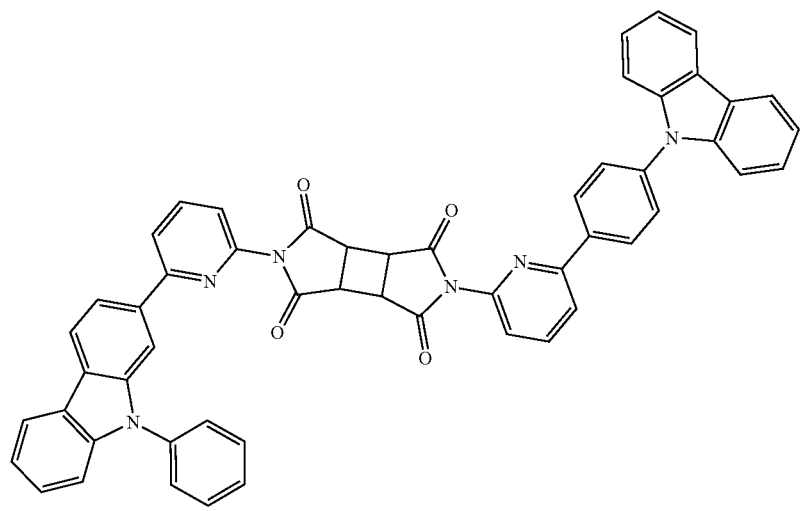
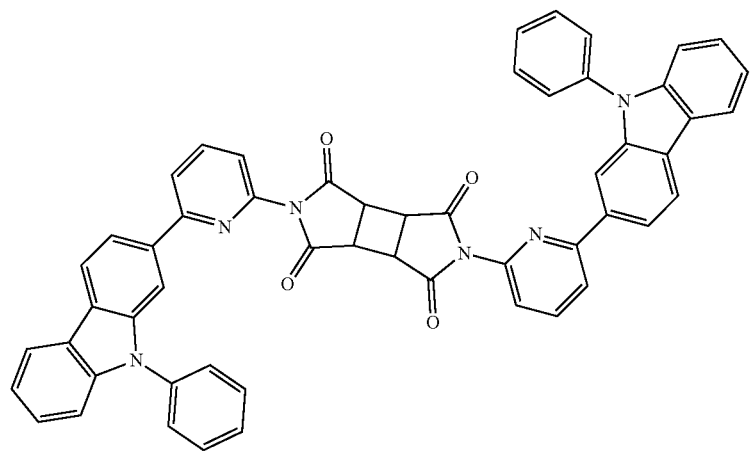
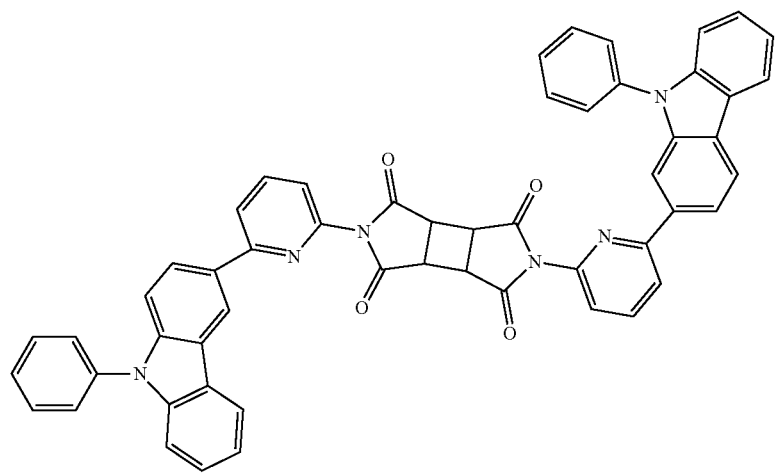

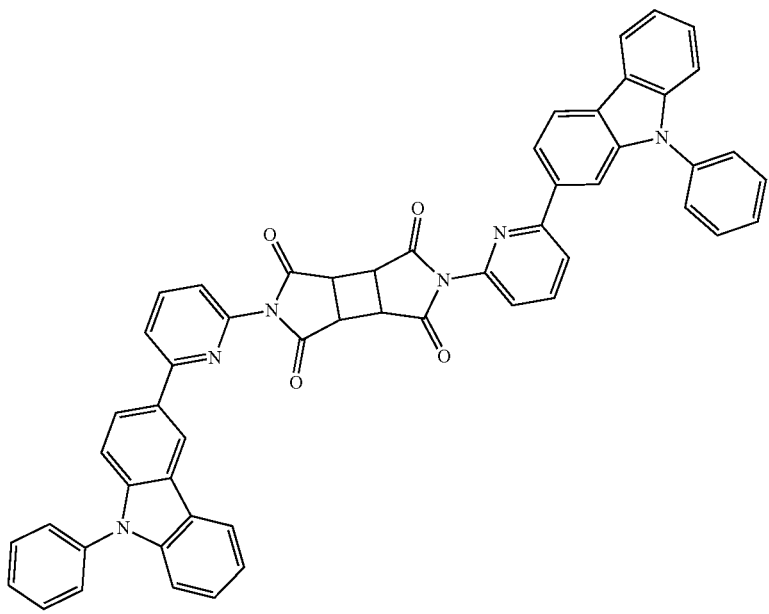
Other examples of non-crystallizable mixtures include Glass Mixtures 50, 60, 65, 70, 75, and 80.
Hole-Transporting Isomeric Glass Mixture 50 contains the following compounds:
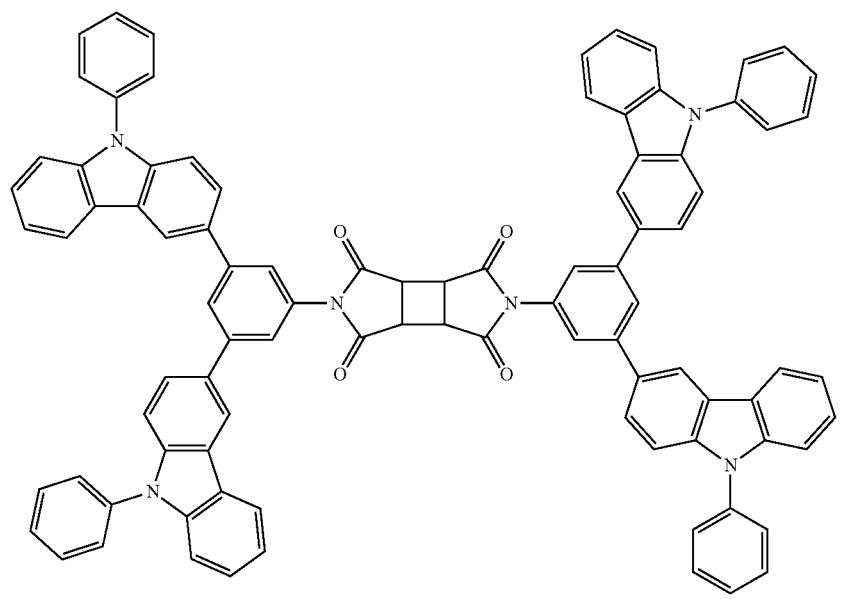

-continued
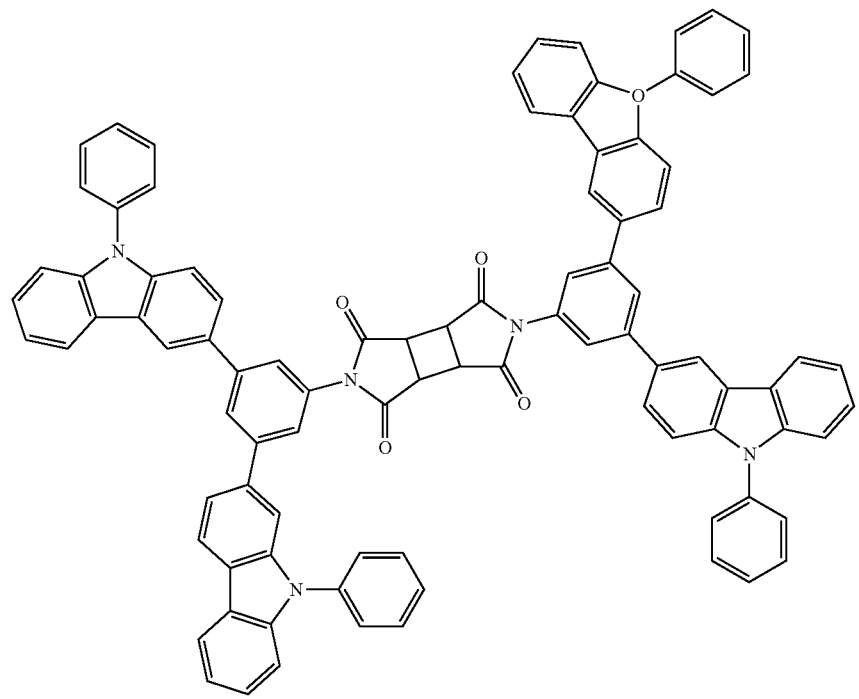
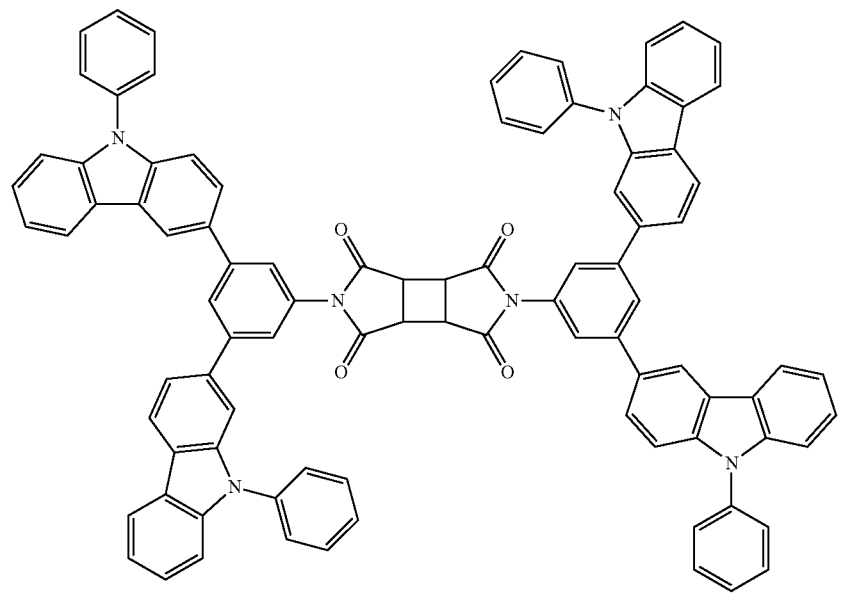

-continued
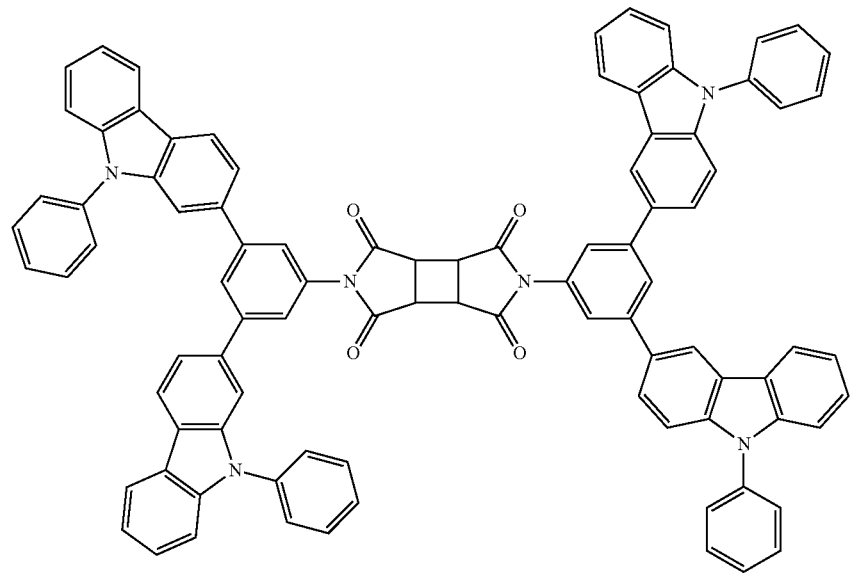
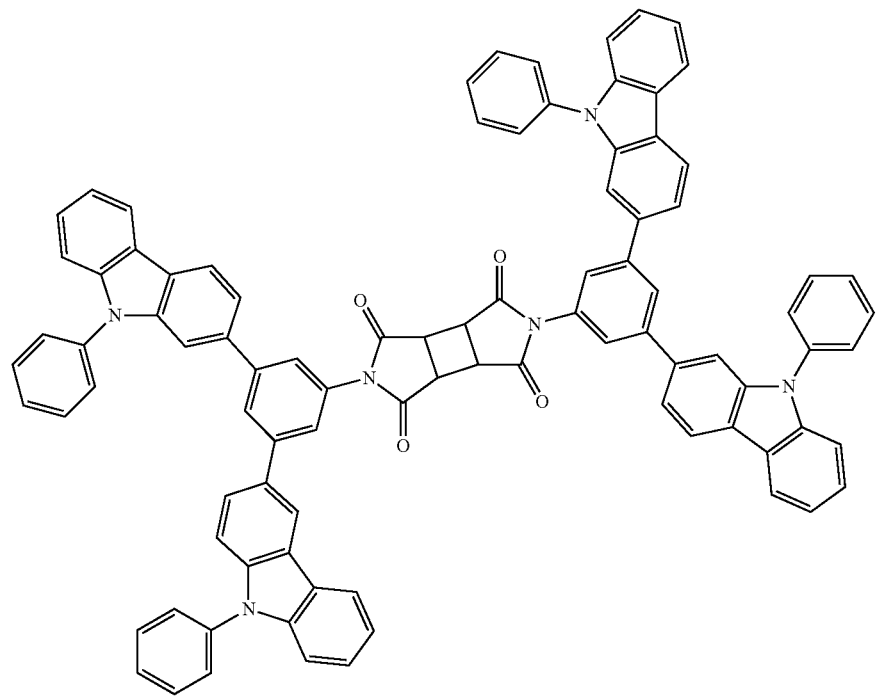

-continued
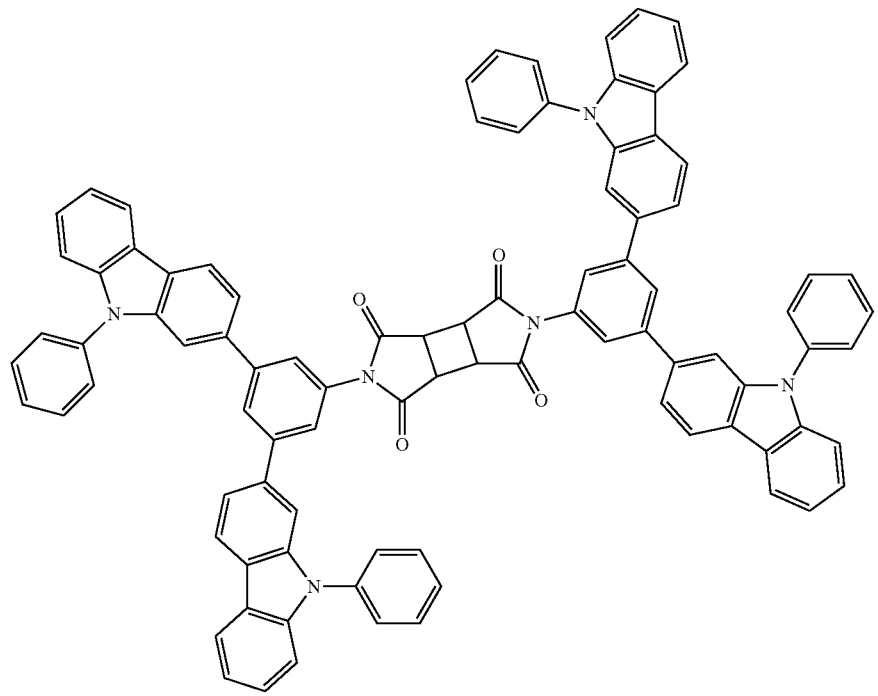
Ambipolar Glass Mixture 60 contains the following compounds:
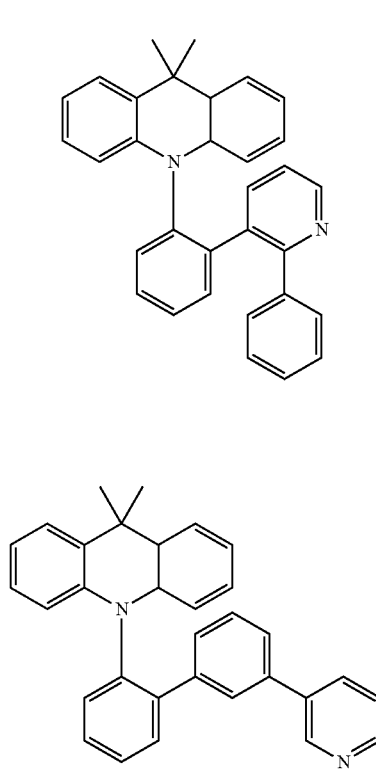
-continued
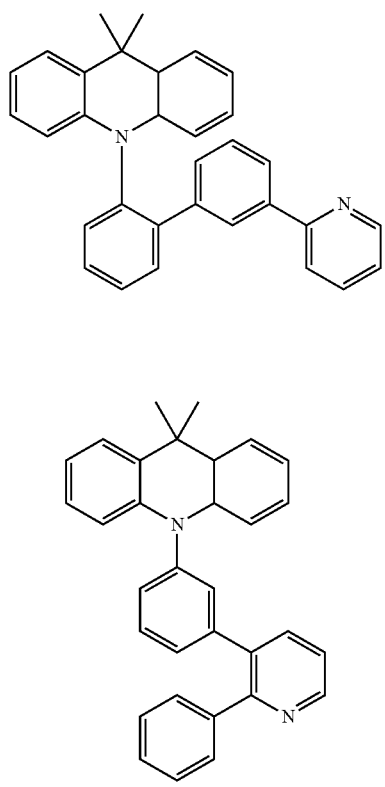

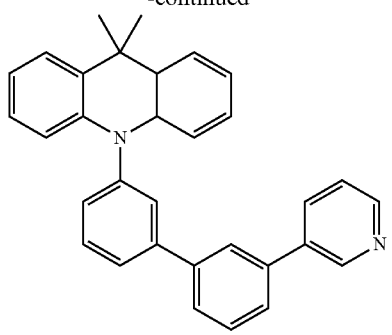
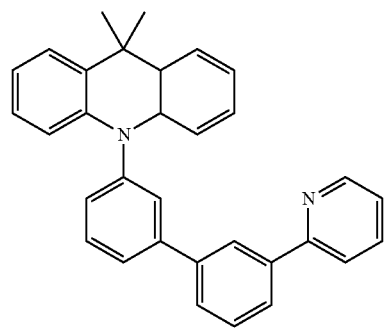 [SMILES: CC1(C)c2ccccc2N(c2cccc(-c3cccc(-c4ccccn4)c3)c2)C2C=CC=CC21]
Ambipolar Glass Mixture 65 contains the following compounds:
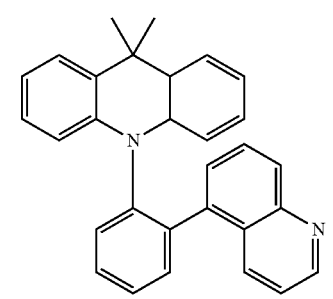
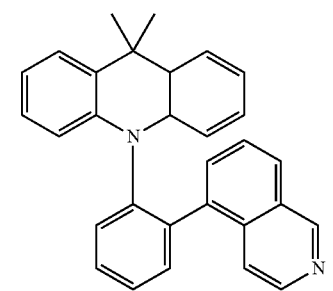
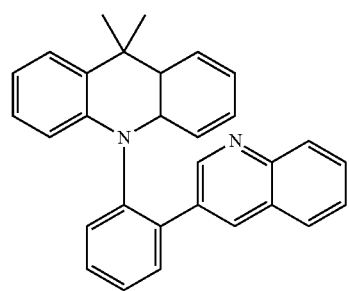
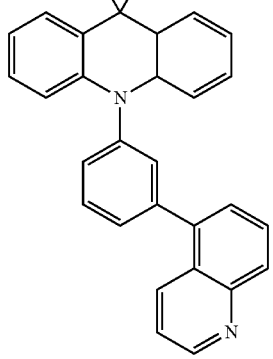
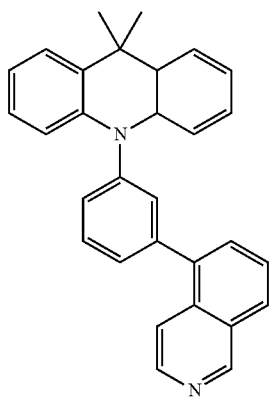
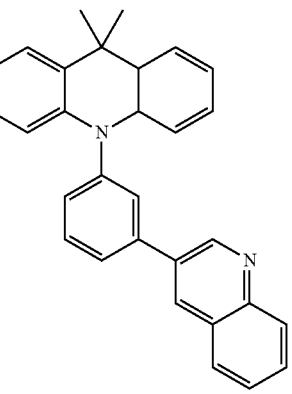
Hole-Transporting Glass Mixture 70 contains the following compounds:
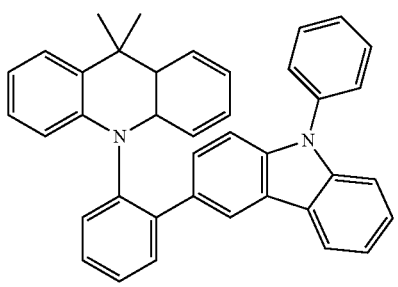

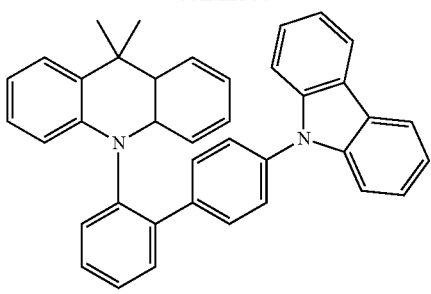
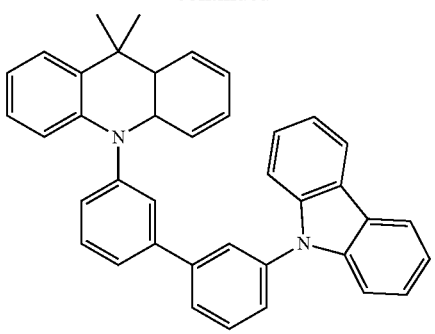
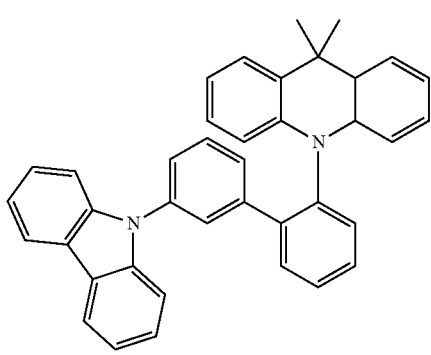
Ambipolar Glass Mixture 75 contains the following compounds:
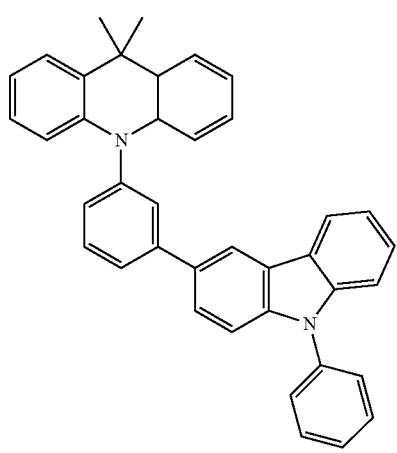
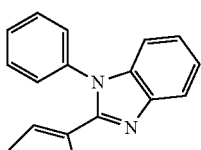
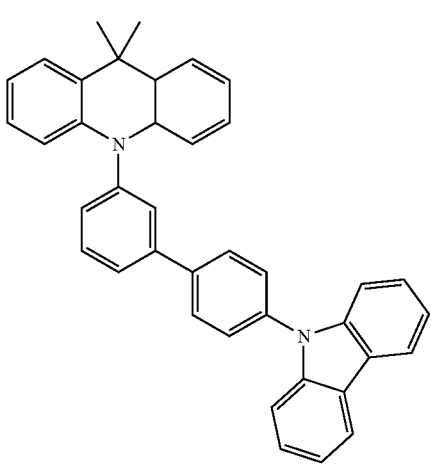
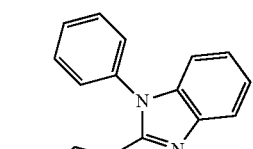
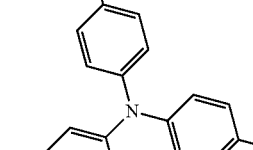

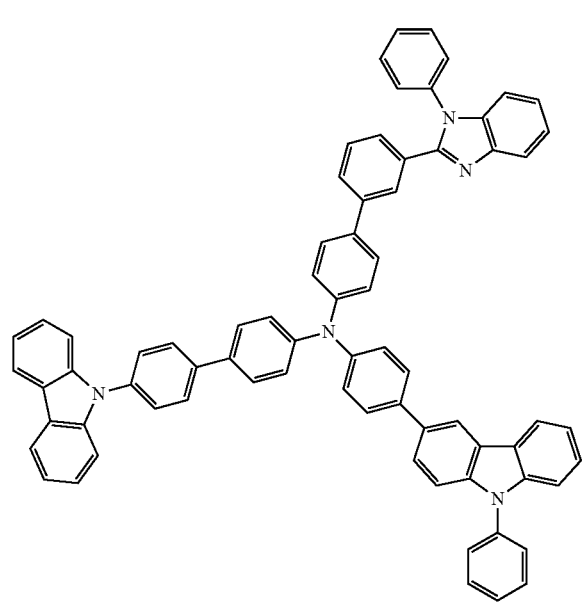
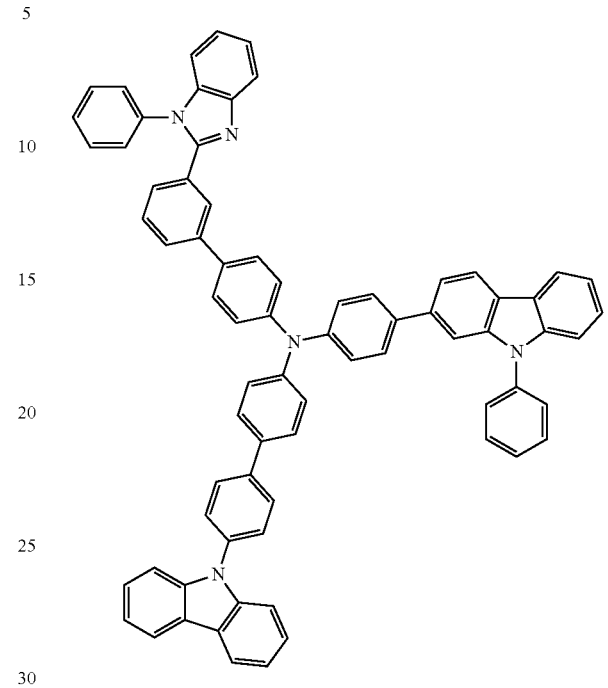
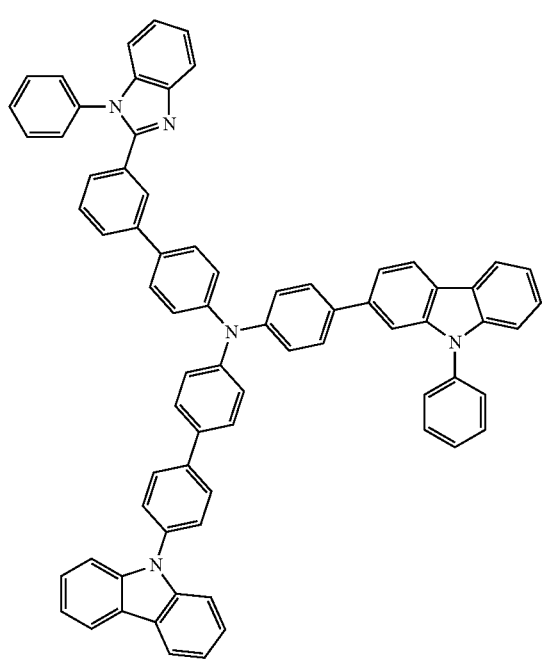
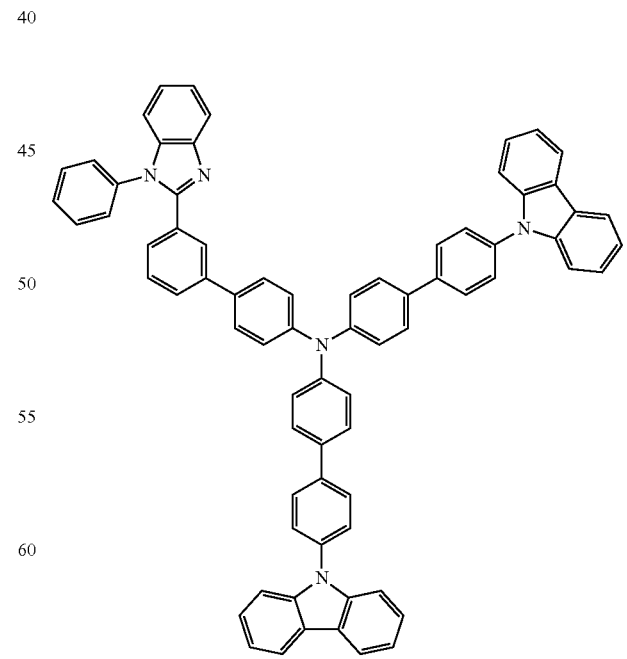

Electron-Transporting Glass Mixture 80 contains the following compounds:
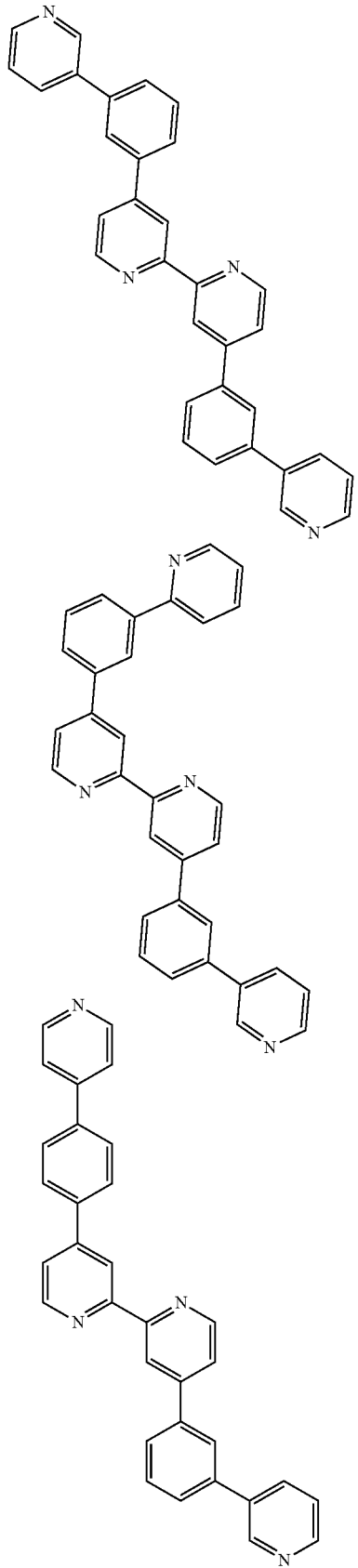
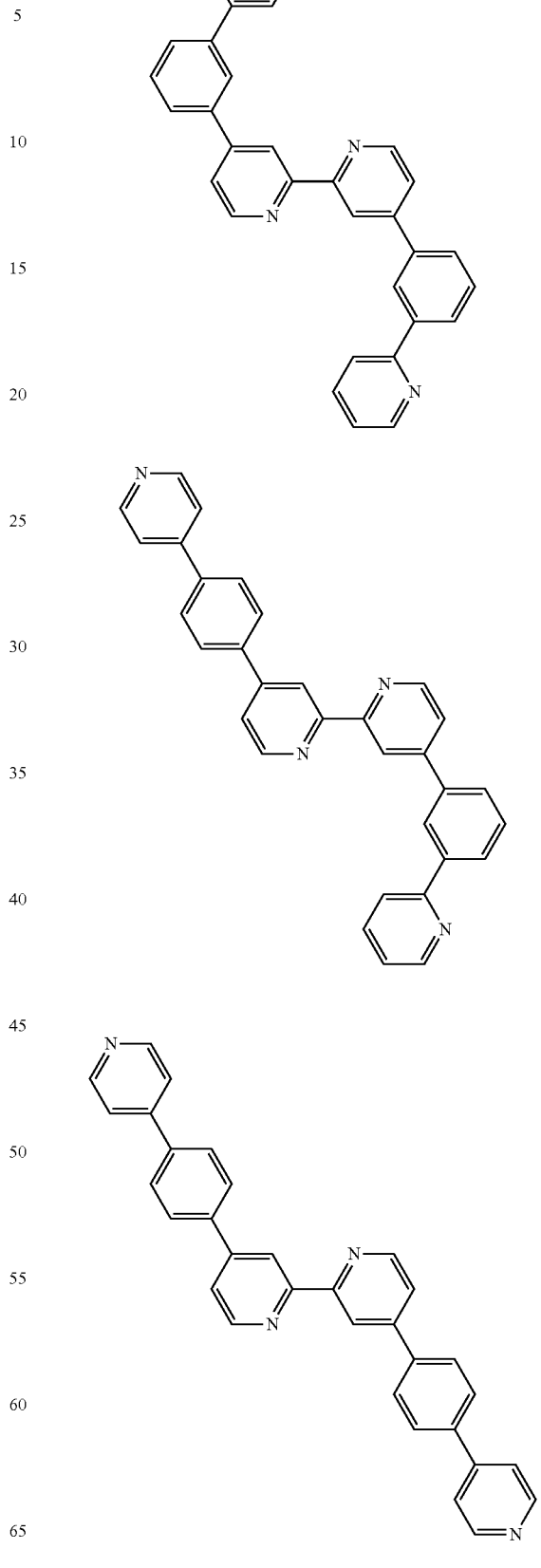

Ambipolar Glass Mixture 85 contains the following compounds:
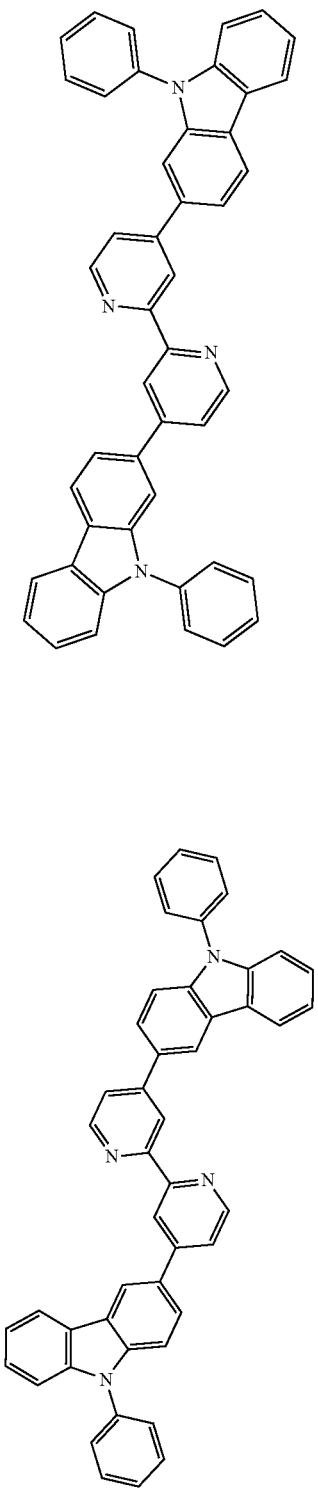
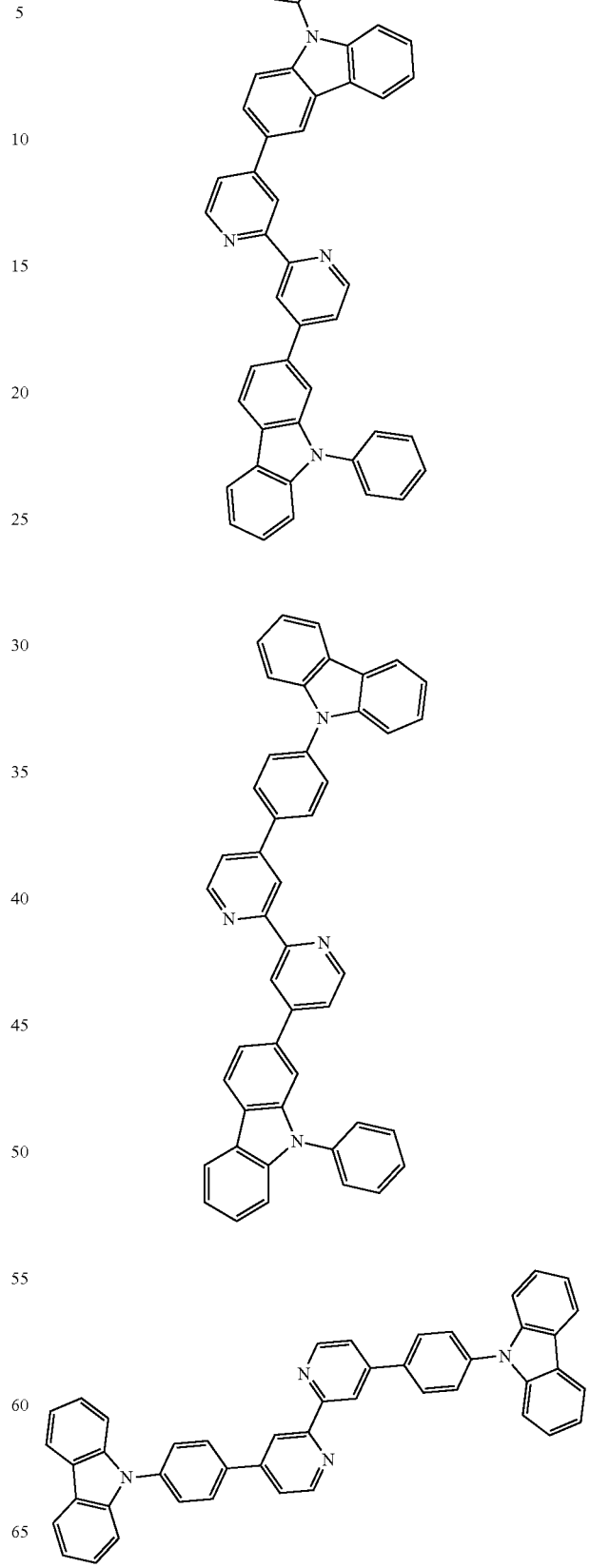

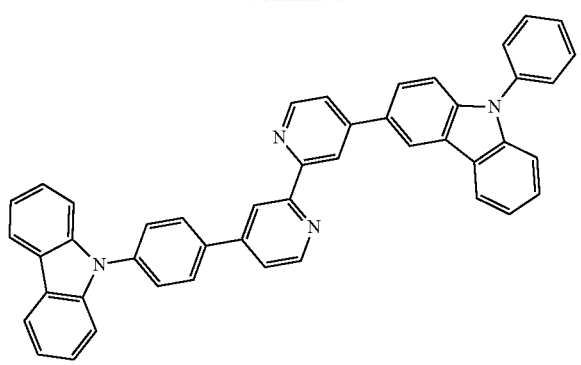
Ambipolar Glass Mixture 90 contains the following compounds:
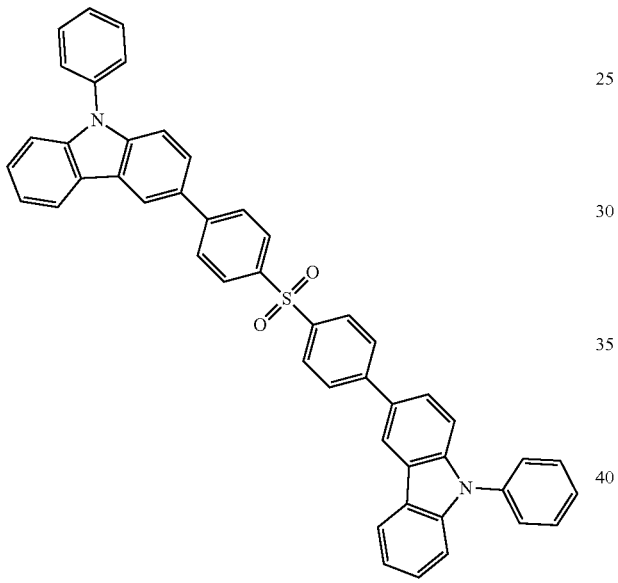
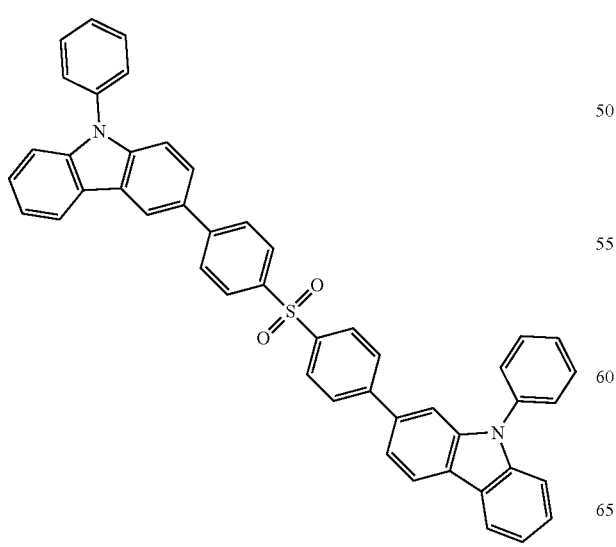
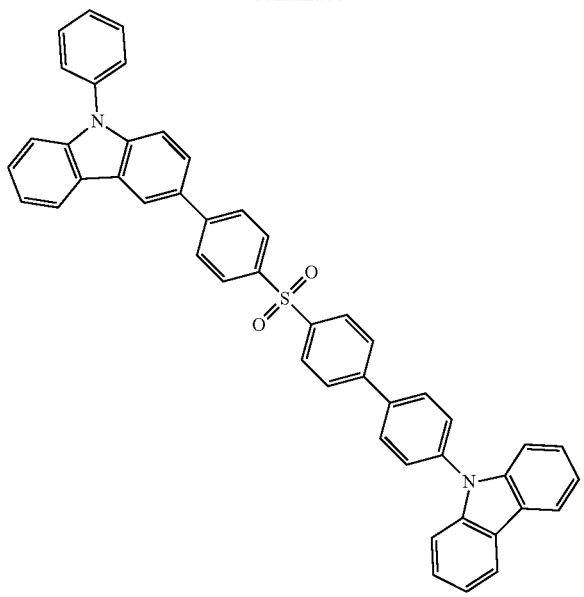
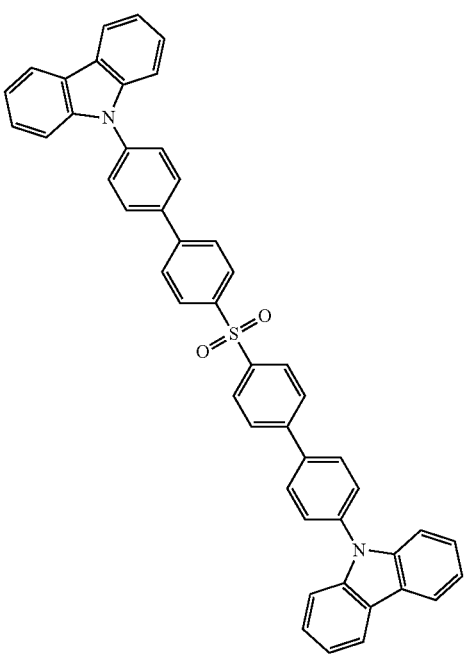
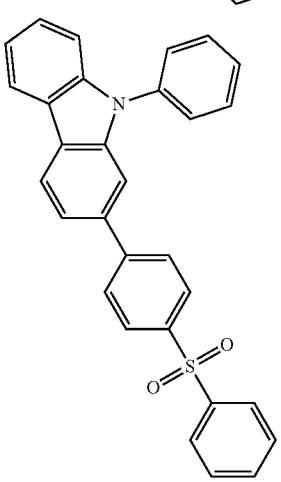

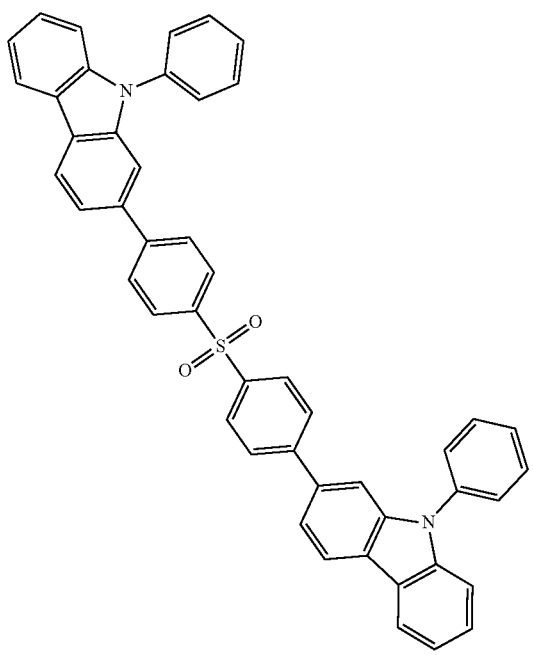 [SMILES: O=S(=O)(c1ccc(-c2ccc3c4ccccc4n(-c4ccccc4)c3c2)cc1)c1ccc(-c2ccc3c4ccccc4n(-c4ccccc4)c3c2)cc1]
Hole-Transporting Glass Mixture 95 contains the following compounds:
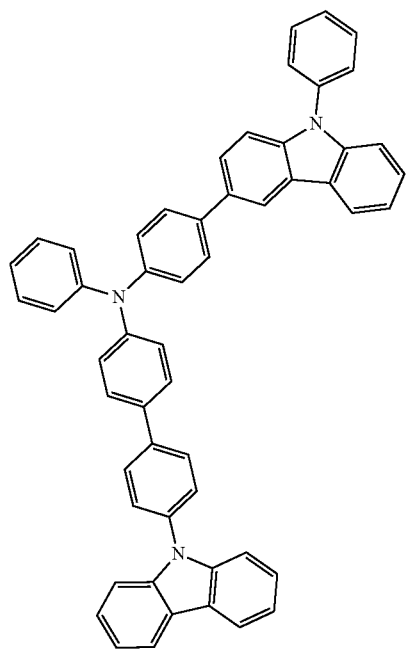
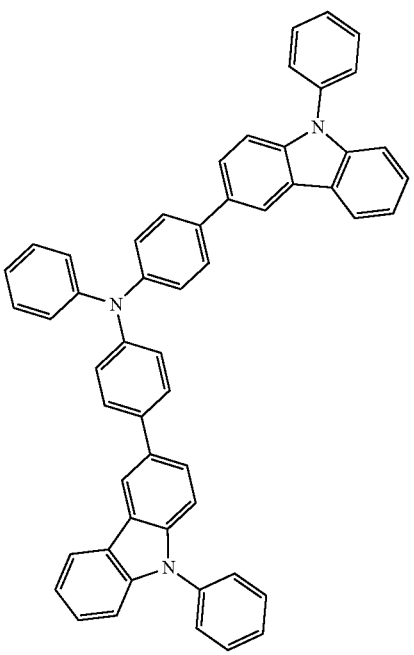

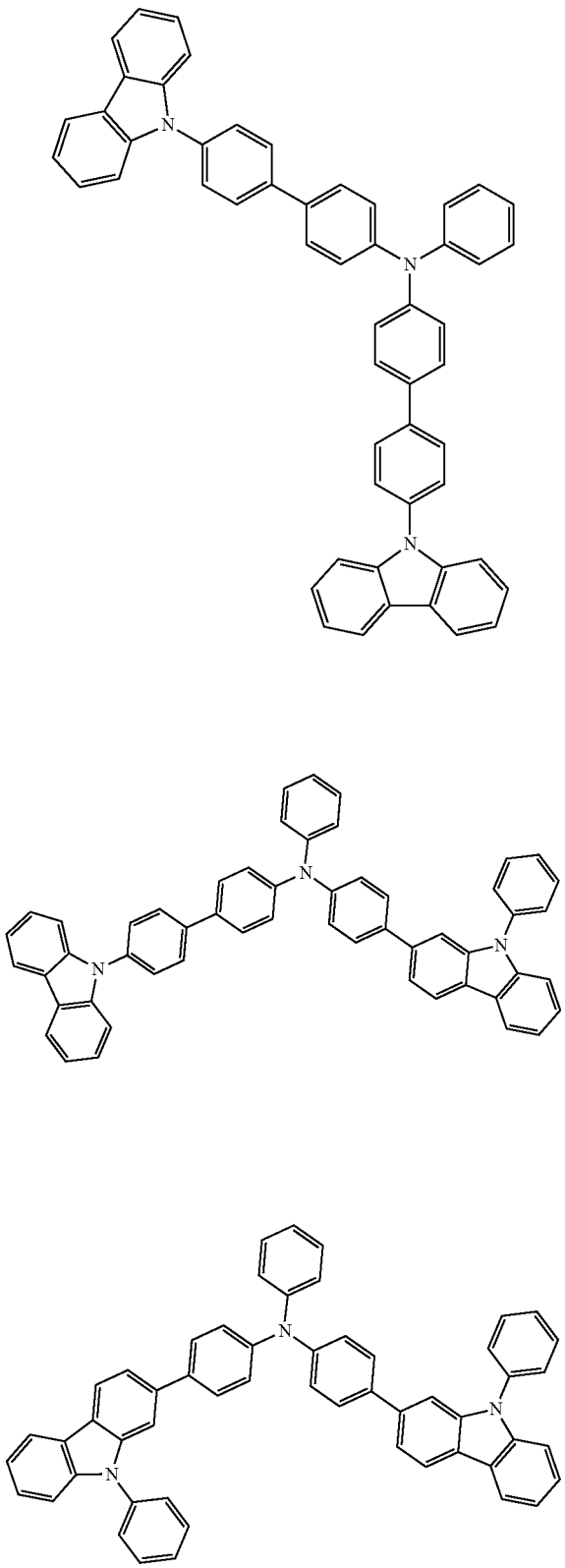
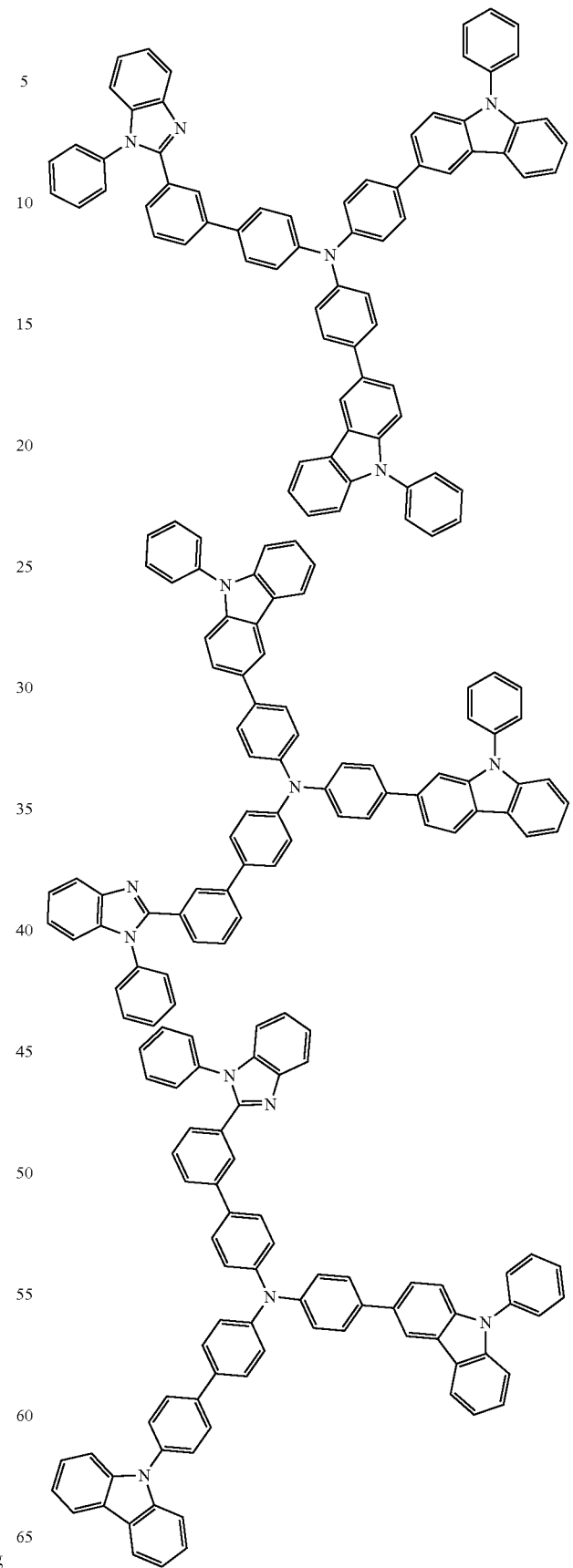
Ambipolar Glass Mixture 100 contains the following compounds:

-continued
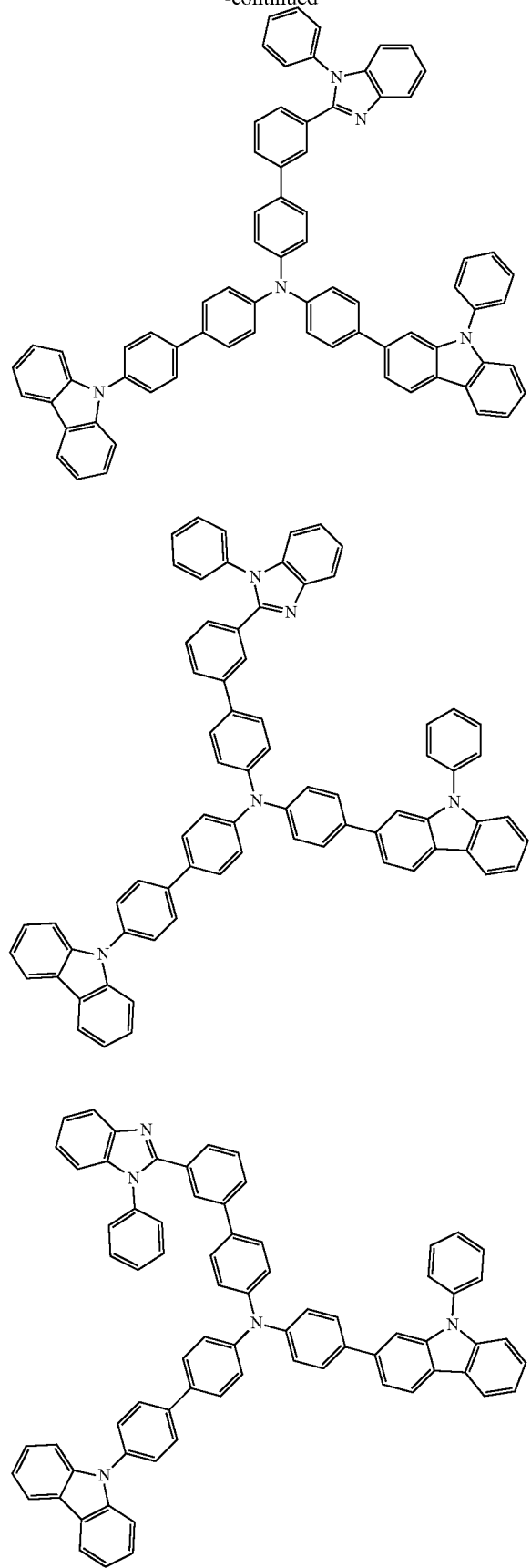
Ambipolar Glass Mixture 105 contains the following compounds:
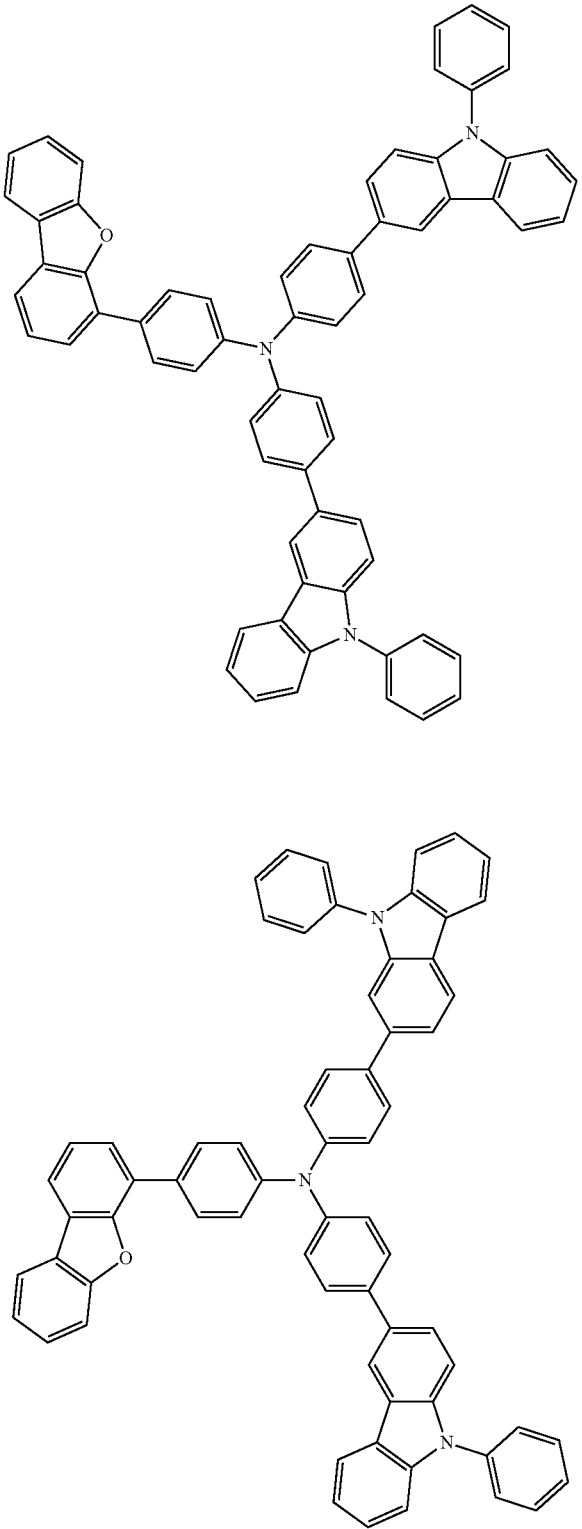

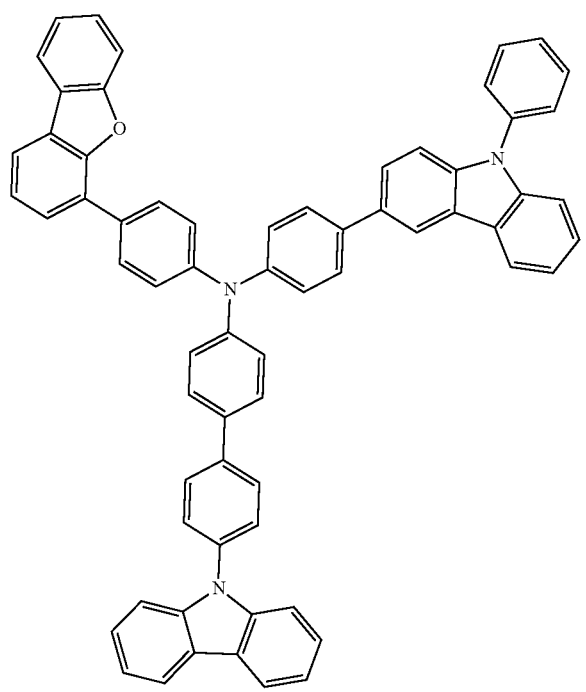
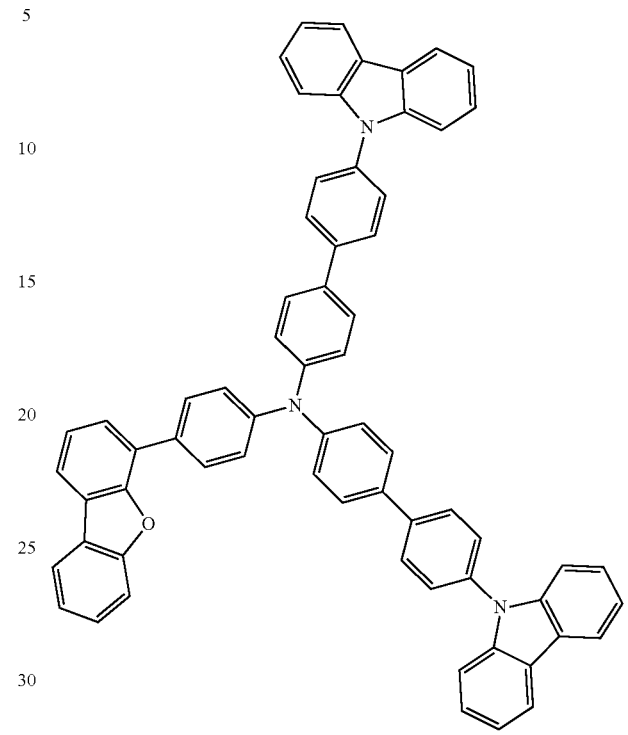
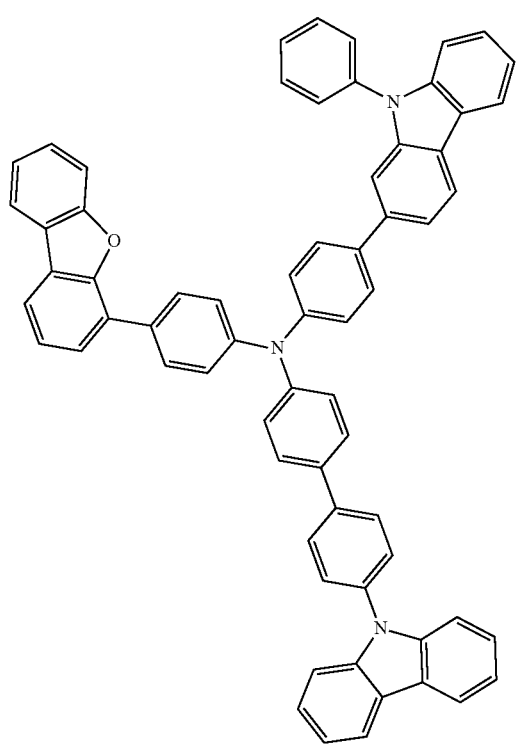
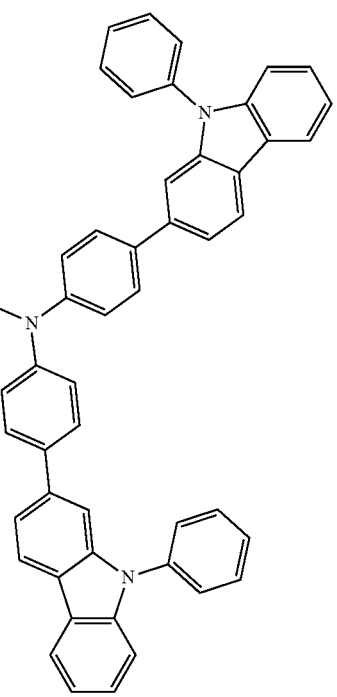
Ambipolar Glass Mixture 110 contains the following compounds:

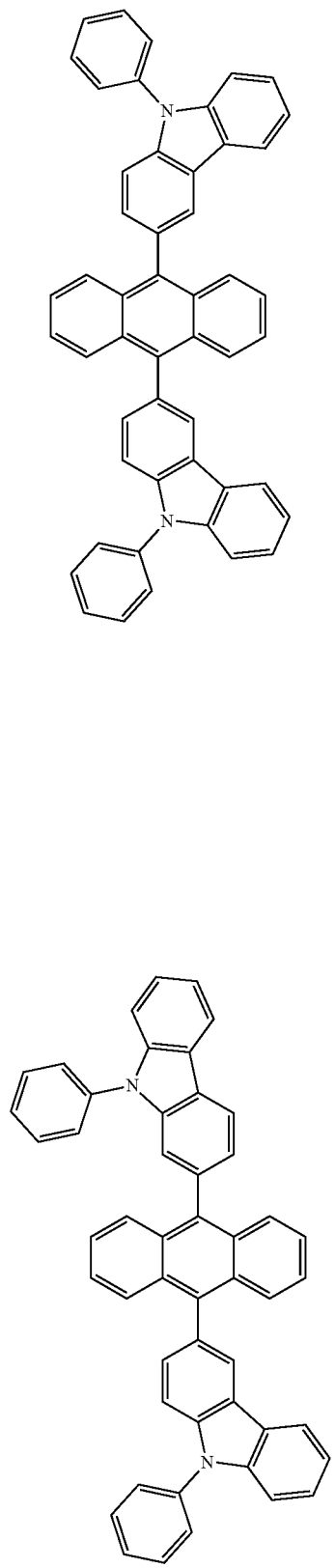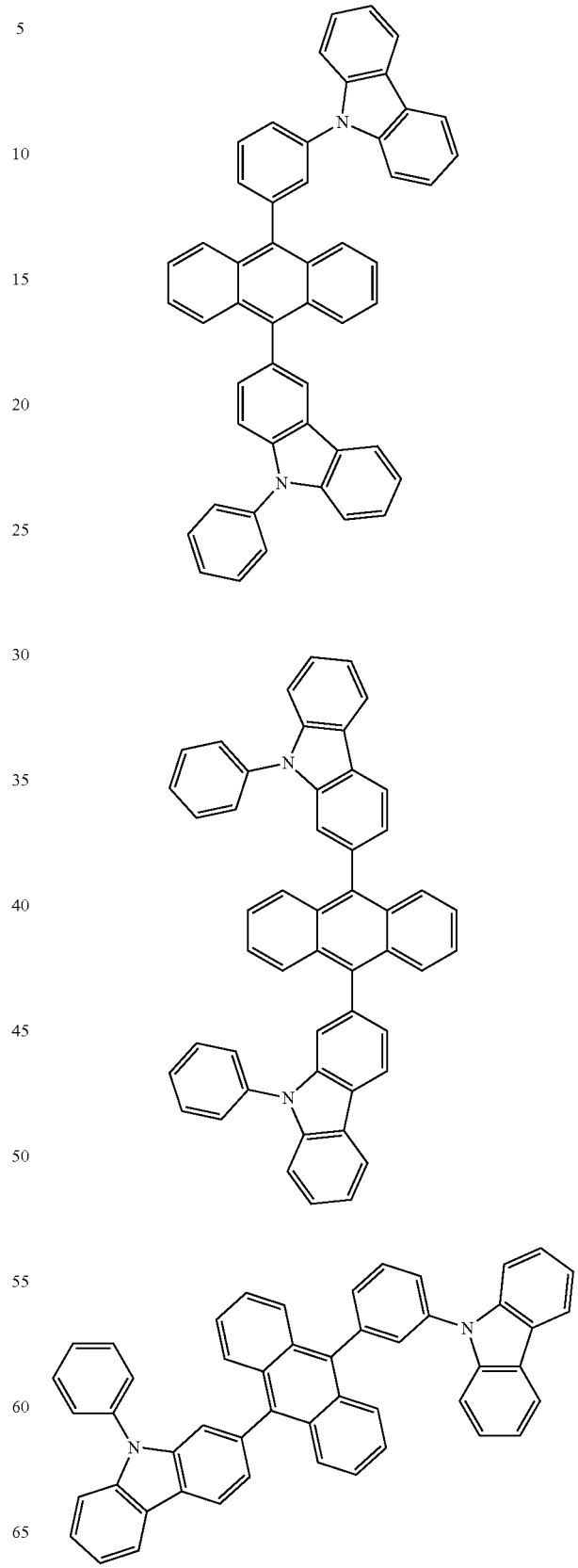

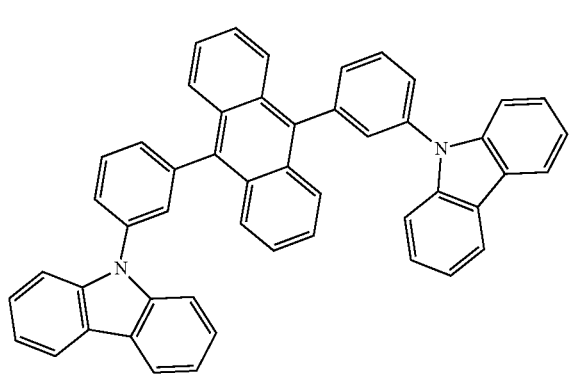
Hole-Transporting Glass Mixture 115 contains the following compounds:
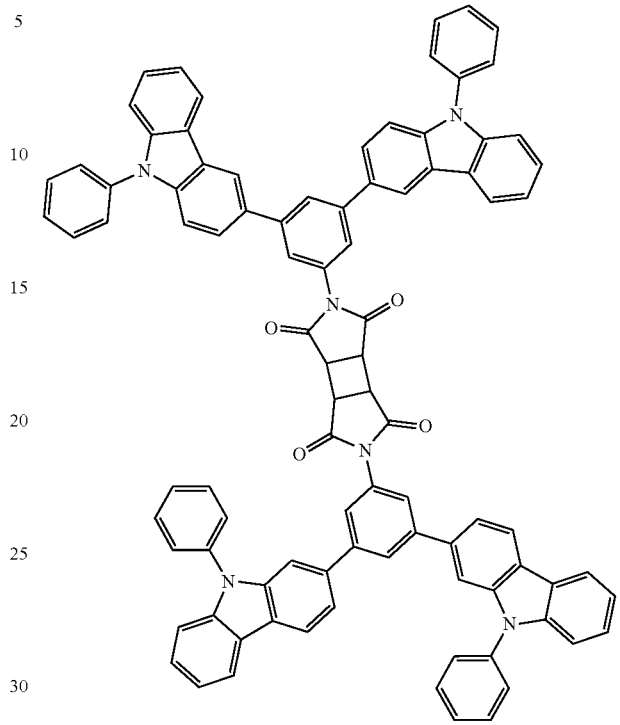
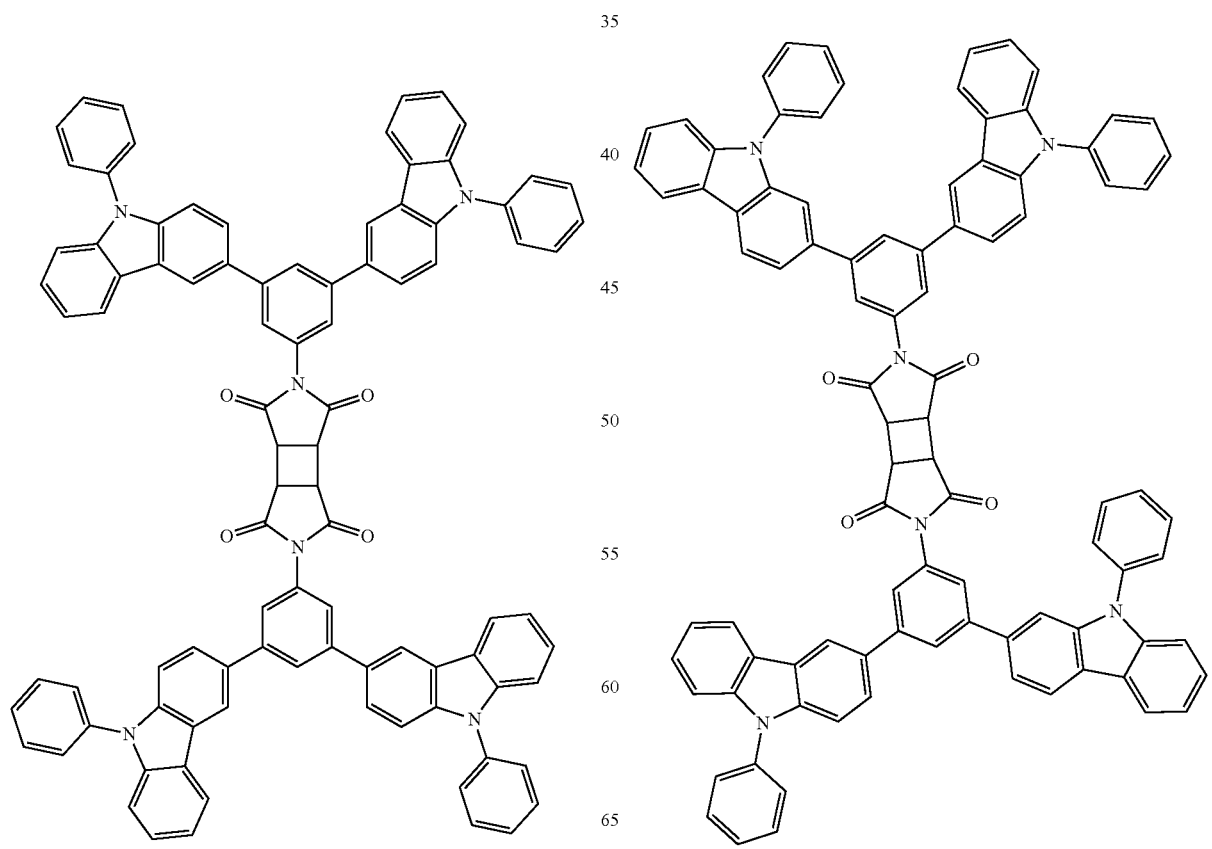

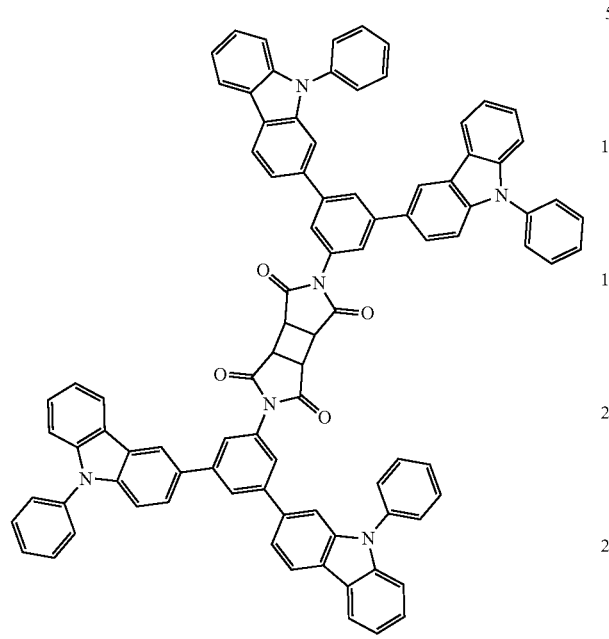
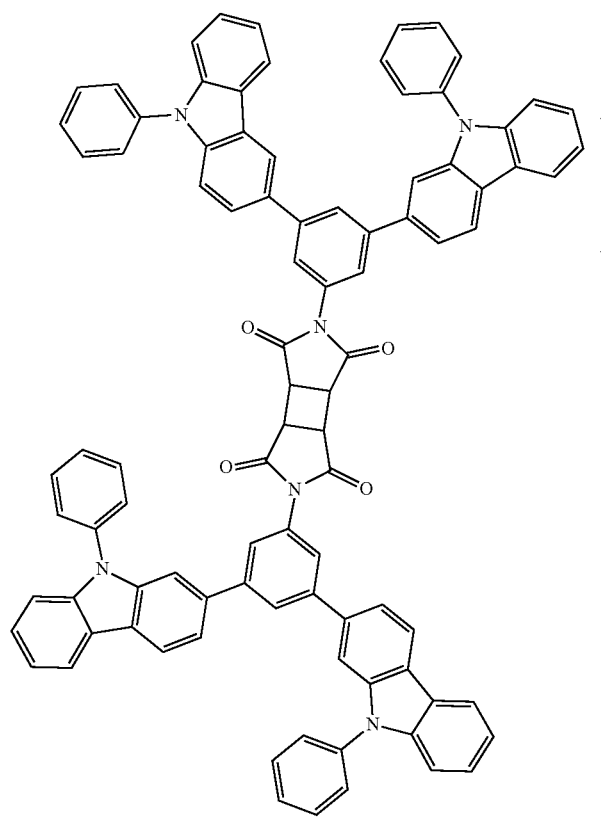
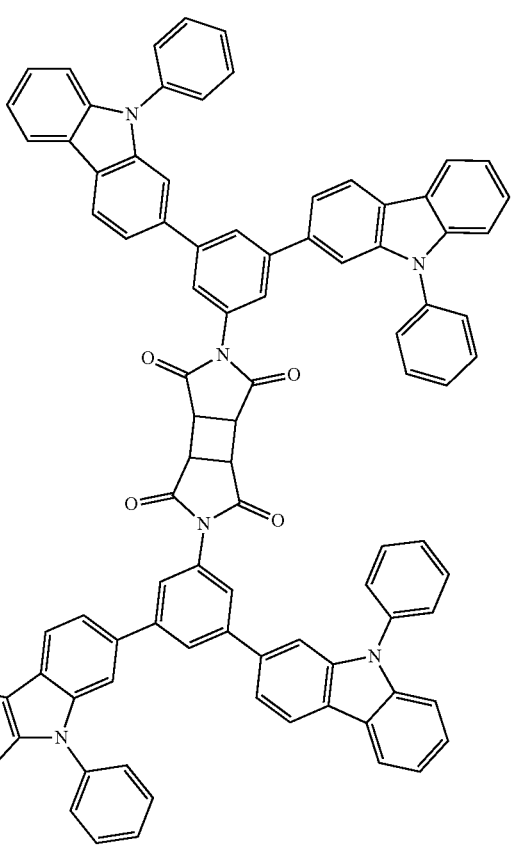
Electron-Transporting Glass Mixture 120 contains the following compounds:
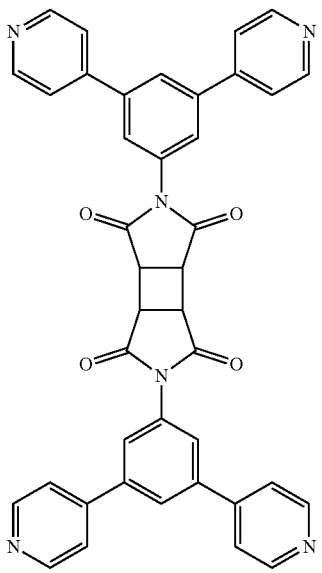

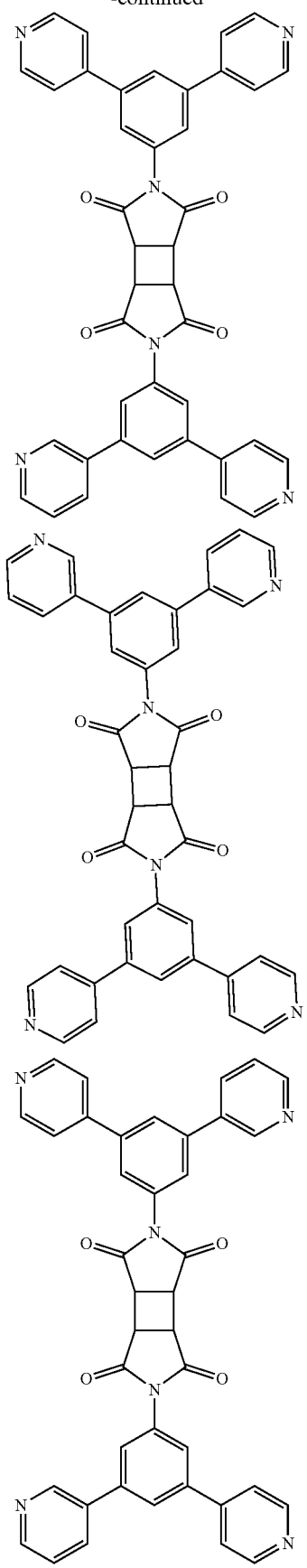
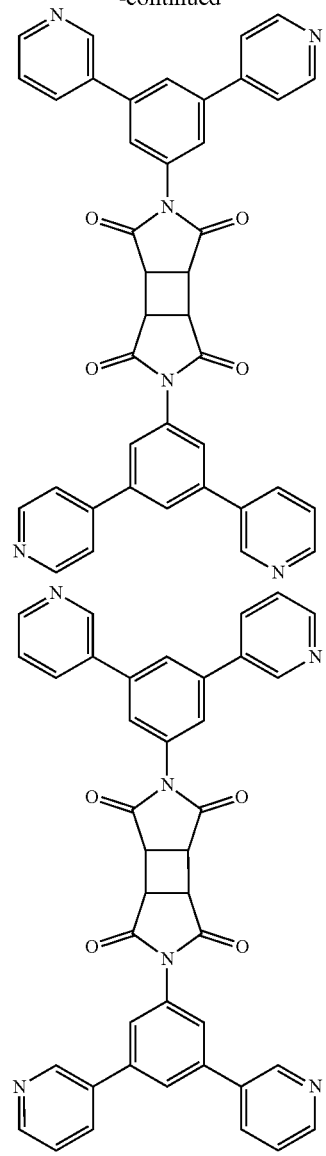
Hole-Transporting Glass Mixture 121 contains the following compounds:
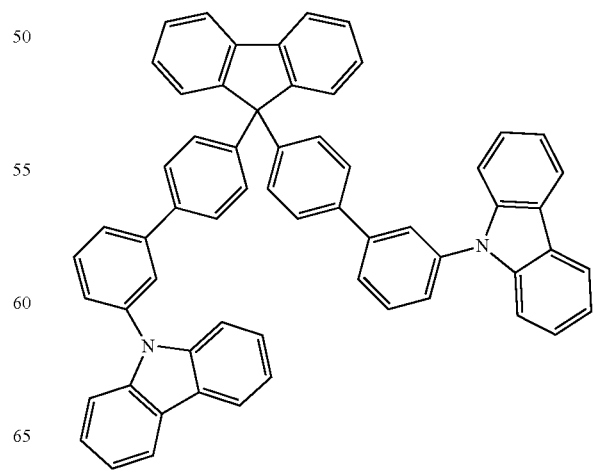

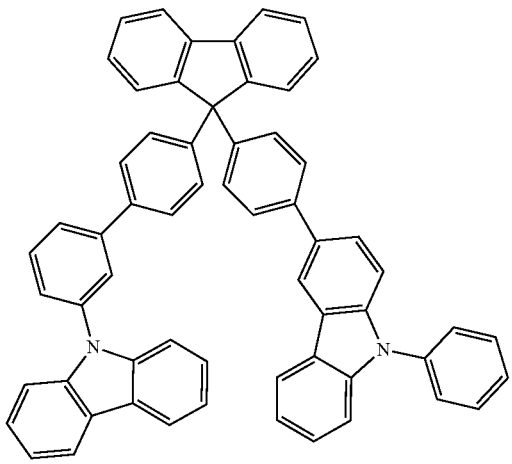
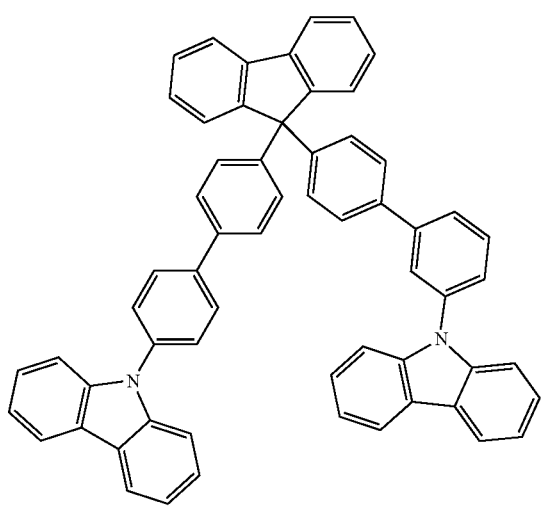
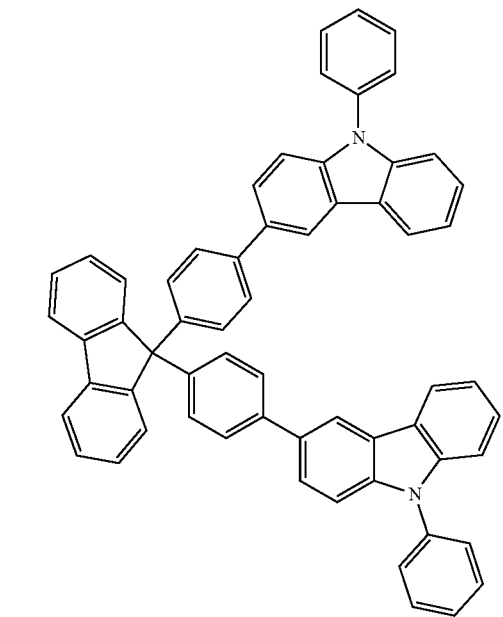
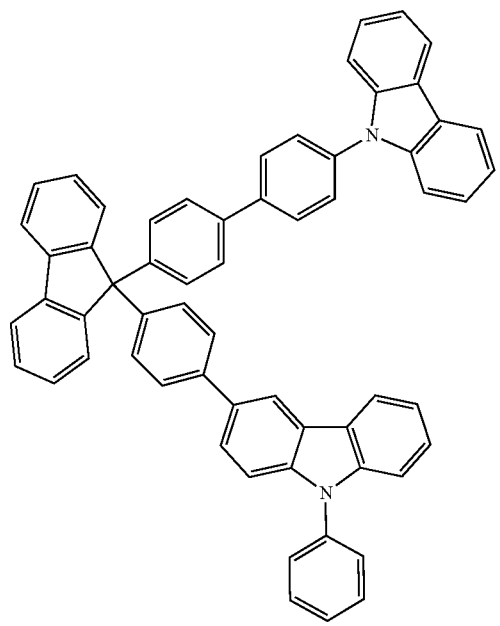
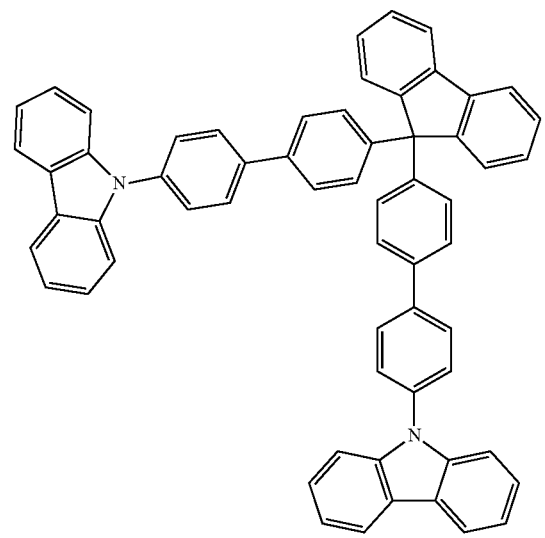
Hole-Transporting Glass Mixture 122 contains the following compounds:
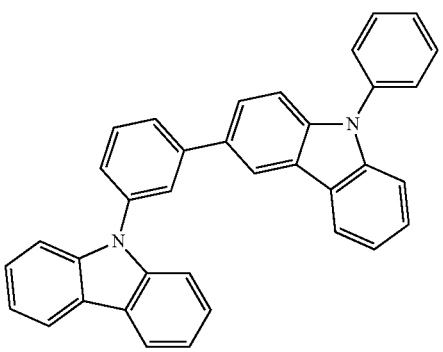

-continued
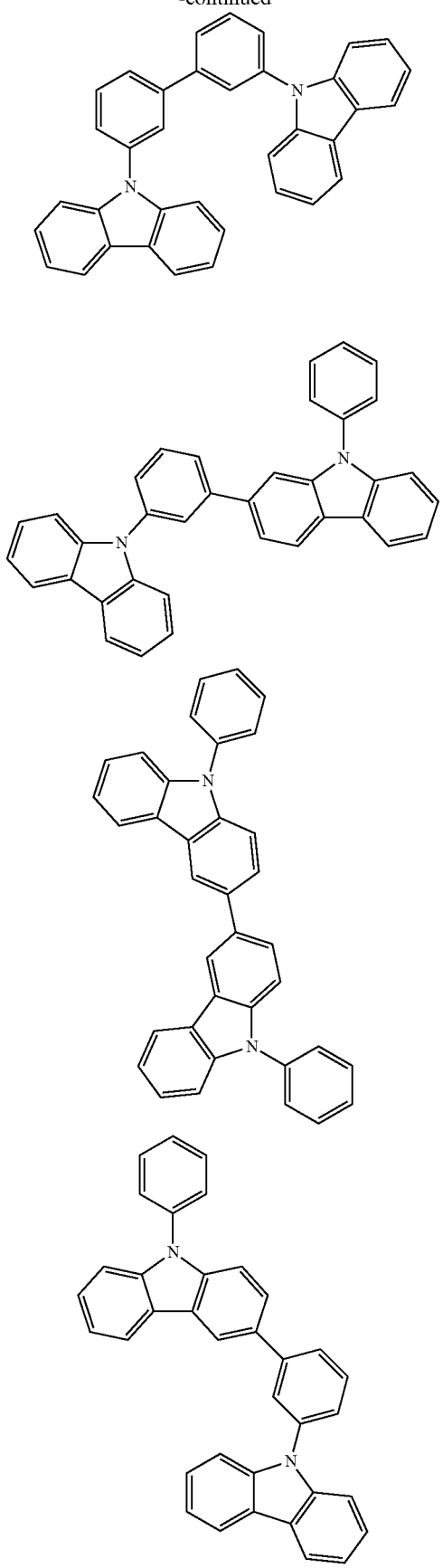
-continued
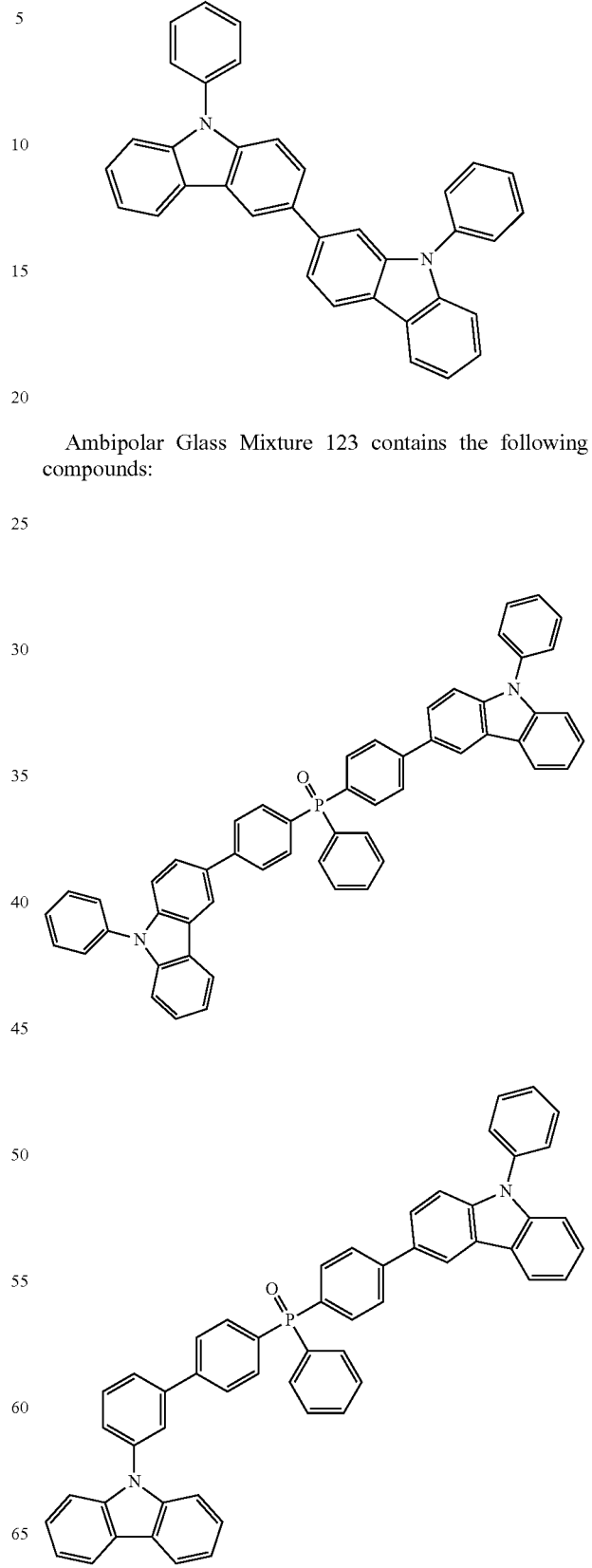
Ambipolar Glass Mixture 123 contains the following compounds:

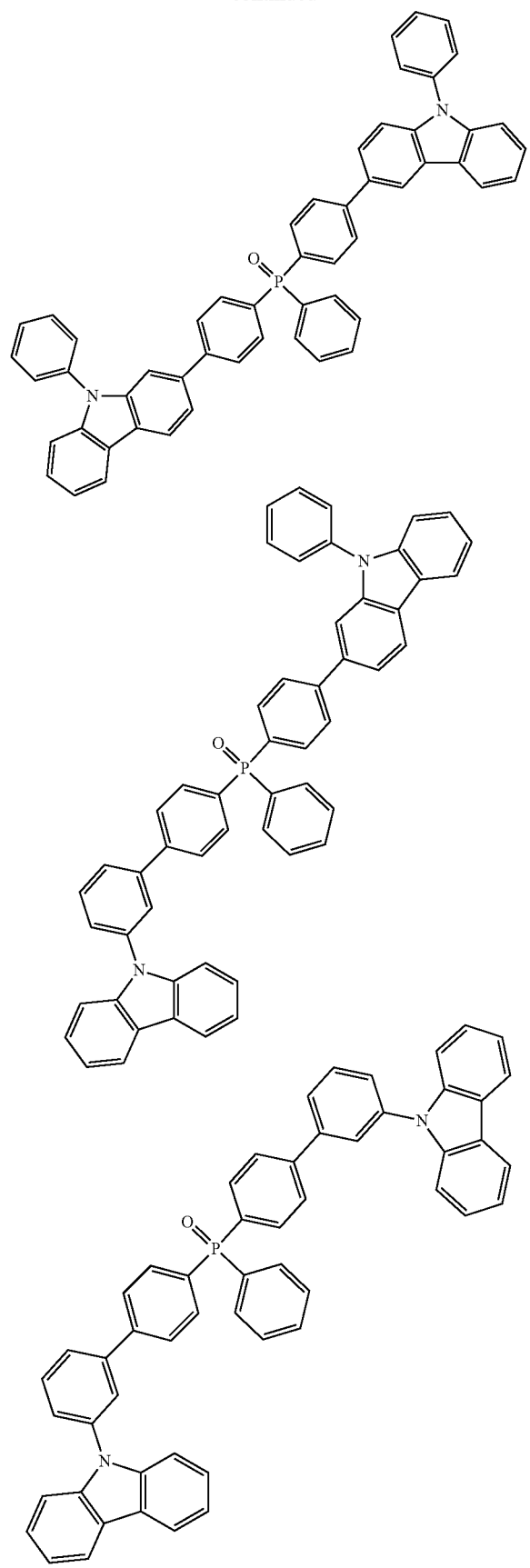
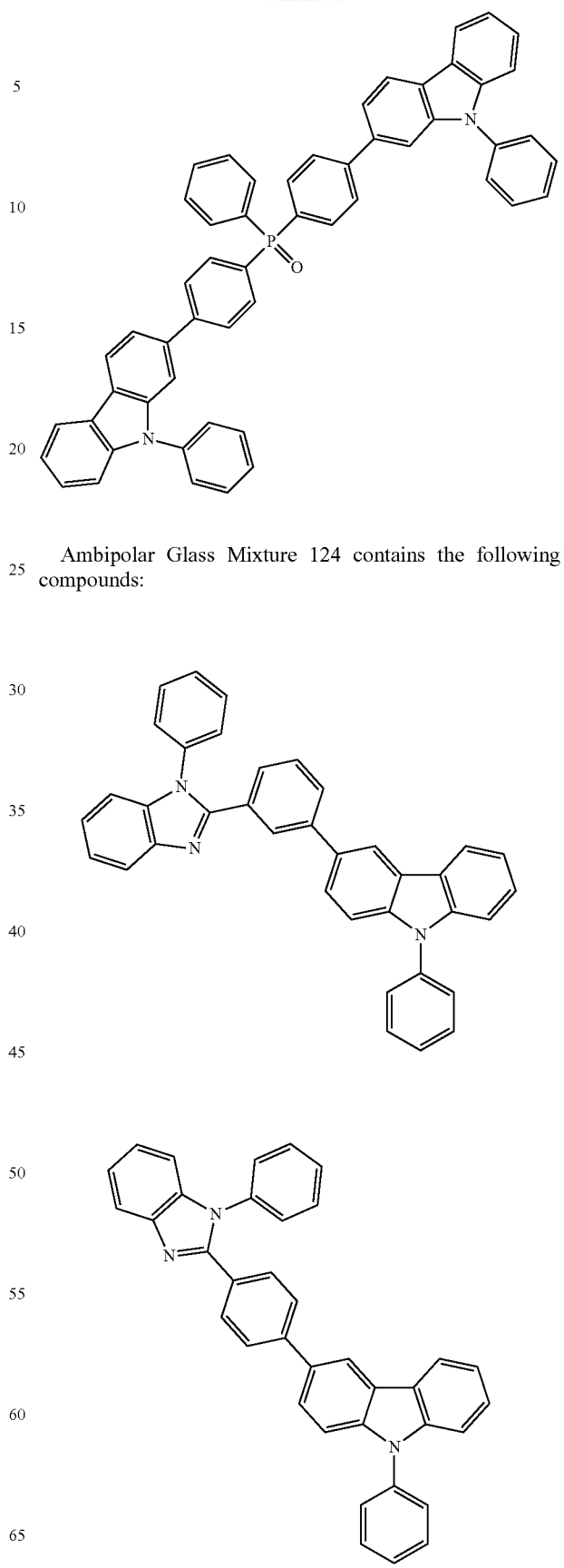
Ambipolar Glass Mixture 124 contains the following compounds:

-continued
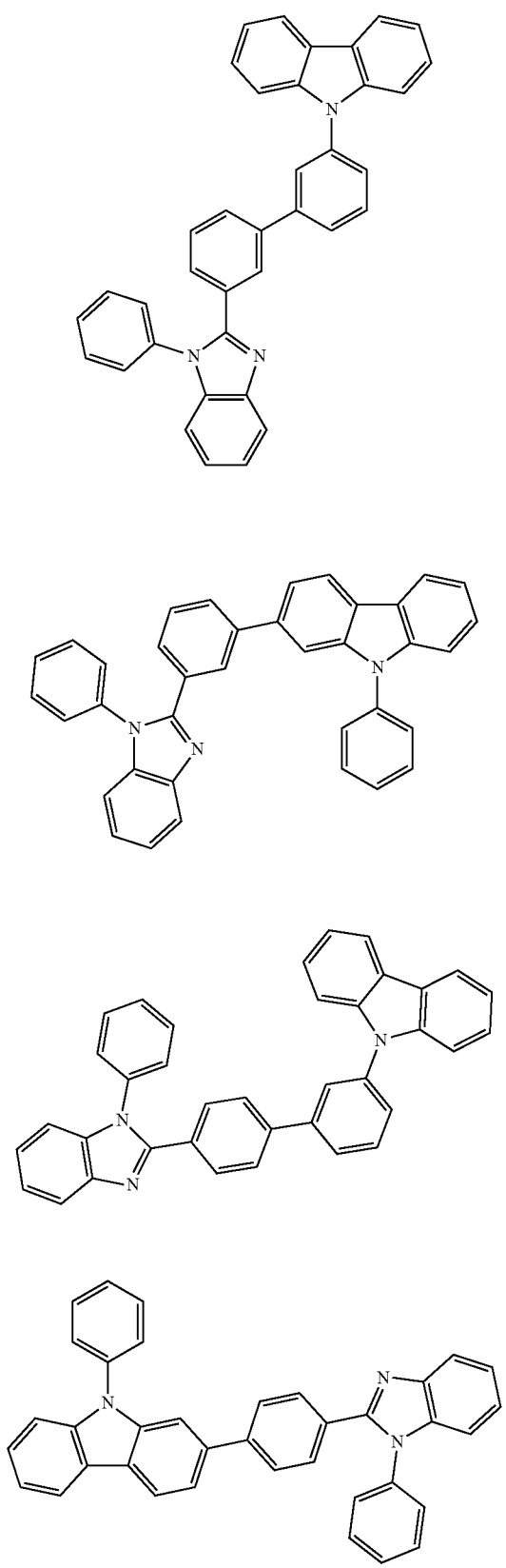
Electron-Transporting Glass Mixture 125 contains the following compounds:
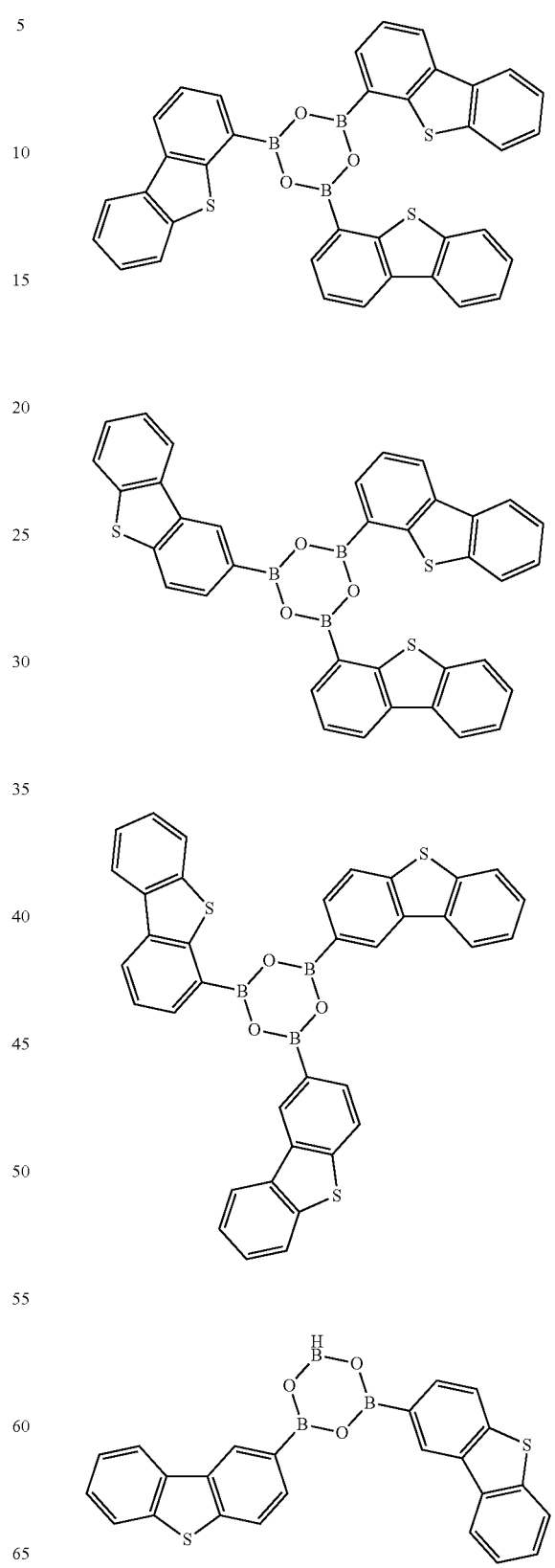

Hole-Transporting Glass Mixture 126 contains the following compounds:
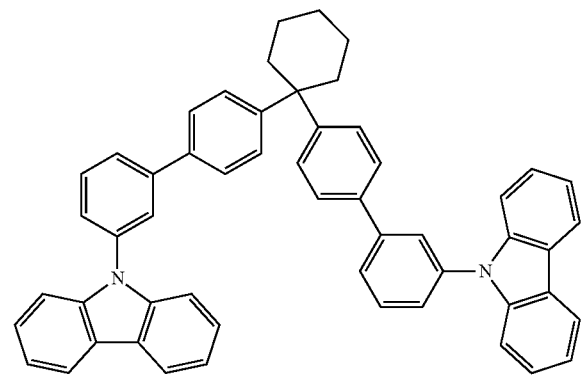
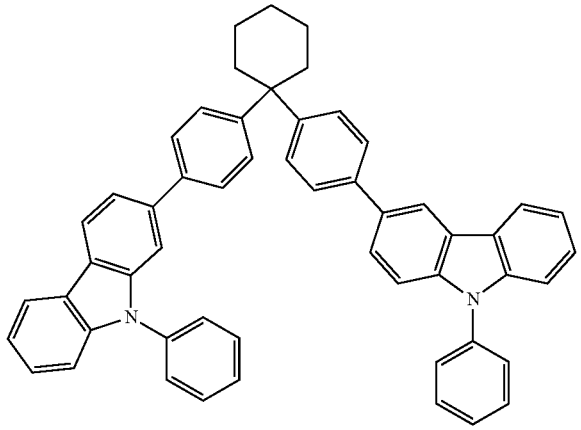
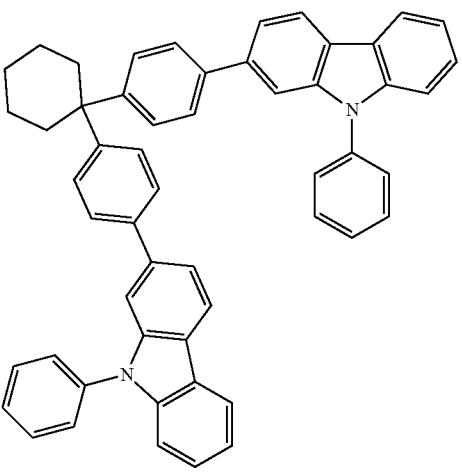
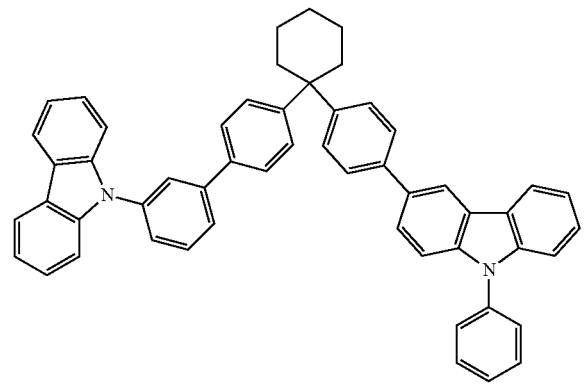
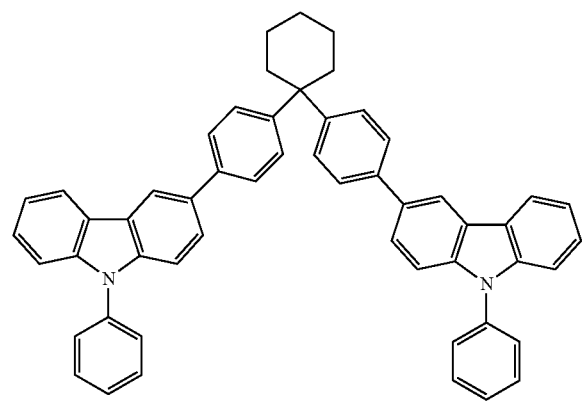
Hole-Transporting Glass Mixture 127 contains the following compounds:
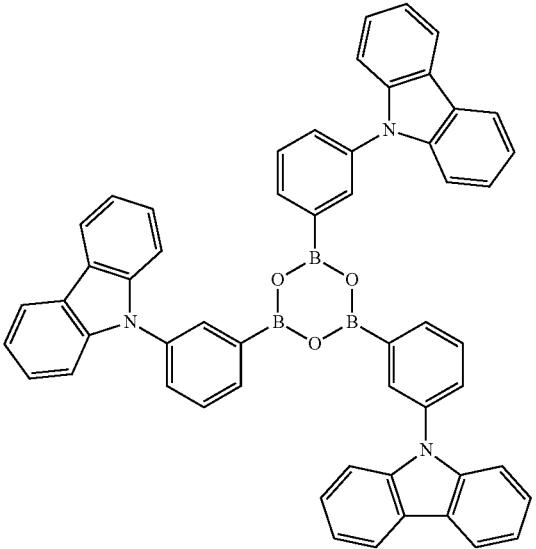

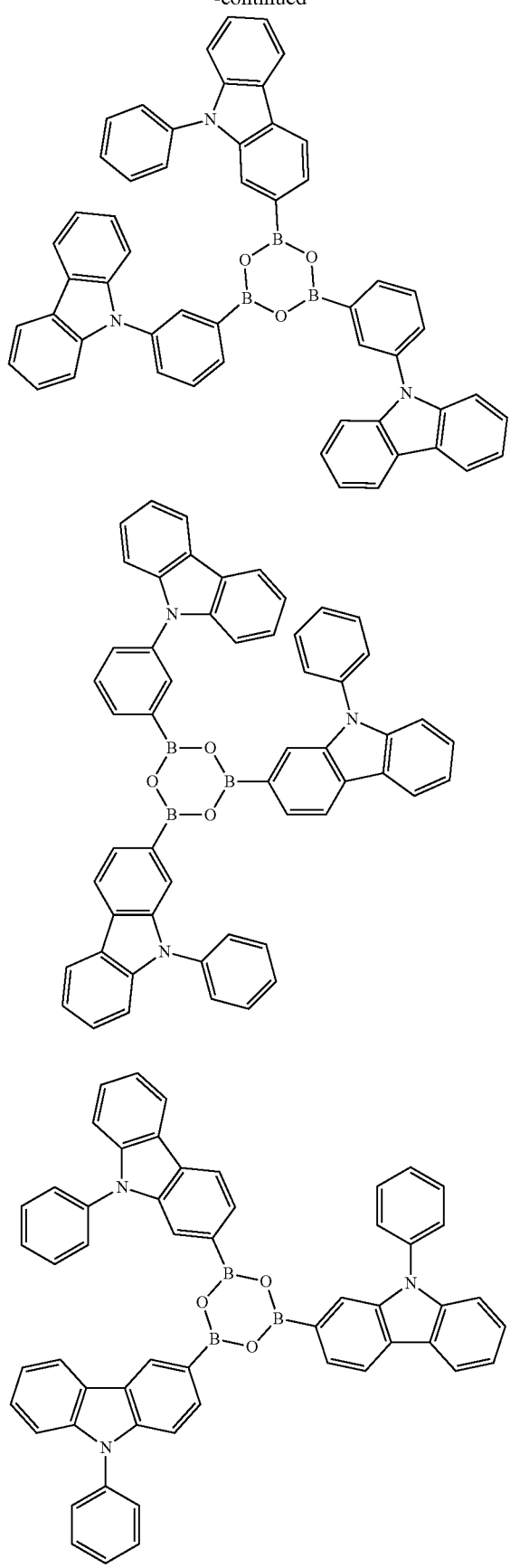
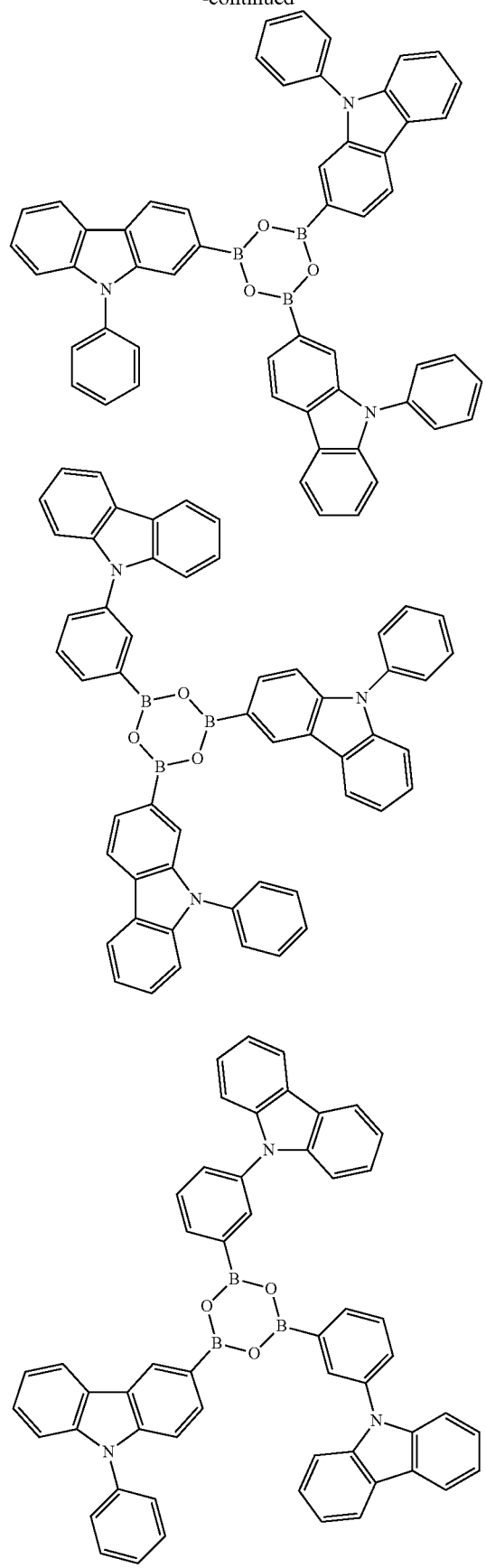

-continued
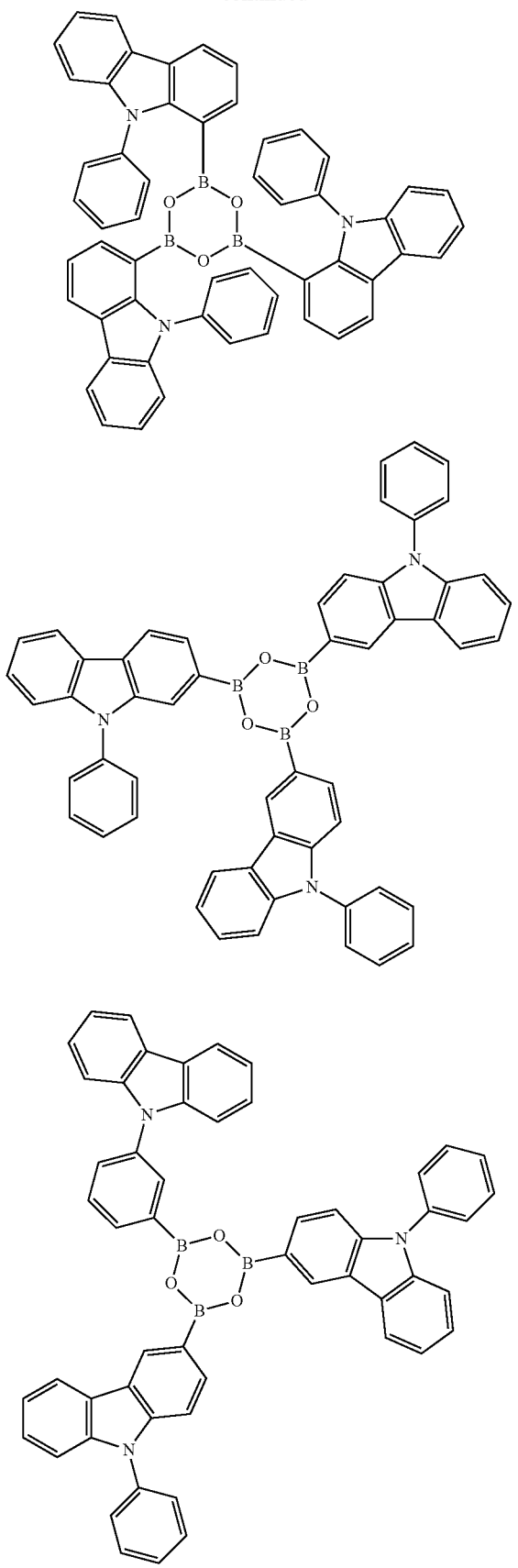
Hole-Transporting Glass Mixture 128 contains the following compounds:
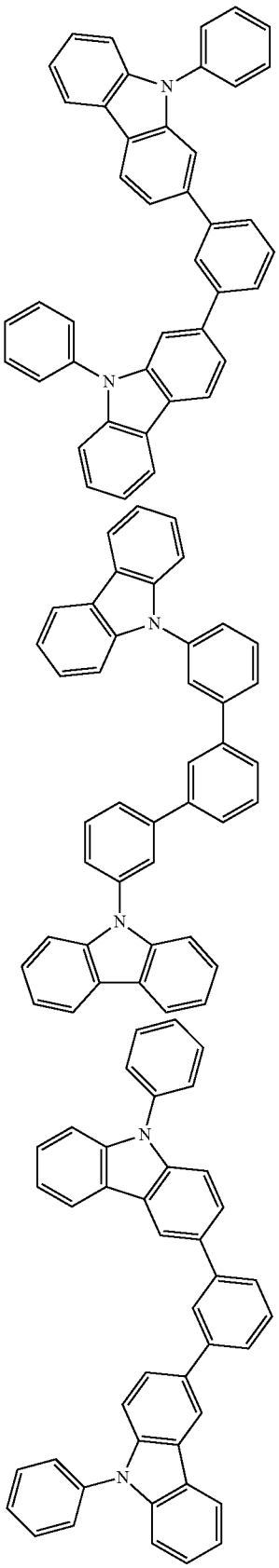

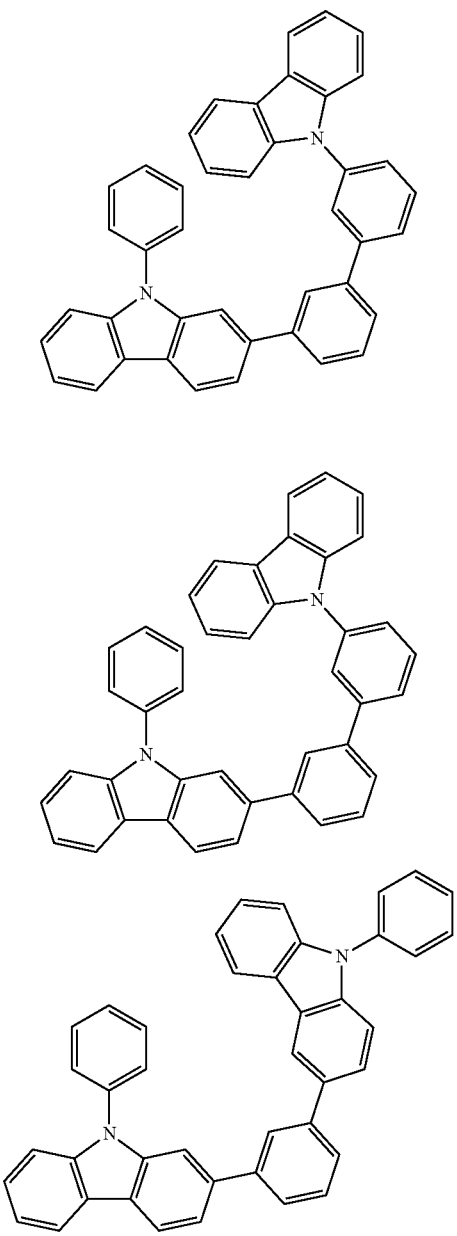
Electron-Transporting Glass Mixture 129 contains the following compounds:
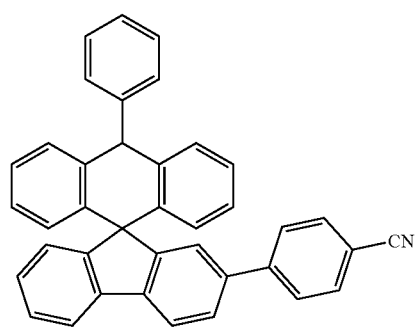
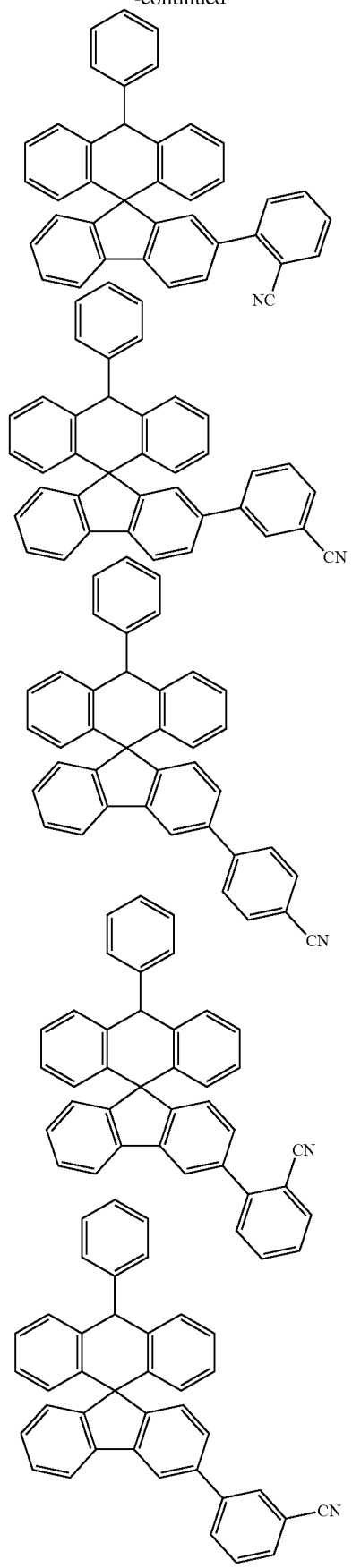

Hole-Transporting Glass Mixture 130 contains the following compounds:
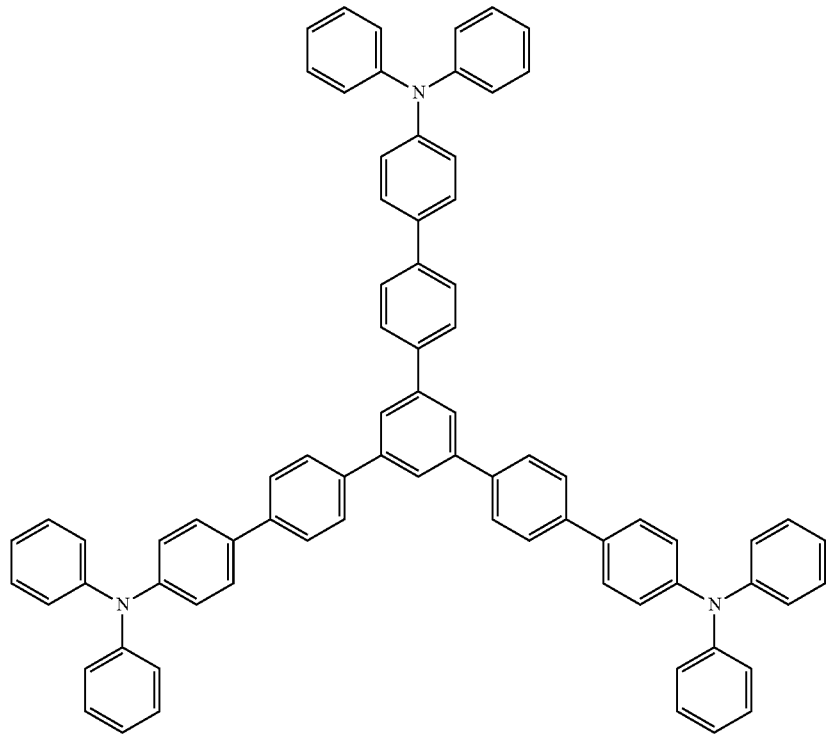
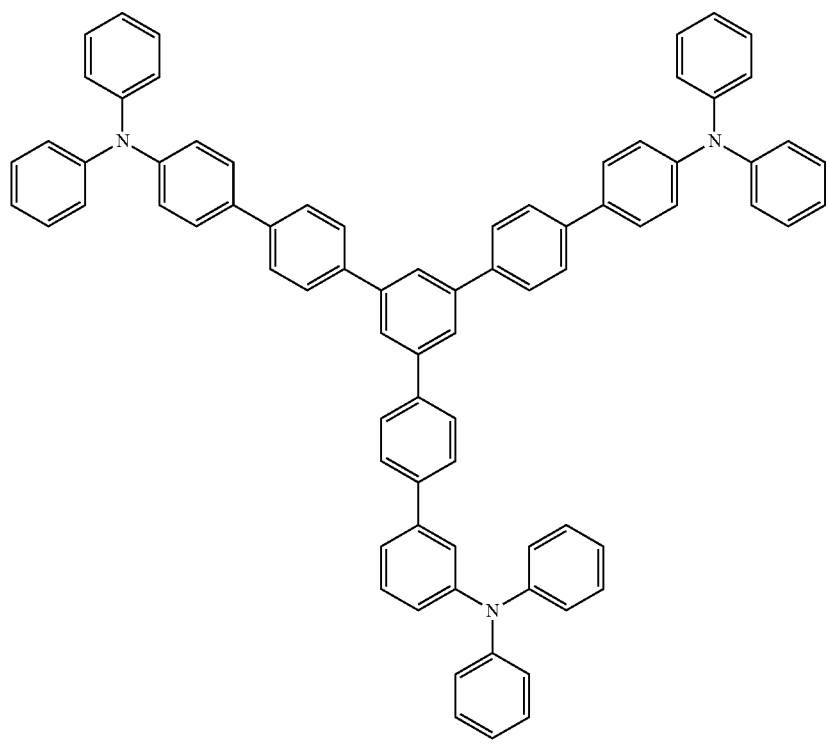

-continued
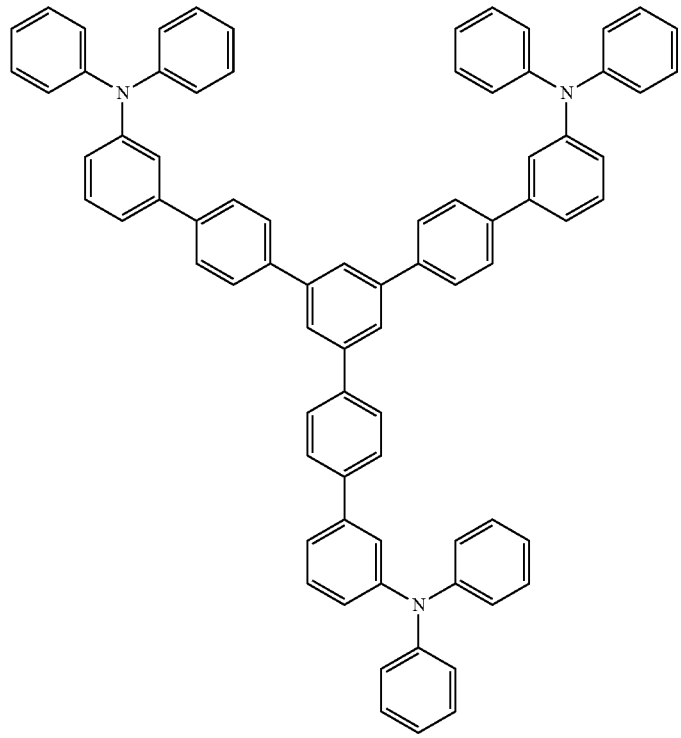
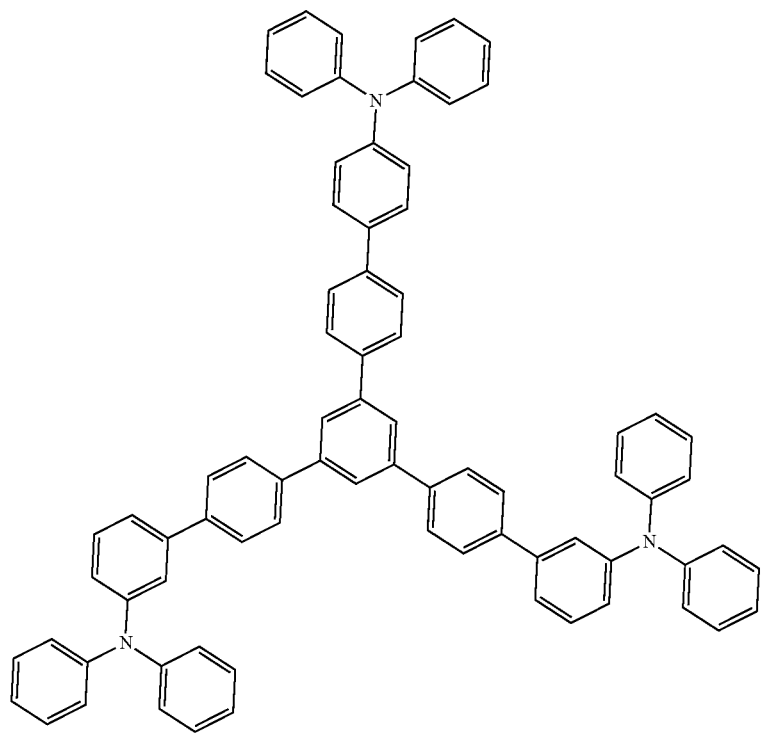

Electron-Transporting Glass Mixture 132 contains the following compounds:
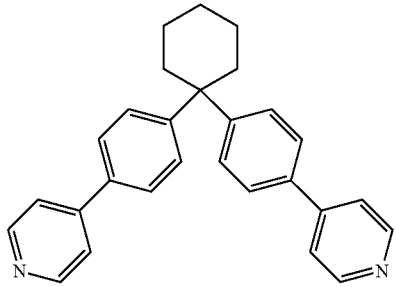
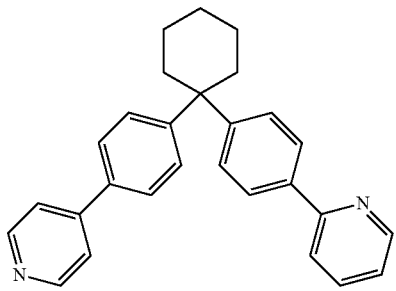
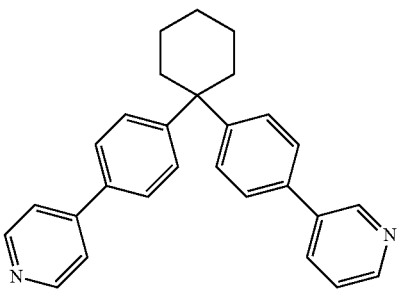
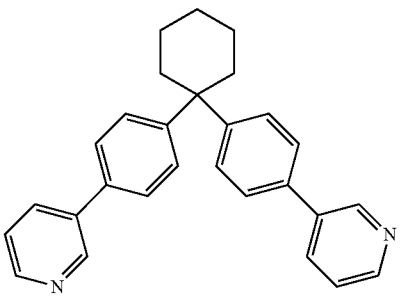
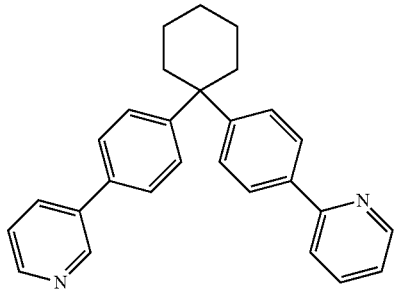
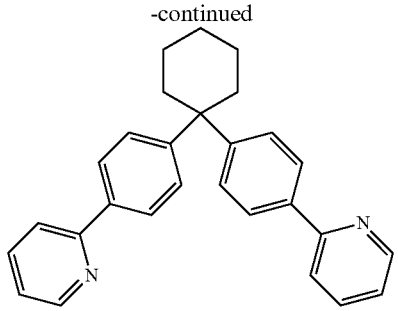
Hole-Transporting Glass Mixture 133 contains the following compounds:
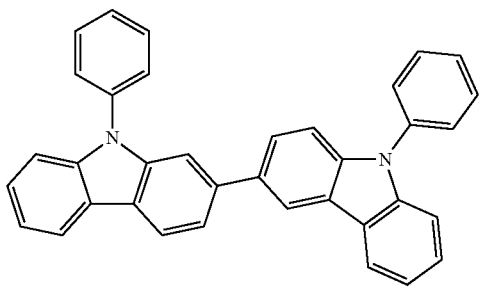
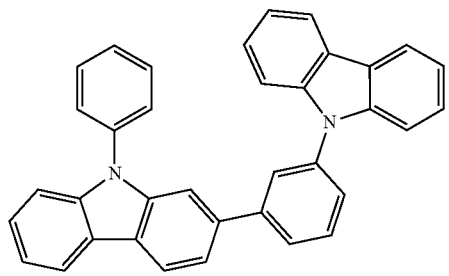
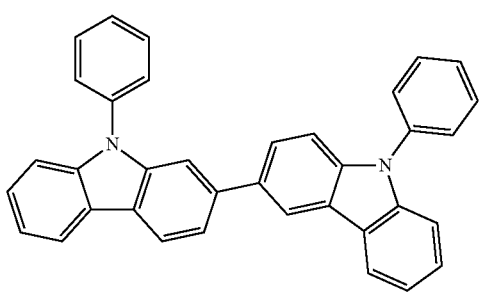
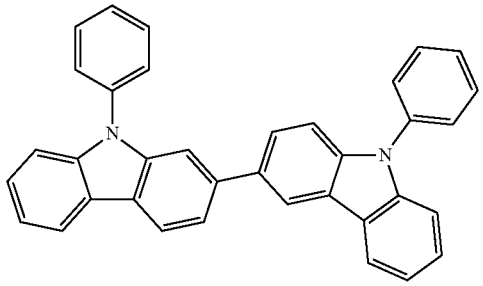

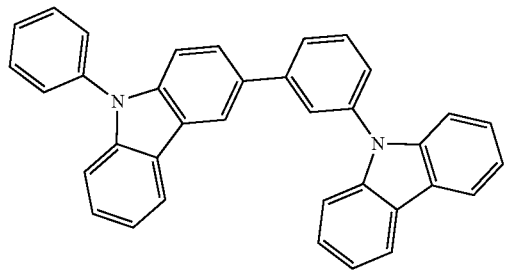
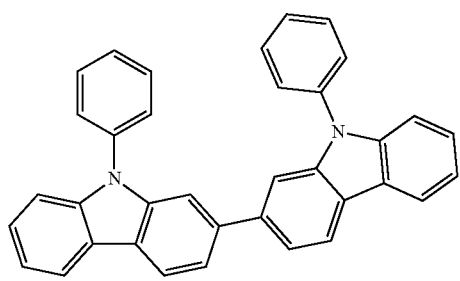
Hole-Transporting Glass Mixture 134 contains the following compounds:
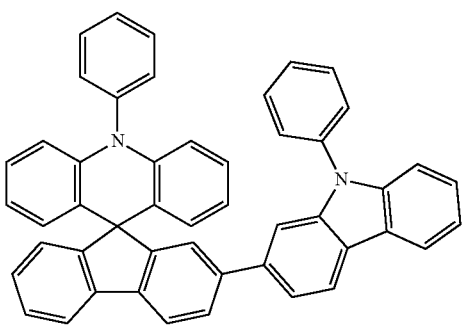
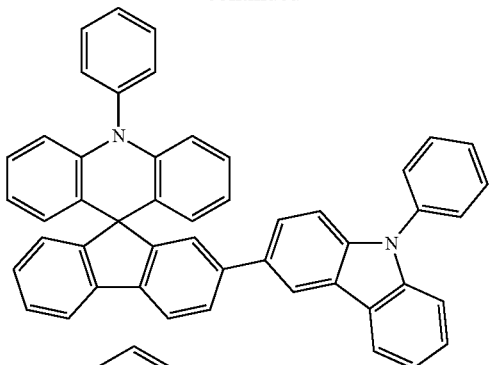
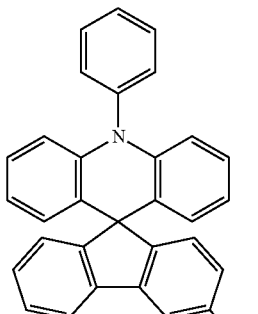
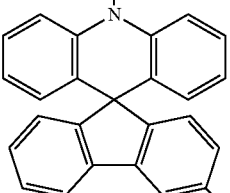
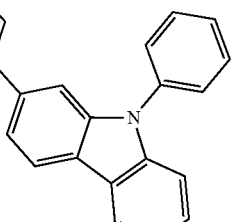
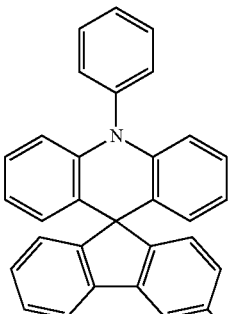
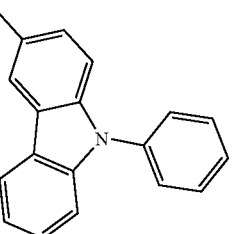

Electron-Transporting Glass Mixture 135 contains the following compounds:

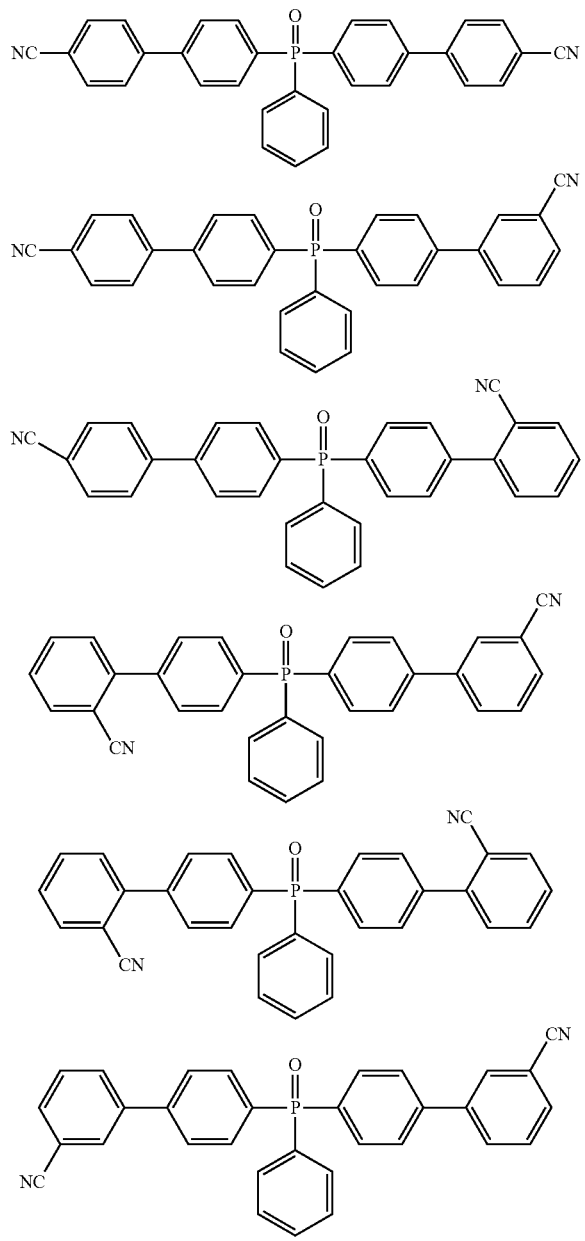

General Device Architecture

Embodiments of this disclosure include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT).

There are numerous configurations of the organic layers wherein the present invention can be successfully practiced. Essential requirements are a cathode, an anode, an HTL and an LEL. A more typical structure is shown in FIG. 1 and contains a substrate 101, an anode 103, an optional hole-injecting layer 105, a hole-transporting layer 107, a light-emitting layer 109, an electron-transporting layer 111, and a cathode 113. These layers are described in detail below. Note that the substrate may alternatively be located adjacent to the cathode, or the substrate may actually constitute the anode or cathode. Also, the total combined thickness of the organic layers is less than 600 nm, less than 500 nm, or from 5 nm to 450 nm.

Substrate

The substrate 101 can either be light transmissive or opaque, depending on the intended direction of light emission. The light transmissive property is desirable for viewing the EL emission through the substrate. Transparent glass or organic material are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials. Of course it is necessary to provide in these device configurations a light-transparent top electrode.

Anode

The conductive anode layer 103 is commonly formed over the substrate and, when EL emission is viewed through the anode, should be transparent or substantially transparent to the emission of interest. Common transparent anode materials used in this invention are indium-tin oxide (ITO) and tin oxide, but other metal oxides can work including, but not limited to, aluminum- or indium-doped zinc oxide (IZO), magnesium-indium oxide, and nickel-tungsten oxide. In addition to these oxides, metal nitrides, such as gallium nitride, and metal selenides, such as zinc selenide, and metal sulfides, such as zinc sulfide, can be used in layer 103. For applications where EL emission is viewed through the top electrode, the transmissive characteristics of layer 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

Hole-Injecting Layer (HIL)

Optionally, a hole-injecting layer 105 be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds such as those described in U.S. Pat. No. 4,720,432, and plasma-deposited fluorocarbon polymers such as those described in U.S. Pat. No. 6,208,075. Alternative hole-injecting materials reportedly useful in organic EL devices are described in EP 0 891 121 A1 and EP 1 029 909 A1.

Hole-Transporting Layer (HTL)

The hole-transporting layer 107 of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine group. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

One particular class of aromatic tertiary amines includes those which include at least two aromatic tertiary amine moieties as described in U.S. Pat. Nos. 4,720,432 and 5,061,569. Such compounds include those represented by structural formula (II).

(A)

In formula (II), $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring group, e.g., a naphthalene. When G is an aryl group, it is conveniently a phenylene, biphenylene, or naphthalene group.

A useful class of triarylamine groups satisfying structural formula (II) and containing two triarylamine groups is represented by structural formula (III):

(III)

In formula (III), $R^{11}$ and $R^{12}$ each independently represents a hydrogen atom, an aryl group, or an alkyl group or $R^{11}$ and $R^{12}$ together represent the atoms completing a cycloalkyl group; and $R^{13}$ and $R^{14}$ each independently represents an aryl group, which is in turn substituted with a diaryl substituted amino group, as indicated by structural formula (IV):

(IV)

In formula (IV), $R^{15}$ and $R^{16}$ are independently selected aryl groups. In one embodiment, at least one of $R^{15}$ and $R^{16}$ contains a polycyclic fused ring group, e.g., a naphthalene.

Another class of aromatic tertiary amine groups are the tetraaryldiamines. Tetraaryldiamines groups include two diarylamino groups, such as indicated by formula (IV), linked through an arylene group. Useful tetraaryldiamines include those represented by formula (V):

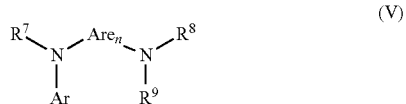

(V)

In formula (V), Are is selected from arylene group, such as a phenylene or anthracene group, n is an integer of from 1 to 4, and Ar, $R^7$, $R^8$, and $R^9$ are independently selected aryl groups.

In a typical embodiment, at least one of Ar, $R^7$, $R^8$, and $R^9$ is a polycyclic fused ring group, e.g., a naphthalene.

The various alkyl, alkylene, aryl, and arylene groups of the foregoing structural formulae (II), (III), (IV), (V), can each in turn be substituted. Typical substituents include alkyl groups, alkoxy groups, aryl groups, aryloxy groups, and halogen such as fluoride, chloride, and bromide. The various alkyl and alkylene groups typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene groups are usually phenyl and phenylene moieties.

The hole-transporting layer can be formed of a single or a mixture of aromatic tertiary amine compounds. Specifically, one may employ a triarylamine, such as a triarylamine satisfying the formula (III), in combination with a tetraaryldiamine, such as indicated by formula (V). When a triarylamine is employed in combination with a tetraaryldiamine, the latter is positioned as a layer interposed between the triarylamine and the electron injecting and transporting layer. Illustrative of useful aromatic tertiary amines are the following:

1,1 Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N+2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorine
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly (4-styrenesulfonate) also called PEDOT/PSS.

Light-Emitting Layer (LEL)

As more fully described in U.S. Pat. Nos. 4,769,292 and 5,935,721, the light-emitting layer (LEL) 109 of the OLED multilayer electroluminescent device includes a host and an emitter-dopant. The emitter dopant is chosen from luminescent material or fluorescent material where electroluminescence is produced as a result of electron-hole pair recombination in this region. The luminescent material can also phosphorescent or thermally delayed fluorescent. The host materials in the light-emitting layer can be an electron-transporting material, as defined below, a hole-transporting material, as defined above, or another material or combination of materials that support hole-electron recombination. The emitter-dopant is usually chosen from highly fluorescent dyes, but phosphorescent compounds, e.g., transition metal complexes as described in WO 98/55561, WO 00/18851, WO 00/57676, and WO 00/70655 are also useful. Emitter-dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Emitting molecules known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

Testing Process:

All OLEDs are fabricated on glass substrates pre-coated with 145 nm of ITO. The substrates are cleaned in standard Ultra T cleaner tool and baked at 120° C. for 2 hours. Next, the substrates are transferred into a vacuum chamber for sequential deposition of organic layers by thermal evaporation under a vacuum $10^{-6}$-$10^{-7}$ Torr. During deposition, layer thicknesses and doping concentrations are controlled using calibrated deposition sensors. Next, a bilayer of 0.5 nm LiF|125 nm Al was deposited to form a cathode. Devices are encapsulated using standard metal can with UV adhesive and desiccant. The device emission area is 0.1 cm². No light extraction enhancement was used.

After OLED processing, all samples are fully characterized using the standard test procedures. The standard test procedures include powering the devices using a Keithly 2400 power supply and measuring the electrical-optical characteristics using a PR-650 spectrophotometer. External quantum efficiencies (EQE) is calculated assuming that device emission is lambertian.

Aging Test

The samples are aged at a constant current density of 20 mA/cm2. The luminance is measured at the beginning of the test and followed during the aging period, as well as the voltage. Devices were run until 20% of the luminance was decayed (T80).

A linear regression model is obtained for the luminance Vs current curve. The regression model is used to calculate the required current for a specific luminance, for example 3000 or 1000 nits. Then the ratio of the aging current to the current to 3000 or 1000 nits is calculated:

(20 mA/cm²)/(calculated current)=Ratio (3000 nits) or Ratio (1000 nits)  (A)

Ratio^1.5=Multiplier where 1.5 is the acceleration factor determined by experiment  (B)

The measured T80 @ 20 mA/cm²=T80(measured)  (C)

Then T80 @ calculated current=T80(measured) *Multiplier

Then T70 at (3000 nits) or T70 @ (1000 nits)=2.5*T80 @ calculated current

EXAMPLES

The main materials used are shown in Table 1 below.

TABLE 1

Materials in the OLED devices.

| Materials | $T_g$ ° C. | $T_{sch}$ ° C. | $T_m$ ° C. | Td ° C. | $E_T$ eV | μhole cm²/Vsec | μelectron cm²/Vsec | HOMO | LUMO | Fluorescence nm | HPLC |
|---|---|---|---|---|---|---|---|---|---|---|---|
| Noncrystallizable Hole-transporting Host 1 | 126 | NONE | NONE | 400 | 2.8 | 3 × 10⁻⁴ | | | | 367 | 99.99% |
| Noncrystallizable Hole-transporting Host 2 | 97.5 | | | 200 | 2.64 | | | | | 472 | 99.65% |
| NPD/NPB | 98.6 | 175 | 279 | 300 | 2.30 | 8.8 × 10⁻⁴ | | 5.4 | 2.1 | 450 | |
| TCTA | 151 | | 181 | | 2.90 | | | 5.7 | 2.7 | | |
| TPBi | 124 | | | | 2.70 | | | 6.2 | 2.7 | | |
| mCBP | | 191 | 271 | 3.15 | 2.80 | | | 6.0 | 2.4 | | |
| | | | | | | | | 9.5 | 5.5 | | |

Proprietary Materials

Phosphorescent Yellow X — Proprietary Material provided by device testing service company Electron Transport Host/HBL Y — Proprietary material provided by device testing service company

NPB

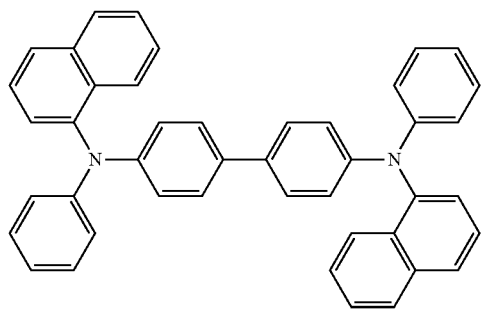

mCBP

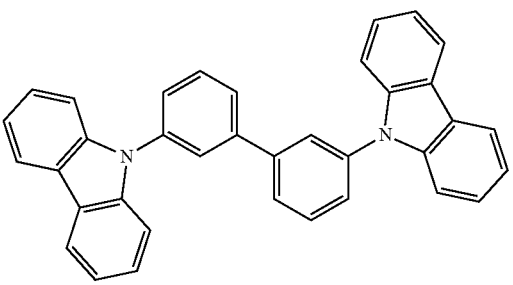

TPBi

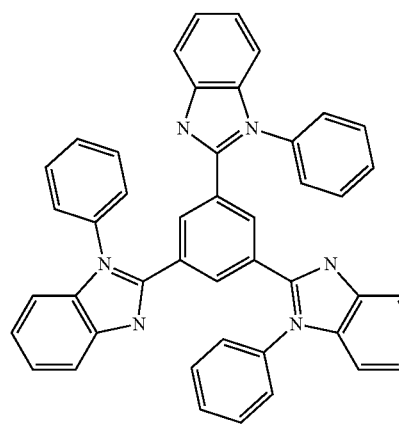

HATCN

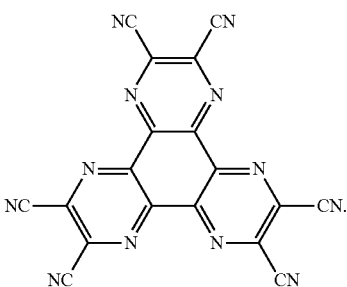

TCTA

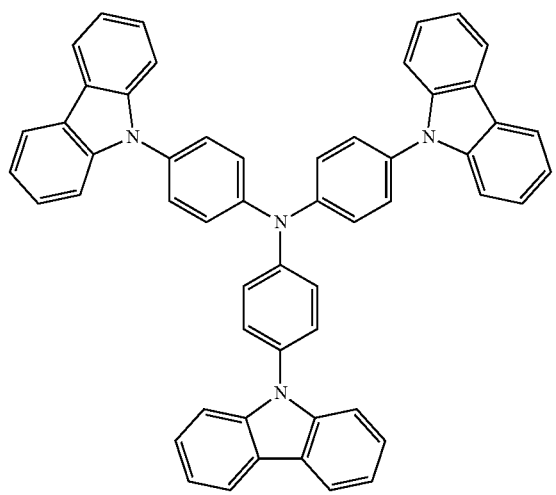

Comparative Example C1: Conventional Host mCBP

A set of devices were made according to the procedure described above in the Test Procedures, using mCBP, a hole-transporting host. The properties of mCBP are listed in Table 1. The general structure of the devices is shown in Table 2. The concentration of proprietary yellow phosphorescent emitter provided by the device fabricating service company OLEDworks LLC., was varied at 4, 8, 18, 36 wt. %. The hole-blocking layer used is also a proprietary electron-transporting material provided by the device fabricating service company OLEDworks LLC. The fabricated devices shown in Table 3 were tested according to the procedure described above. The results are shown on Table 3.

TABLE 2

| OLED Device Arrangement of Comparative Example C1 and Examples 1 and 2. | | | | | | | | |
|---|---|---|---|---|---|---|---|---|
| | HIL | HTL | EBL | EML | HBL | ETL | EIL | Cathode |
| ITO | HATCN | NPB | TCTA or NONE | Neat mCBP V's Neat Noncrystallizable hole transport host Emitter Concentration: 4%, 8%, 16%, 32% | HBL | TBPi | EIL | LiF | Al |

TABLE 3

Lifetime Expectancy of Comparative Example C1

| Device | Host | % Emitter | EBL | Voltage V | Lum Yield, Cd/A | Lm/W | % EQE | $T_{80}$, hr @ 20 mA/cm$^2$ | Luminance @ 20 mA/cm2 | $T_{80}$, hr @ 1000 cd/m$^2$ |
|---|---|---|---|---|---|---|---|---|---|---|
| A | m-CBP | 4% | None | 6.8 | 23.3 | 10.8 | 6.4 | 32 | 3550 | 260 |
| B | m-CBP | 8% | None | 4.8 | 51.2 | 35.7 | 13.8 | 14 | 6830 | 515 |
| E | m-CBP | 16% | None | 4.0 | 42.3 | 33.6 | 11.5 | 4 | 7730 | 33 |
| F | m-CBP | 32% | None | 3.8 | 23.9 | 19.8 | 6.6 | 2 | 4330 | 19 |
| C | m-CBP | 8% | TCTA | 5.7 | 51.7 | 28.6 | 13.9 | 17 | 4260 | 642 |
| D | m-CBP | 16% | TCTA | 4.6 | 47.3 | 32.5 | 12.9 | 4 | 4660 | 61 |

Example 1: High-entropy Non-Crystallizable Hole-Transporting Host

Another set of devices were fabricated using the design, materials and procedure of Comparative Example C1, except that the high-entropy non-crystallizable hole-transporting glass mixture host 1 (Glass Mixture 22). The results are shown in Table 4 below. The T80 lifetimes at 1000 cd/m$^2$ for Comparative Example C1 and Example 1 are plotted in FIG. 2.

Figure 2:
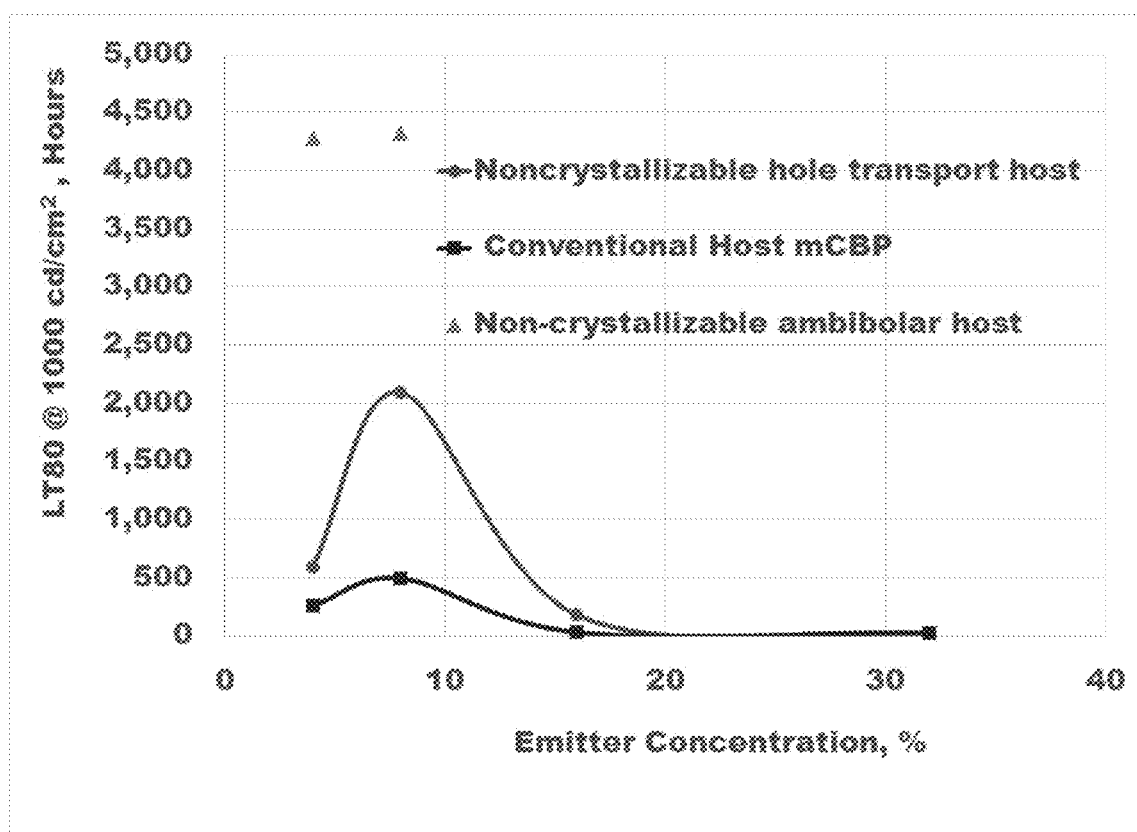
FIG. 2 shows comparison of T80 life for the conventional mCBP host, the non-crystallizable hole-transporting host 1, and the inventive non-crystallizable ambipolar host plotted against emitter concentration.

In FIG. 2, the life of the device containing the non-crystallizable glass mixture (Glass mixture 22) was approximately 2,000 hours, whereas the life of the device containing the conventional host, mCBP, was approximately 500 hours. The life of the device containing the non-crystallizable glass mixture was about four times greater than that of the device containing the conventional host. The increase in life is attributed to the non-crystallizable glass mixture.

parative Example. This increase in T80 lifetime is attributed to the high-entropy non-crystallizable hole-transporting glass mixture host. The increase in lifetime is further attributed to the suppression of emitter aggregation by the high-entropy host in Example 1.

Figure 3:
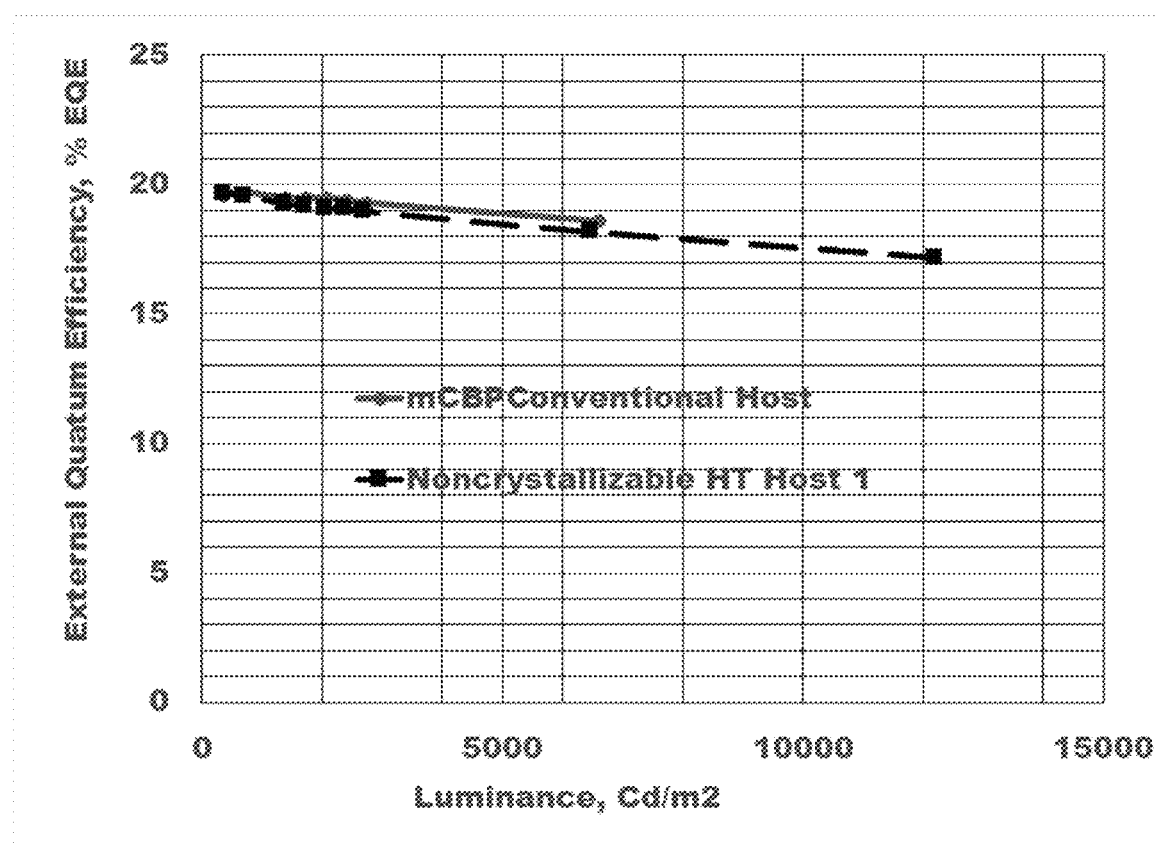
FIG. 3 is a graph of external quantum efficiency Vs luminance for the non-crystallizable hole-transporting host 1 and the conventional mCBP host.

In FIG. 3, the graph showed the External Quantum Efficiency (% EQE) versus the Luminance of the conventional host, mCBP of Comparative Example C1, and Example 1 a device having non-crystallizable glass mixture (Glass Mixture 22). For both devices, the % EQE decreased at a similar rate as a function of an increase in luminance.

Example 2: High-Entropy Non-Crystallizable Ambipolar Host

Three devices were fabricated using the procedure of inventive example 1 at 4 and 8% emitter and the host replaced by the high-entropy ambipolar isomeric asymmet-

TABLE 4

Lifetime Expectancy of High-entropy Non-Crystallizable Hole-Transporting Host (Example 1)

| Device | Host | % Emitter | EBL | Voltage V | Lum Yield, Cd/A | Lm/W | % EQE | $T_{80}$, hr @ 20 mA/cm$^2$ | Luminance 020 m A/cm2 | $T_{80}$, hr @ 1000 cd/cm$^2$ |
|---|---|---|---|---|---|---|---|---|---|---|
| G | Non-Crystallizable hole Transport Host | 4% | None | 6.5 | 23.4 | 11.3 | 6.2 | 68 | 3,770 | 587 |
| H | Non-Crystallizable hole Transport Host | 8% | None | 5.1 | 50.7 | 31.1 | 13.5 | 54 | 6,080 | 2,169 |
| K | Non-Crystallizable hole Transport Host | 16% | None | 4.0 | 46.9 | 36.6 | 12.6 | 6 | 8,690 | 177 |
| L | Non-Crystallizable hole Transport Host | 32% | None | 3.7 | 25.0 | 21.2 | 6.8 | 2 | 4,690 | 22 |
| I | Non-Crystallizable hole Transport Host | 8% | TCTA | 5.9 | 46.9 | 36.6 | 12.6 | 61 | 6,290 | 2,030 |
| J | Non-Crystallizable hole Transport Host | 16% | TCTA | 4.6 | 4.7 | 25.0 | 21.2 | 13.3 | 7 | 9,220 | 215 |

The T80 lifetime is longer for the high-entropy non-crystallizable hole-transporting glass mixture host, Example 1, lasting up to 2,169 hours, as opposed to the Comparative Example lasting 642 hours. Example 1 had a T80 lifetime that was increased by 600% when compared to the Comric glass mixture 4. The results are shown in Table 5 and the T80 1000 cd/m$^2$ life data plotted as shown in FIG. 2. The high-entropy ambipolar host has a 1600% lifetime increase when compared to the mCBP conventional host, Comparative Example C1, and 1000% lifetime increase when compared to the high-entropy non-crystallizable hole-transporting host of Example 1. The balanced transport of electrons and holes broadens the recombination zone. But also the high-entropy ambipolar host suppresses the emitter aggregation and reuslt in lower chemical degradation, thus much longer lifetime.

is shown in Table 6. A mixed-host system was used consisting of 25 wt. % of hole-transporting (host glass mixture 22) and 59 wt. % of the proprietary electron-transporting host provided by the device testing service company, OLEDWorks LLC. The concentration of the emitter was set at 16 wt. %. One of the devices used the conventional mCBP

TABLE 5

Lifetime Expectancy of High-entropy Non-Crystallizable Hole-Transporting Host (Example 2)

| Device | Host | % Emitter | EBL | Voltage V | Lum Yield Cd/A | Efficacy Lm/W | % EQE | LT80, hr @ 20 mA/cm$^2$ | LT95, hr @ 1000 cd/m$^2$ | LT80, hr @ 1000 cd/m$^2$ |
|---|---|---|---|---|---|---|---|---|---|---|
| G | Non-Crystallizable Ambipolar Host | 4% | TCTA | 5.0 | 70.7 | 44.1 | 16.9 | 18 | 122 | 1,229 |
| H | Non-Crystallizable Ambipolar Host | 4% | None | 4.7 | 31.7 | 21.0 | 8.4 | 311 | 525 | 4.276 |
| I | Non-Crystallizable Ambipolar Host | 8% | None | 4.4 | 46.7 | 33.6 | 12.4 | 138 | 307 | 4,322 |

Figure 4:
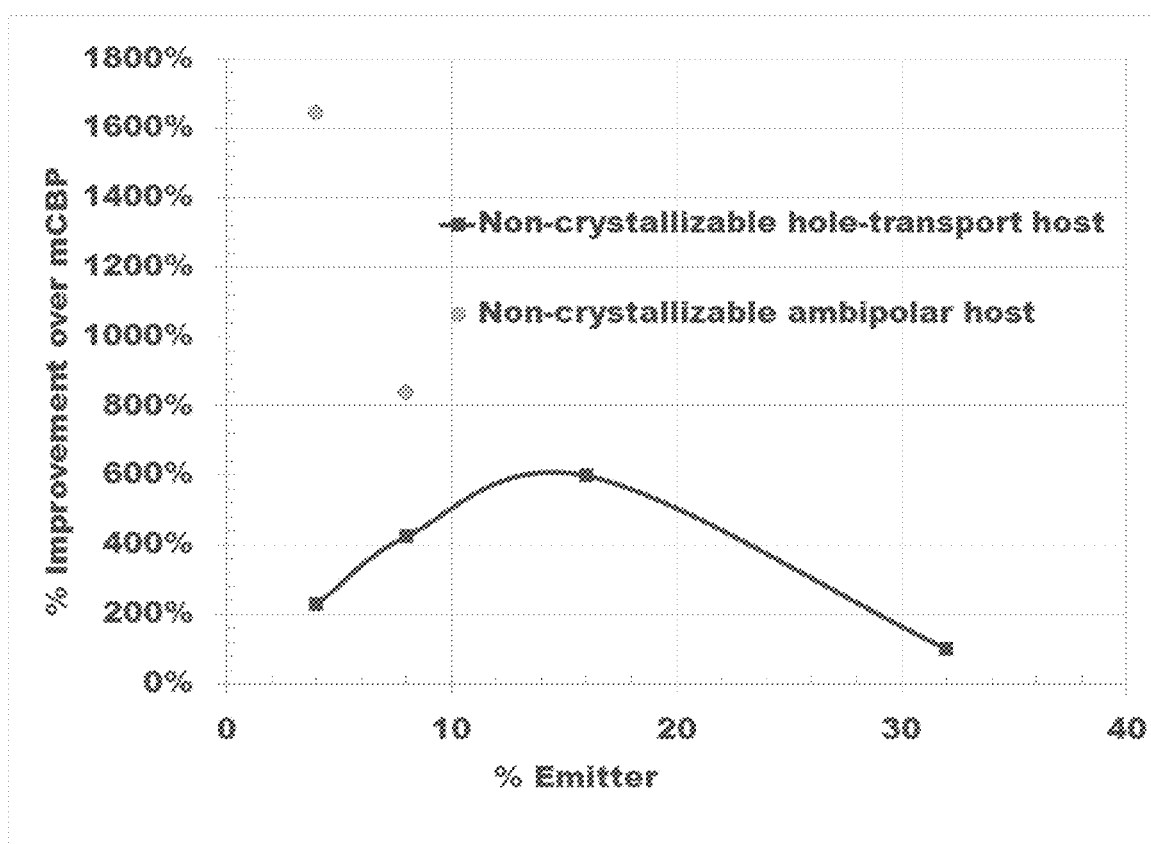
FIG. 4 is a graph of the relative increase in T80 life for the non-crystallizable hole-transporting host 1, and the non-crystallizable ambipolar host against the conventional mCBP host.

In FIG. 4, the percent improvement over mCBP versus the percent of emitter (emitter-dopant) is plotted. The high-entropy non-crystallizable hole-transporting molecular glass mixture (Glass Mixture 22) performed 600% better than mCBP at 16% emitter concentration. The Non-crystallizable ambipolar glass mixture (Glass Mixture 4) perform over 1600% better than mCBP at 4% emitter concentration, and over 800% at 8% emitter concentration.

Inventive Example 3: Mixed Host

A set of devices were fabricated according to the procedure used for the other devices. The structure of the devices hole-transporting host; the other used the high-entropy non-crystallizable hole-transporting molecular glass mixture of this invention. Both devices include a TCTA exciton/electron blocking layer.

The results for the two devices are shown in Table 7. Both devices exhibited high external quantum efficiency of 19.5%. However, the lifetime for the Device I, which contained the high-entropy non-crystallizable hole-transporting molecular glass mixture (Glass Mixture 22) exhibited significantly longer lifetime of 9,398 hr, as compared to 3,650 hr of the Comparative Example, Device D as shown in Table 7.

TABLE 6

Structure of Device for Example 3

| anode | HIL | HTL | EBL1 | EBL2 | EML | HBL | ETL | EIL | Cathode |
|---|---|---|---|---|---|---|---|---|---|
| ITO | HATCN | NPB | TCTA | Non-crystallizable hole transport | HT-Host (25%) ET-Host (59%) Phosphorescent Yellow Emitter Concentration set @ 16% | HBL | TBPi | EIL | LiF Al |

TABLE 7

Lifetime Expectancy of High-entropy Non-Crystallizable Hole-Transporting Host (Example 3)

| Device | Host | % ET-Co-Host | % HT-Host | % Emitter | ETL | Voltage, V | Lum Yield, Cd/A | Efficacy Lm/W | % EQE | T80, hr @ 20mA/cm2 | T80, hr @ 1000 cd/m$^2$ |
|---|---|---|---|---|---|---|---|---|---|---|---|
| D | m-CBP | 59 | 25 | 16 | TCTA | 5.5 | 68.9 | 39.0 | 19.5 | 172 | 3,650 |
| I | Non-crystallizable hole transport host | 59 | 25 | 16 | TCTA | 5.1 | 68.1 | 41.7 | 192 | 156 | 9,398 |

Inventive Example 4: Mixed Host

A set of devices were fabricated according to the procedure used for the other devices. The structure of the devices is shown in Table 8. A mixed-host system was used consisting of 25 wt. % of a hole-transporting host and 60 wt. % of the proprietary electron-transporting host provided by the device testing service company, OLEDWorks LLC. The concentration of the emitter was set at 15 wt. %. Three devices used the high-entropy non-crystallizable hole-transporting molecular glass mixture (Glass Mixture 22) with TCTA, the high-entropy non-crystallizable hole-transporting molecular glass mixture, or a combination of TCTA and the high-entropy non-crystallizable hole-transporting molecular glass mixture as exciton/electron blocking layers (EBL). One of the devices used 60% of a proprietary commercially available electron-transporting host (no hole-transporting host) and TCTA as EBL.

The results for the four devices are shown in Table 9. All four devices similarly exhibited high external quantum efficiency (18 to 19.5%). However, the lifetime for the devices containing even just 25% of the non-crystallizable hole-transporting molecular glass mixture exhibited significantly longer lifetime.

Figure 5:
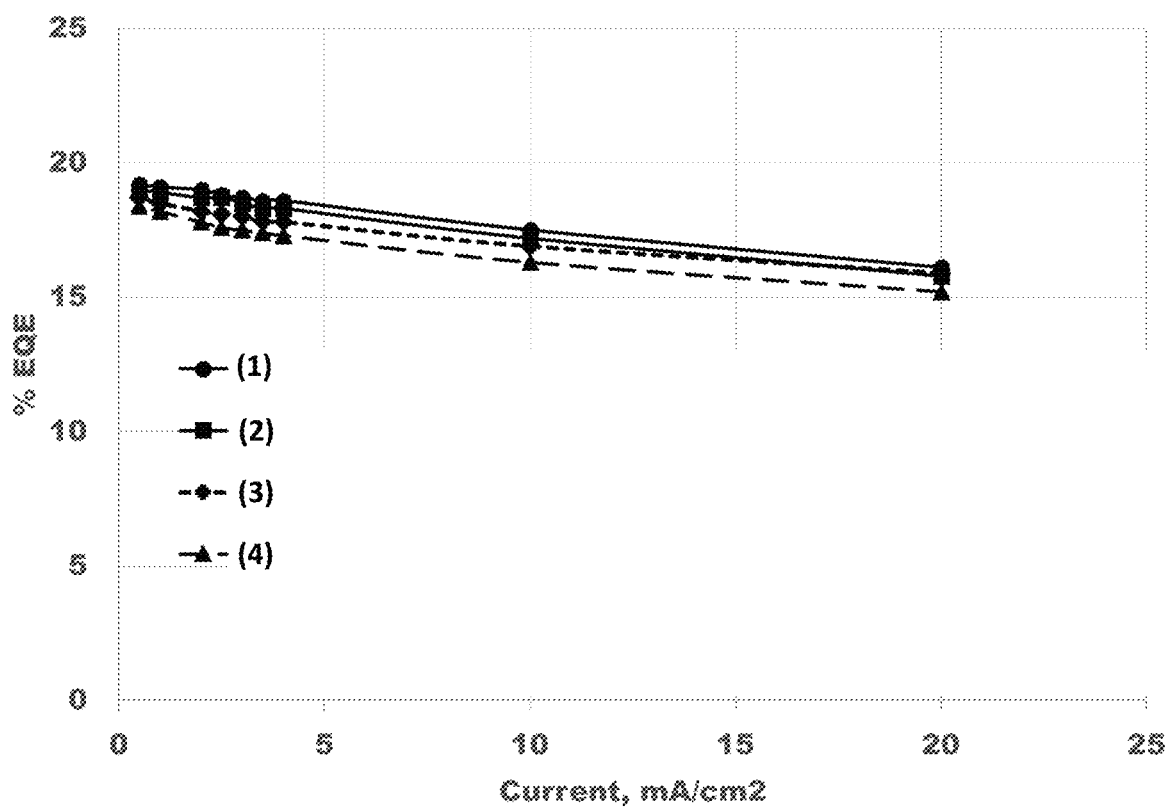
FIG. 5 shows plots of external quantum efficiency Vs current for the non-crystallizable hole-transporting host 1 and the conventional ET-Host as co-hosts with various electron/exciton blocking layers (EBL).

The external quantum efficiency (% EQE) versus current for four devices was plotted in FIG. 5. The four devices include (1) a convention ET-Host at 60%/Non-crystallizable HT as EBL; (2) HT-Host at 25%/Non-crystallizable HT as EBL; (3) ET-Host at 25%/Non-crystallizable HT and TCTA as EBL; and (4) HT-Host at 25%/TCTA as EBL. The ET-Host (electron transporting host) was a proprietary commercially available host. The HT-Host (hole transporting host) was glass mixture 22, as described in Example 1. The rate of decrease in % EQE as a function of increase in current was similar for the four devices.

Figure 6:
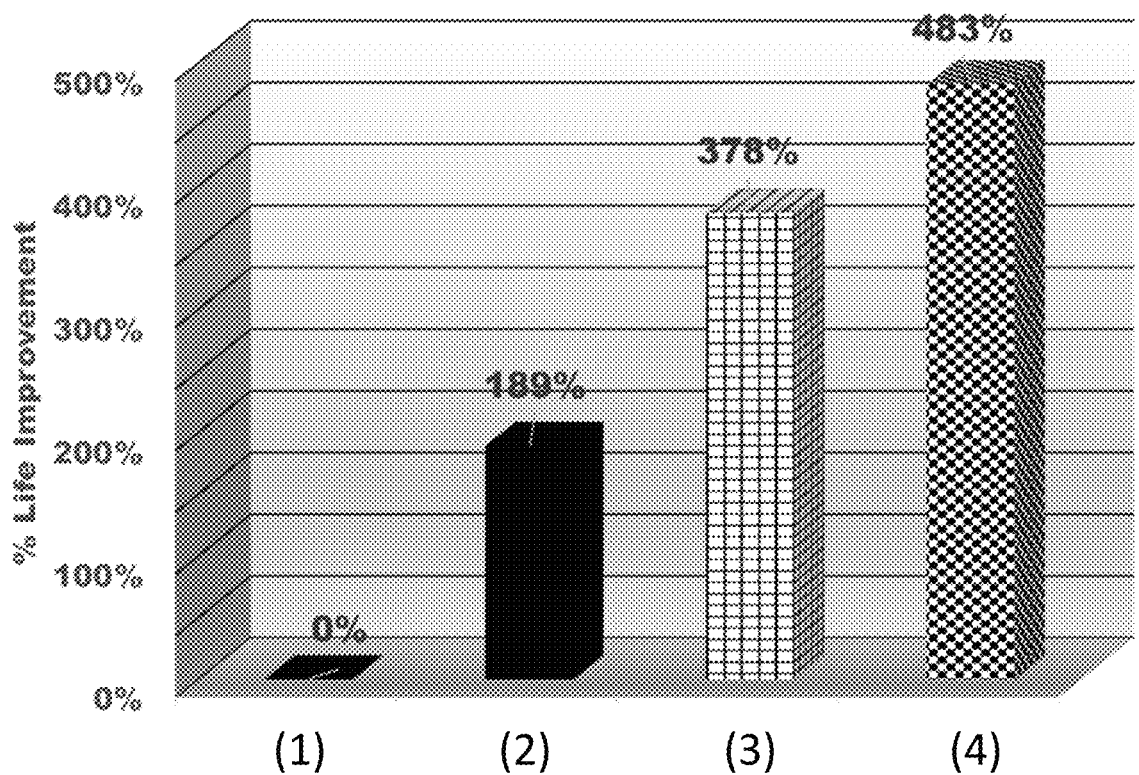
FIG. 6 shows the life improvement of the devices incorporating 25% of the non-crystallizable hole-transporting host 1 as co-host over the device with only the control electron-transporting host.

In FIG. 6, the improvements in lifetime for the four devices—(1), (2), (3), and (4)—described in the preceding paragraph are shown. The device containing the HT-Host and the electron blocking layer (EBL) having both TCT and the non-crystallizable glass mixture had a 483% improvement over the device containing 60% of the proprietary electron transporting host and the non-crystallizable glass mixture as the EBL. The increase of life improvement can be attributed to the non-crystallizable glass mixture in the light emitting layer and the synergistic effect when combined with an EBL having both TCTA and non-crystallizable glass mixture.

The invention claimed is:

1. An OLED multilayer electroluminescent device comprising:
    a cathode, an anode, a light-emitting layer (LEL) disposed there between, and
    charge-transporting layers disposed between (A) the cathode and the light-emitting layer,
        (B) the anode and the light-emitting layer, or (C) both (A) and (B);
    wherein:
        the light-emitting layer (LEL) comprises a host material and an emitter-dopant;
        the host material comprises a high-entropy non-crystallizable molecular glass mixture, the high-entropy non-crystallizable molecular glass mixture comprising three or more than three components, wherein the components are structural isomers and having hole-transporting capabilities, electron-transporting capabilities, or ambipolar capabilities, wherein

TABLE 8

| Structure of Device for Example 4 | | | | | | | | | |
|---|---|---|---|---|---|---|---|---|---|
| anode | HIL | HTL | EBL1 | EBL2 | EML | HBL | ETL | EIL | Cathode |
| ITO | HATCN | NPB | TCTA | Non-crystallizable hole transport | Emitter Concentration @ 15% HT Host (25%)/ ET Host(60%) or ET Host (75%) | HBL | TBPi | EIL LiF | Al |

TABLE 9

| Lifetime Expectancy of High-entropy Non-Crystallizable Hole-Transporting Host (Example 4) | | | | | | | | | | |
|---|---|---|---|---|---|---|---|---|---|---|
| Device | EBL1 | EBL2 | ET-Host | HT-Host | % Emitter | Voltage | Lum Yield cd/amp | Lumen Yield Lm/watt | % EQE | LT80 @ 20 mA/ cm2 | LT80 @ 1000 cd/ m2 |
| A | None | Non-crystallizable Hole Transport | 85% | 0% | 15% | 4.3 | 61.6 | 44.7 | 18.8 | 62 | 1742 |
| C | None | Non-crystallizable Hole Transport | 60% | 25% | 15% | 4.3 | 60.8 | 44.3 | 18.4 | 70 | 3459 |
| E | TCTA | Non-crystallizable Hole Transport | 60% | 25% | 15% | 3.7 | 58.8 | 49.3 | 17.5 | 140 | 6170 |
| F | TCTA | Non-crystallizable Hole Transport | 60% | 25% | 15% | 3.9 | 60.5 | 48.7 | 18 | 140 | 7227 | the ambipolar capabilities comprises hole-transporting capabilities and electron-transporting capabilities.

2. The OLED multilayer electroluminescent device according to claim 1, wherein the host material is chosen from a neat host or a mixed-host having more than one host-type.

3. The OLED multilayer electroluminescent device according to claim 1, wherein the high-entropy non-crystallizable molecular glass mixture is selected from the group consisting of: glass mixture 4, glass mixture 6, glass mixture 7, glass mixture 8, glass mixture 9, glass mixture 22, glass mixture 32, glass mixture 50, glass mixture 60, glass mixture 65, glass mixture 70, glass mixture 75, glass mixture 80, glass mixture 85, glass mixture 90, glass mixture 95, glass mixture 100, glass mixture 105, glass mixture 110, glass mixture 115, glass mixture 120, glass mixture 121, glass mixture 122, glass mixture 123, glass mixture 124, glass mixture 125, glass mixture 126, glass mixture 127, glass mixture 128, glass mixture 129, glass mixture 130, glass mixture 131, glass mixture 132, glass mixture 133, glass mixture 134, and glass mixture 135;

wherein glass mixtures 4 comprises the following structures:

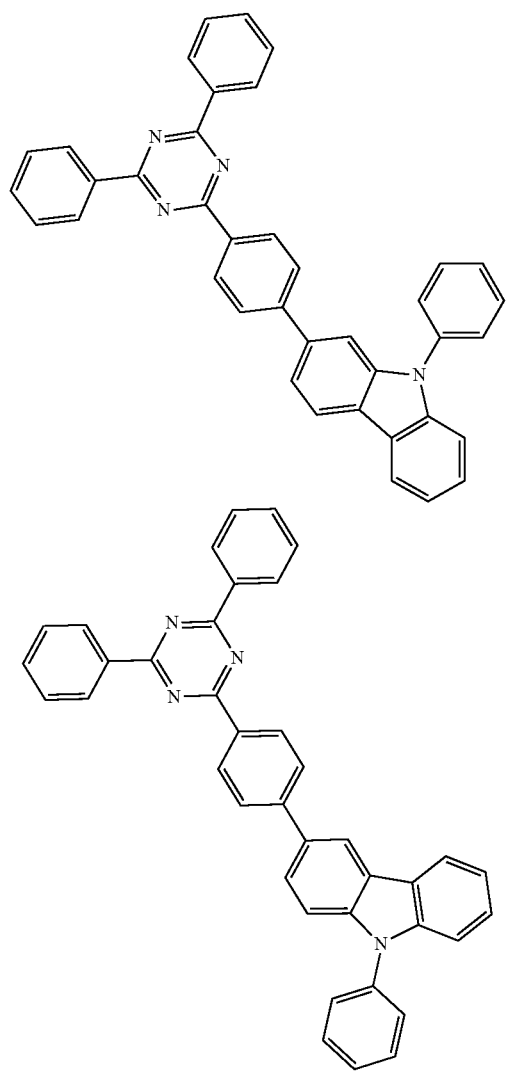

-continued

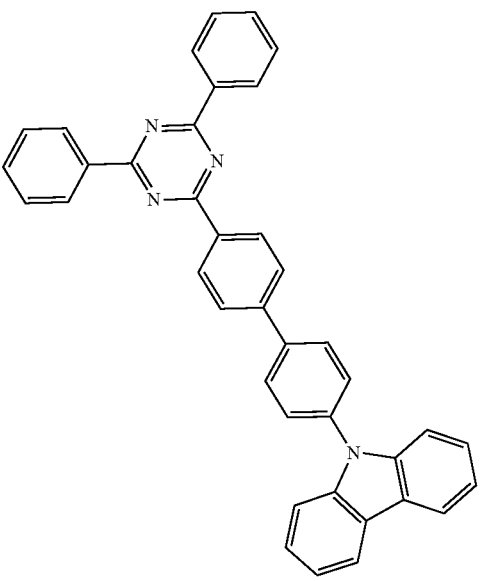

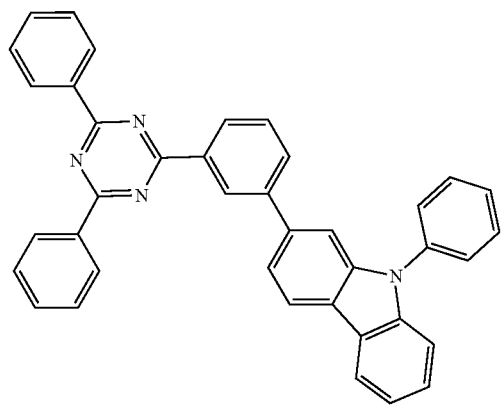

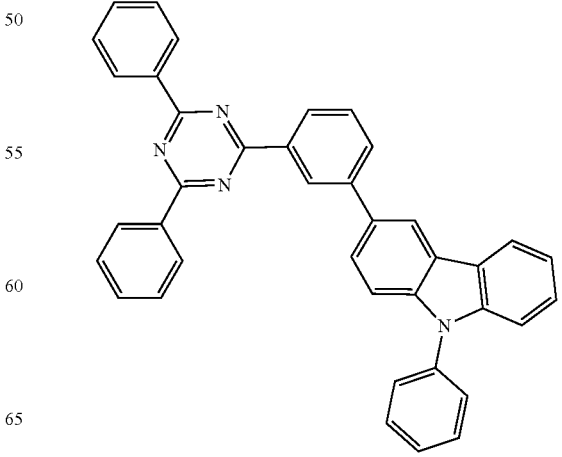

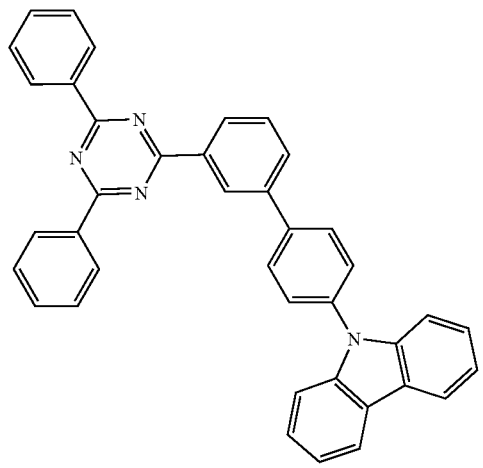
Glass mixture 6 comprises the following structures:
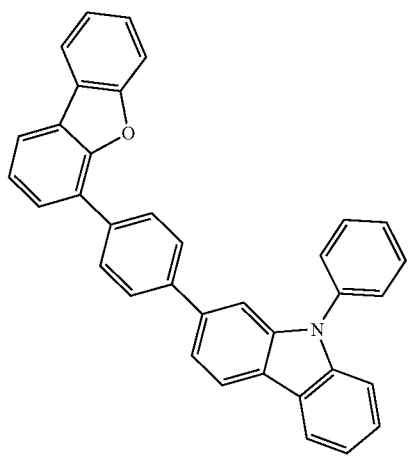
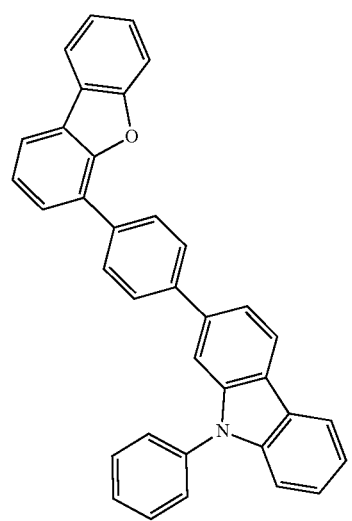
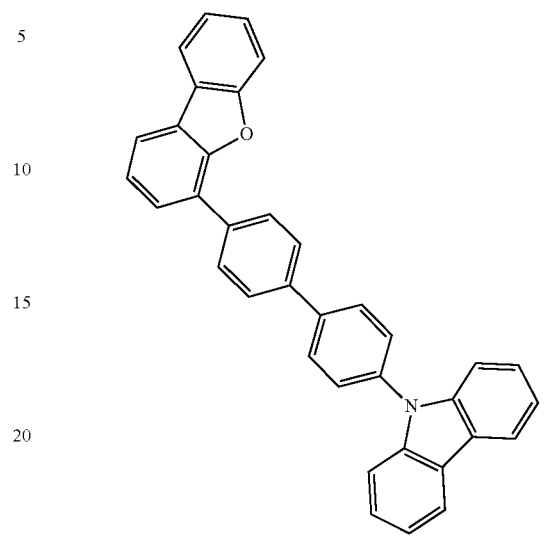
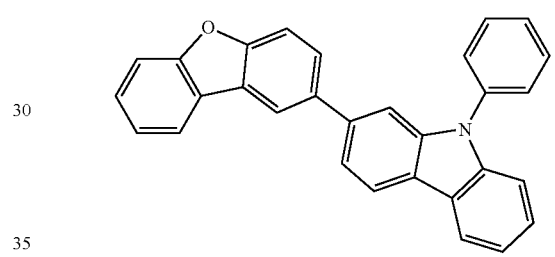
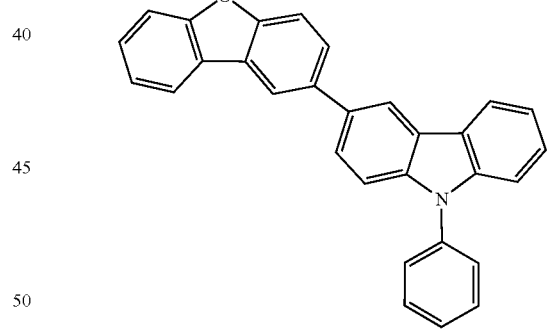
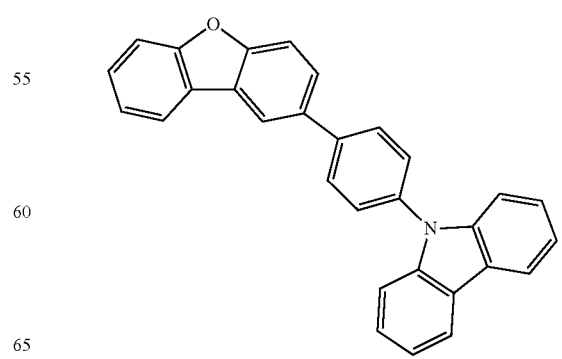

Glass mixture 7 comprises the following structures:
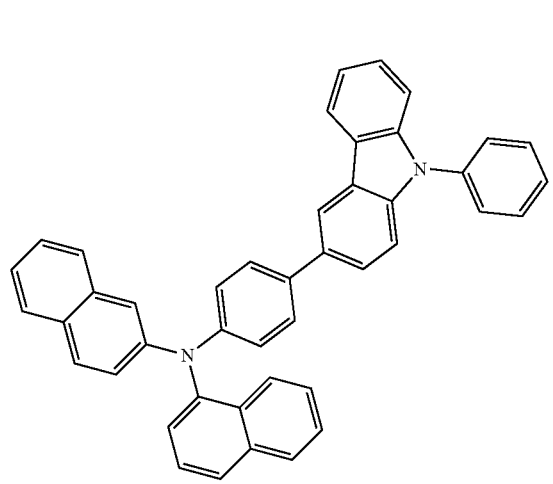
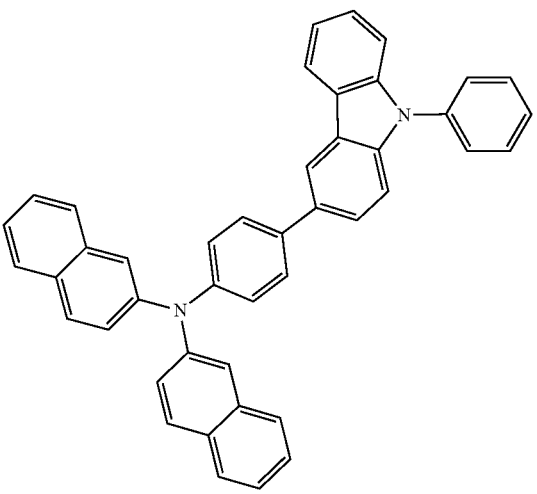
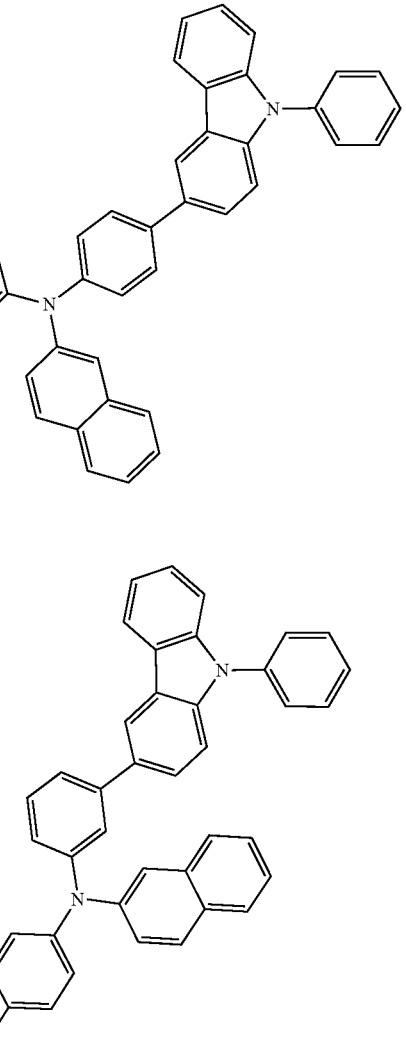
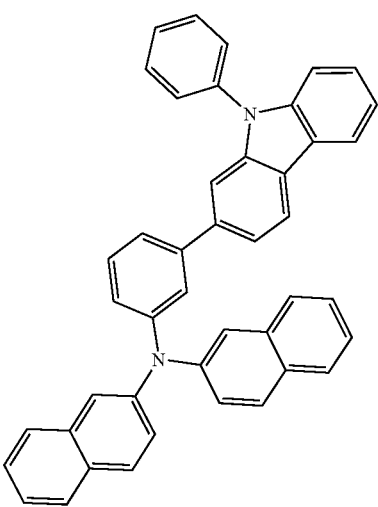

Glass mixture 8 comprises the following structures:
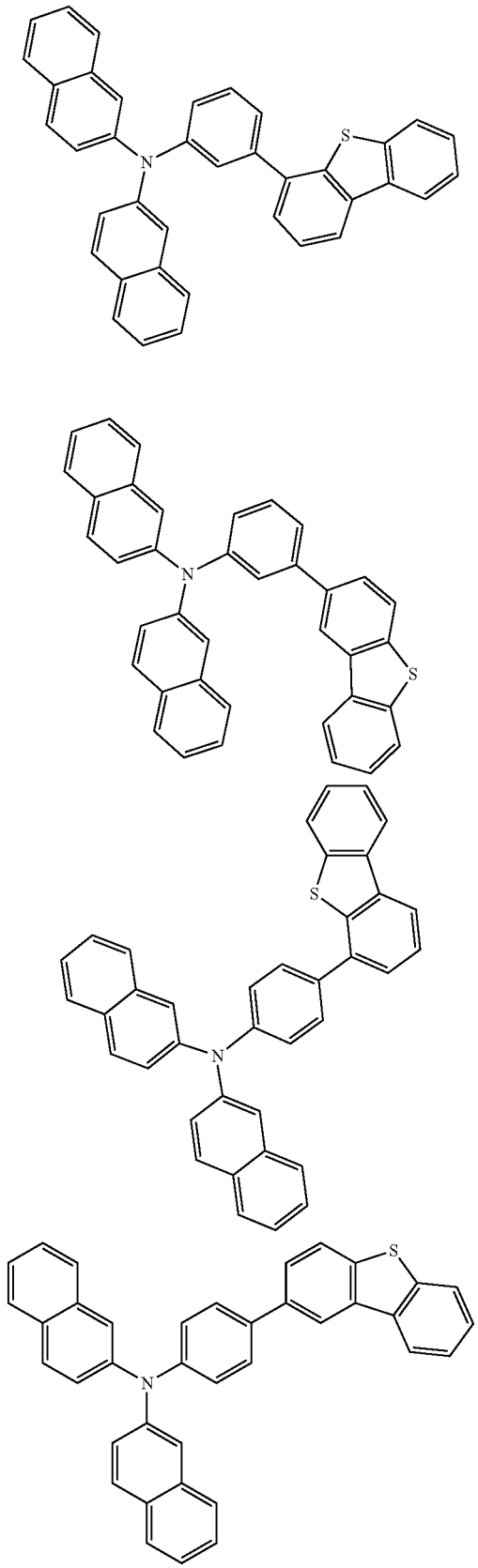
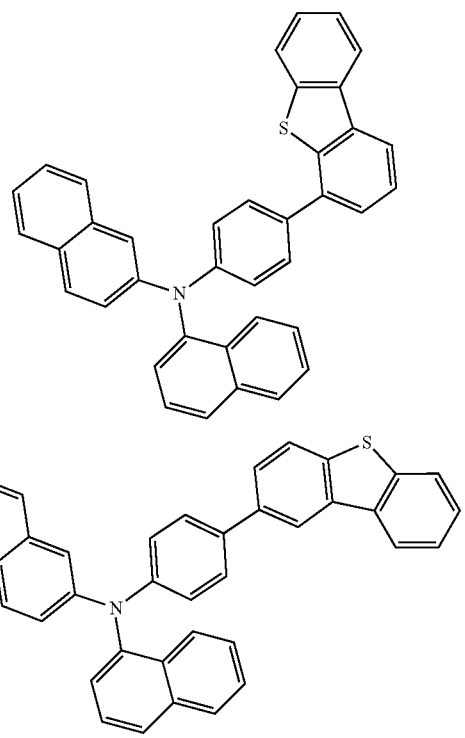
Glass mixture 9 comprises the following structures:
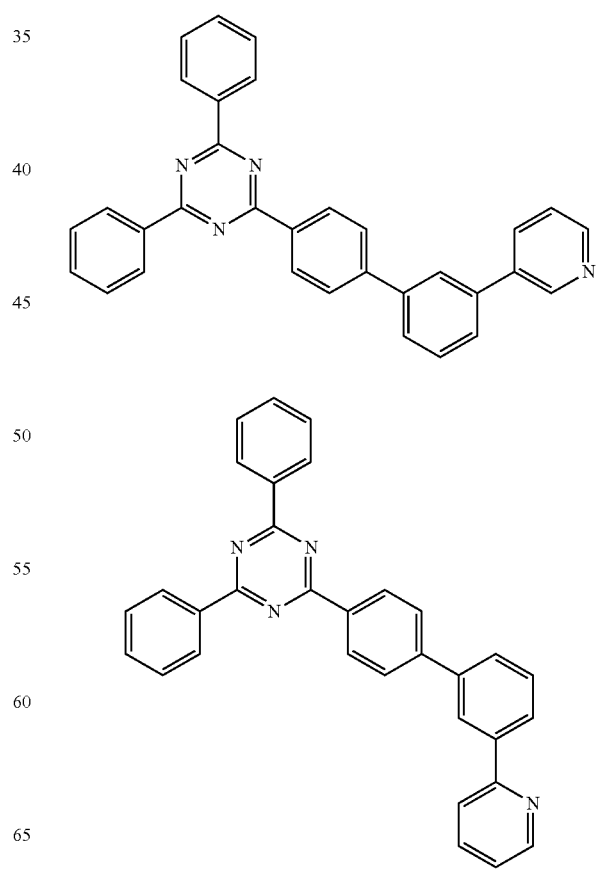

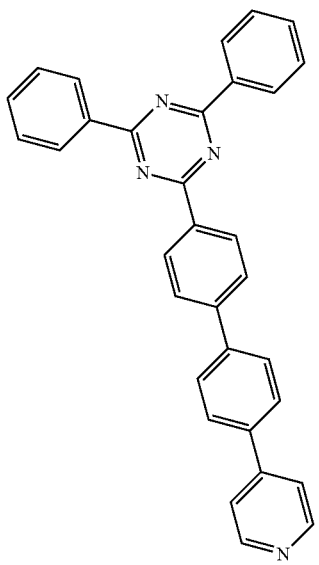
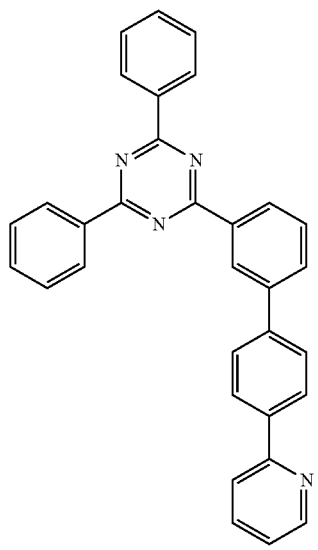
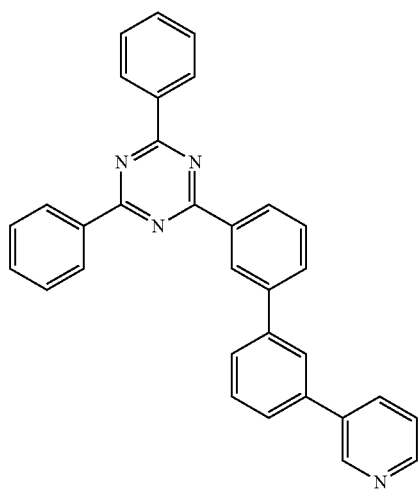
Glass mixture 22 comprises the following structures:
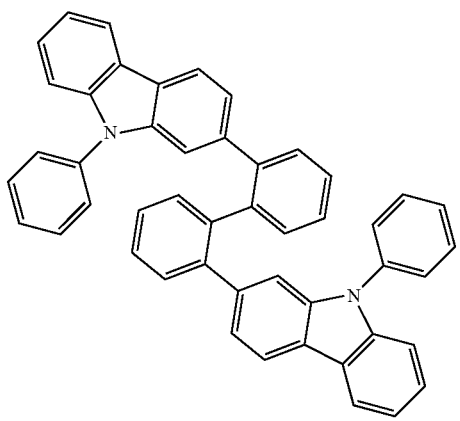
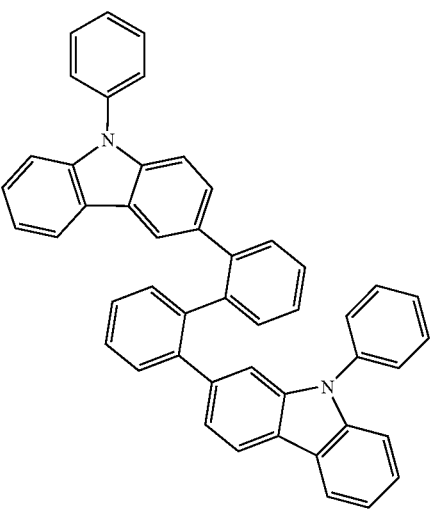

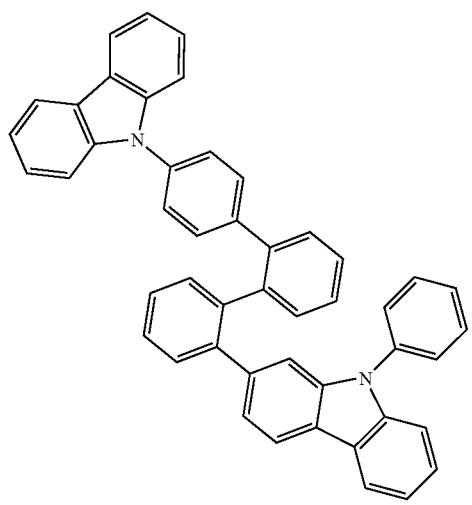
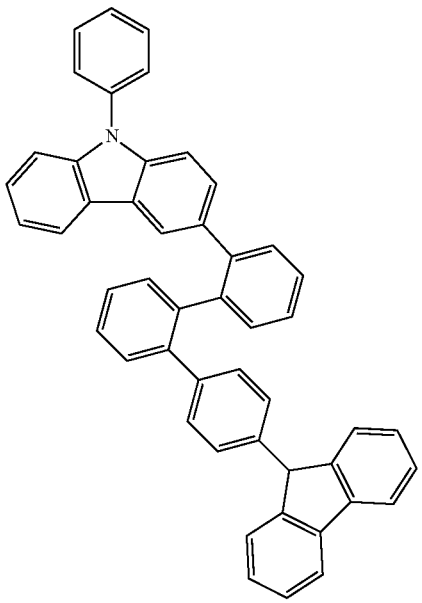
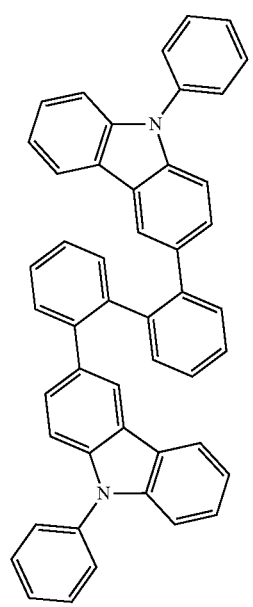
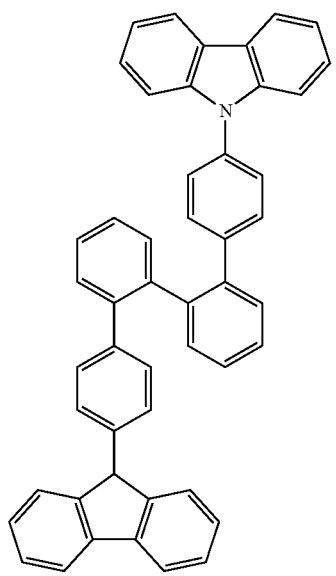

Glass mixture 32 comprises the following structures:
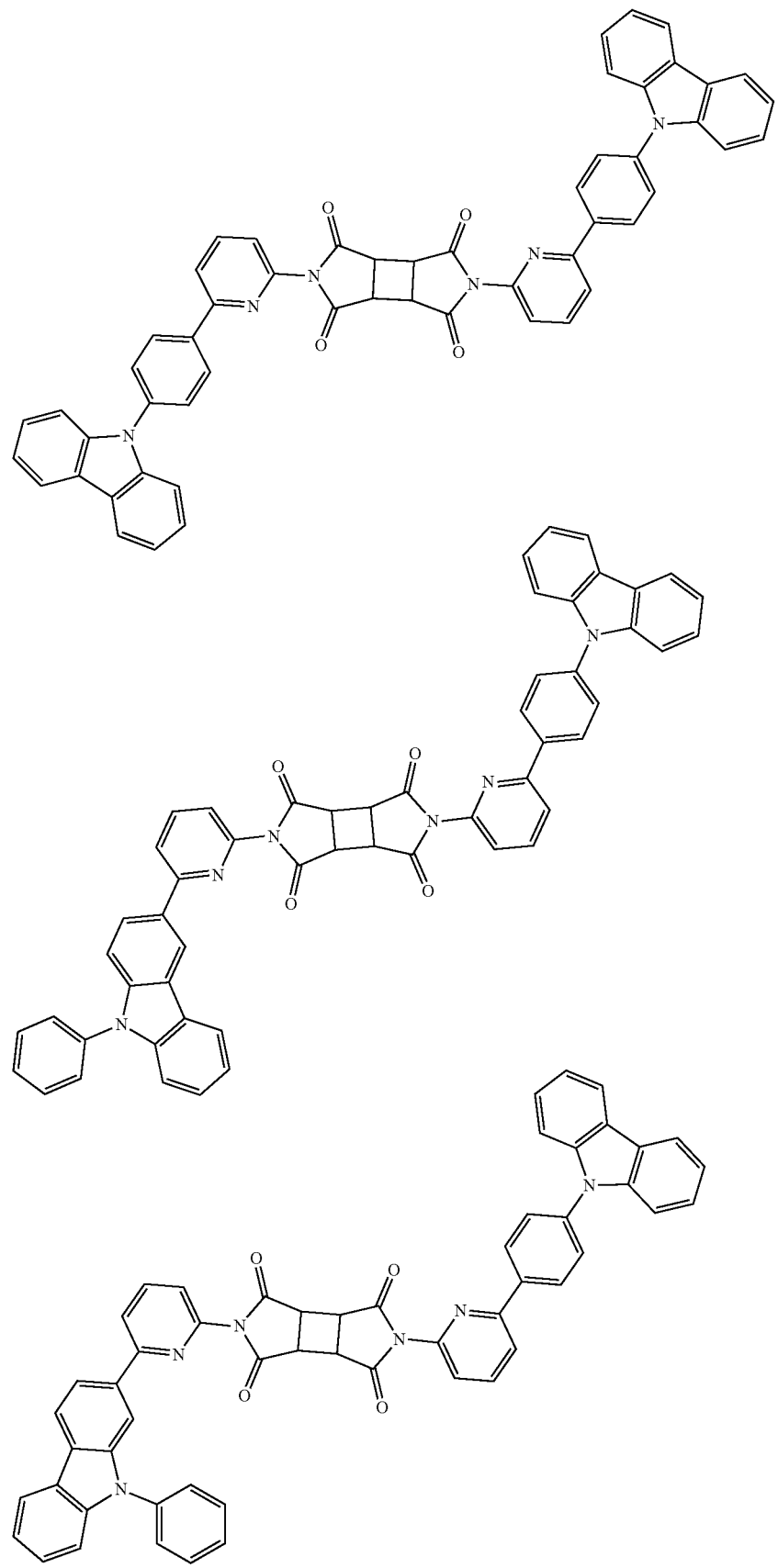

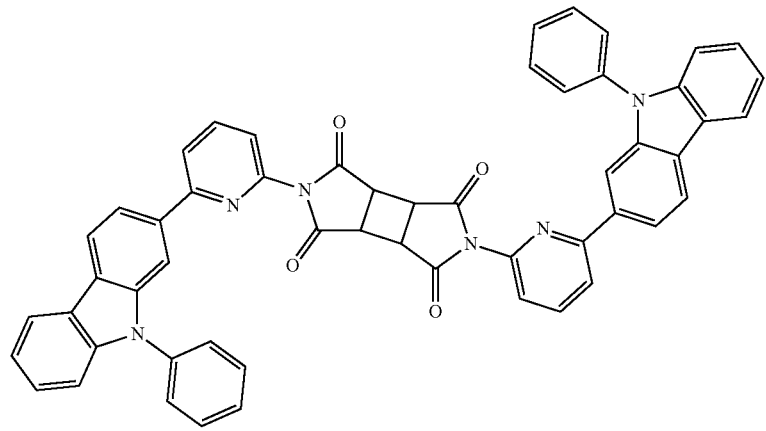
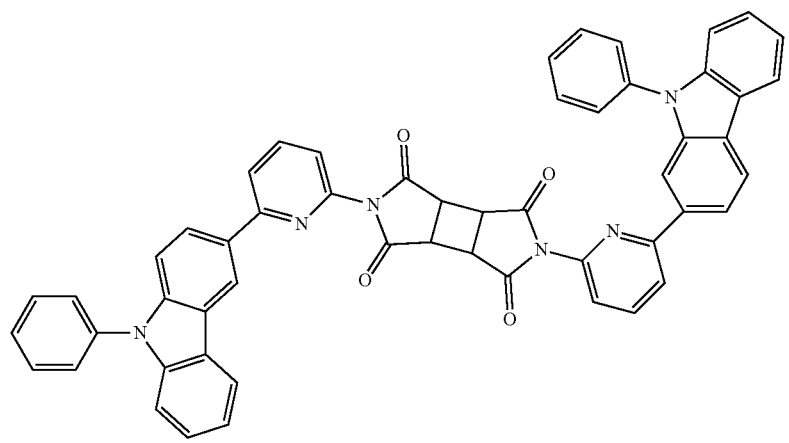
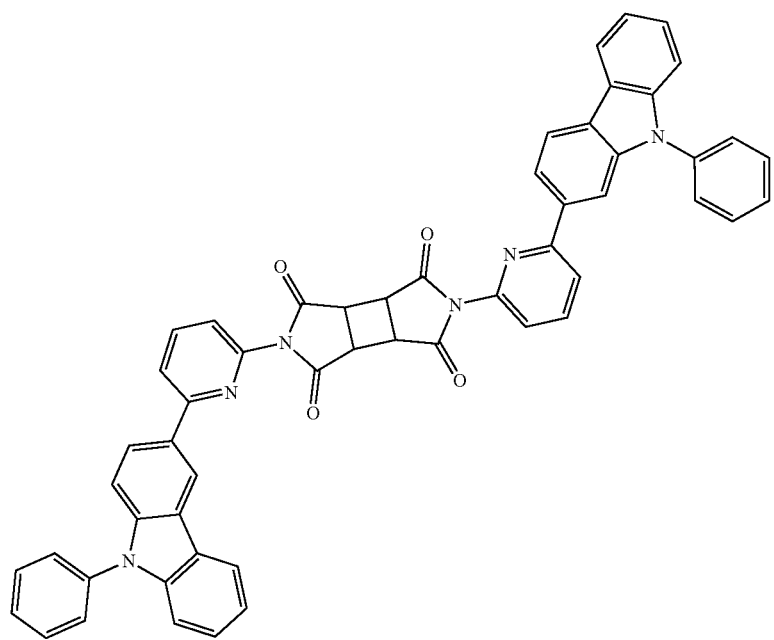

Glass Mixture 50 comprises the following structures:
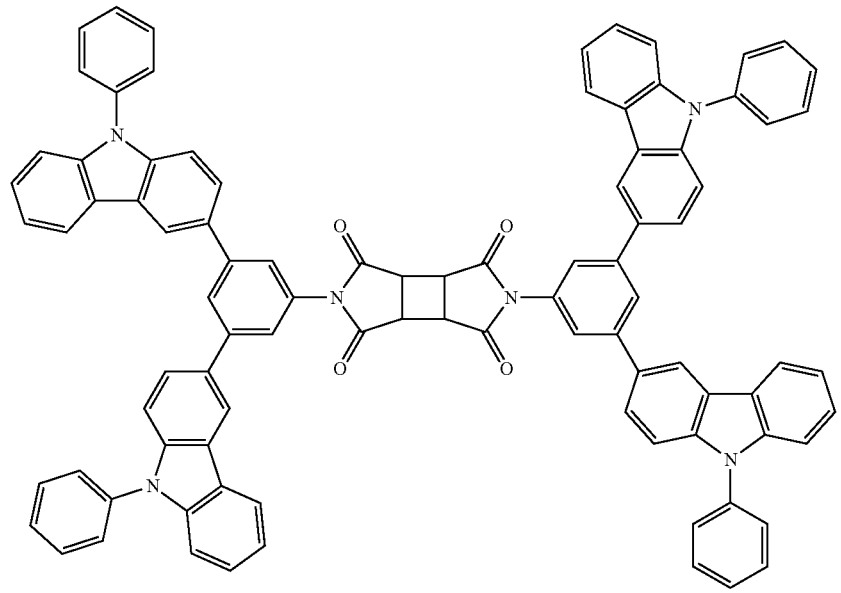
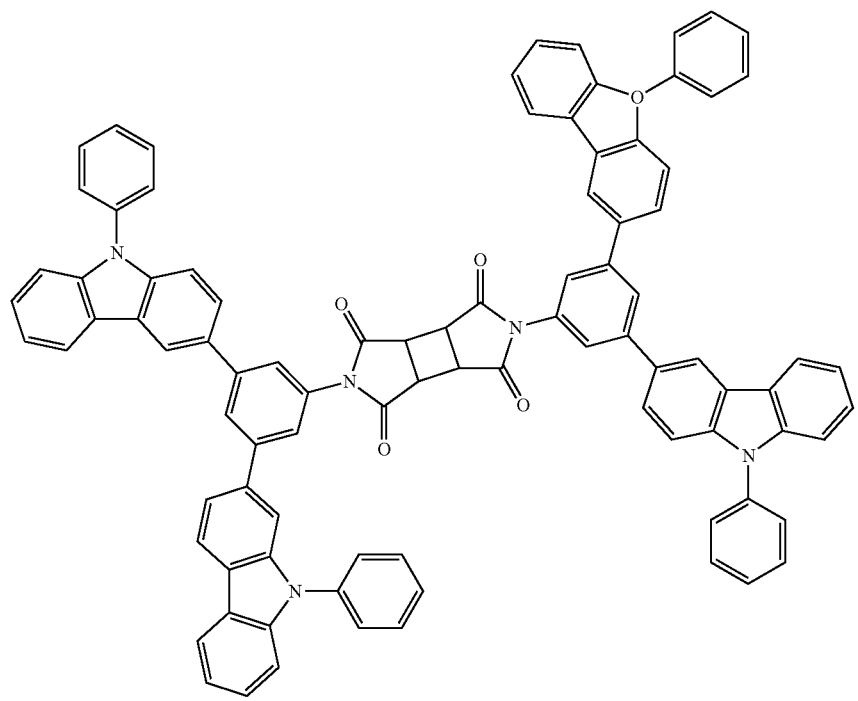

-continued
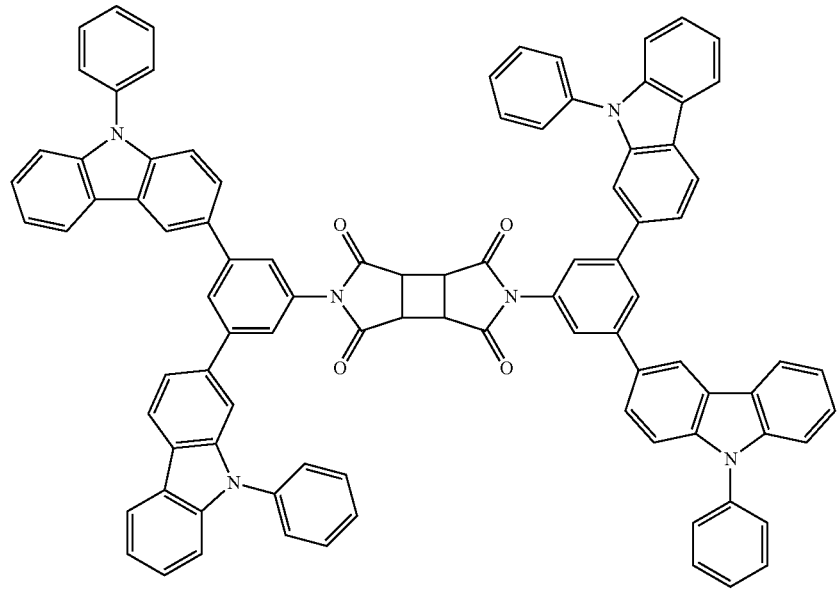
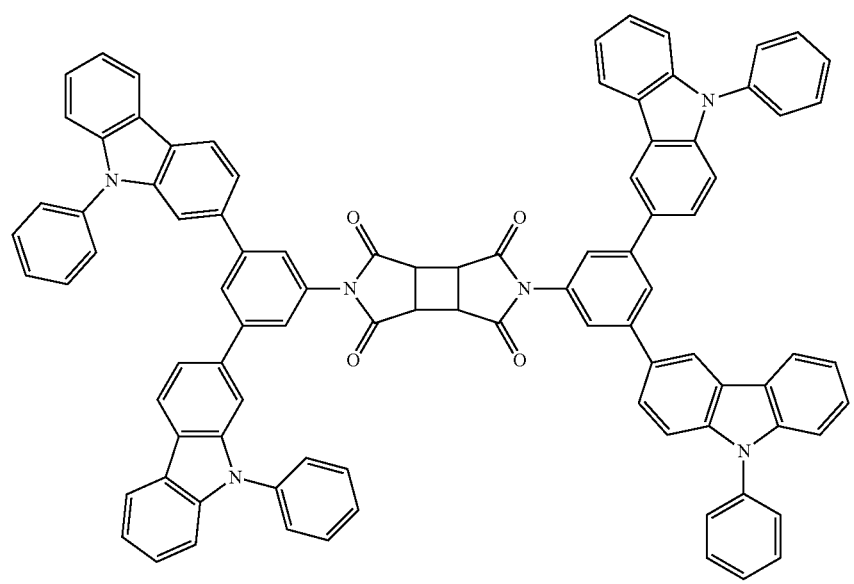

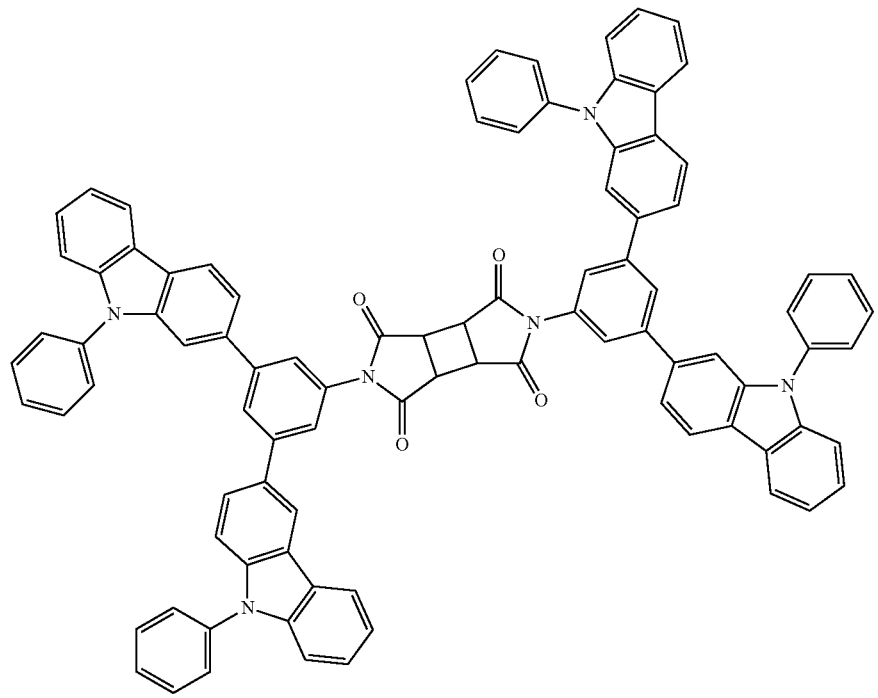
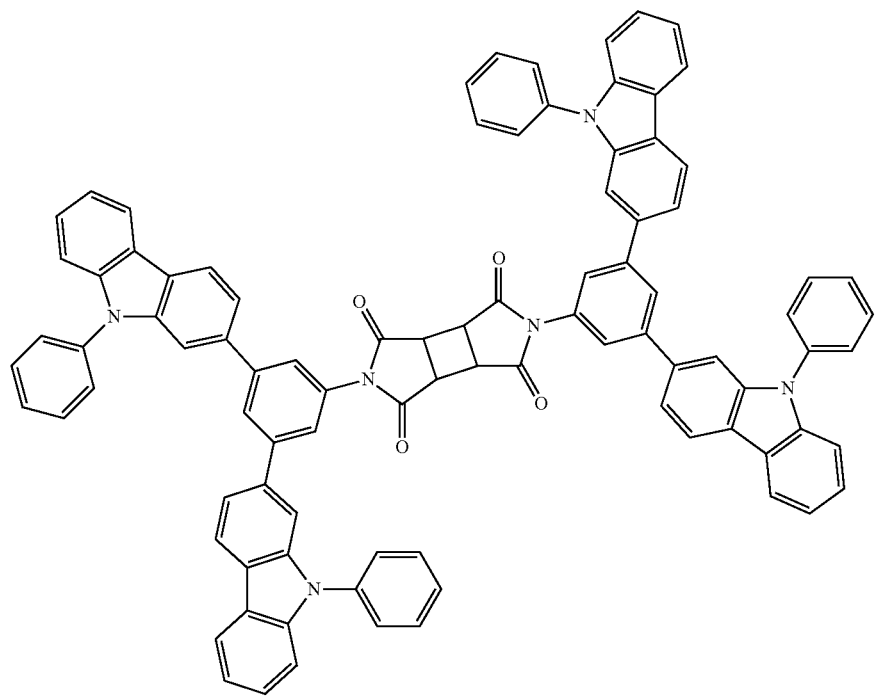

Glass Mixture 60 comprises the following structures:
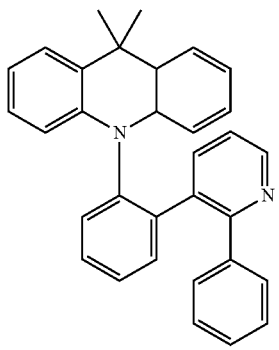
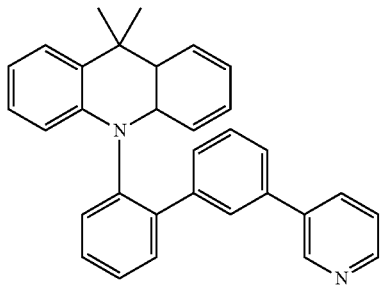
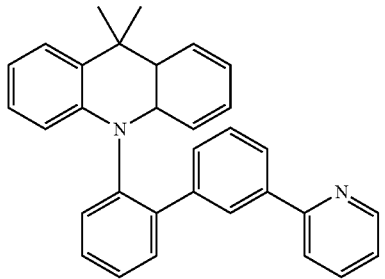
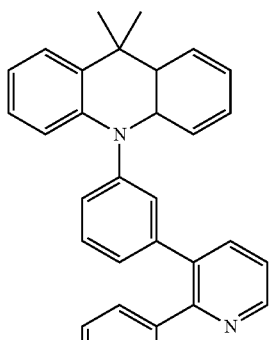
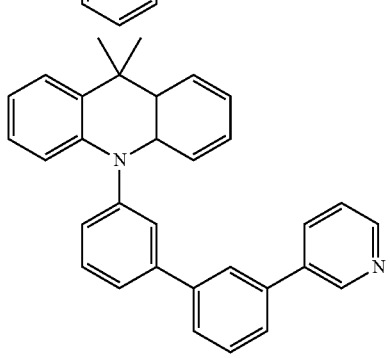
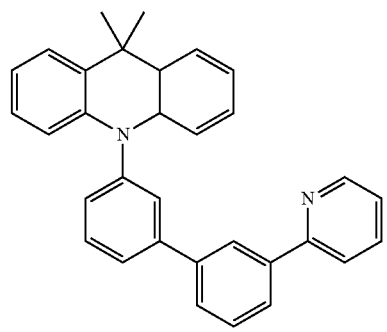 [SMILES: CC1(C)c2ccccc2N(c2cccc(-c3cccc(-c4ccccn4)c3)c2)C2C=CC=CC21]
Glass Mixture 65 comprises the following structures:
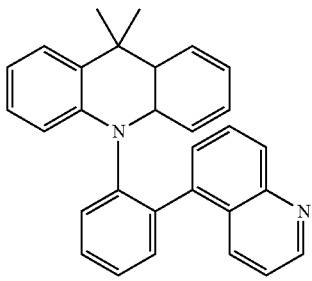

121
-continued
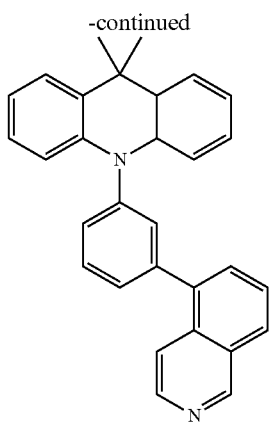
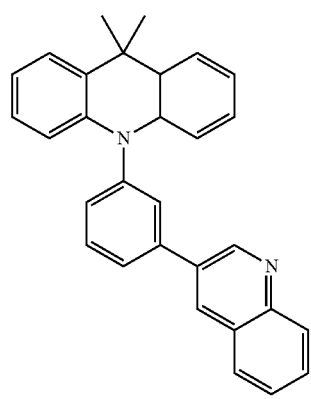
Glass Mixture 70 comprises the following structures:
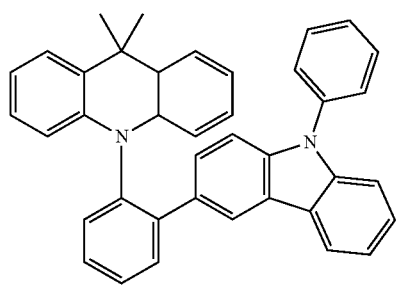
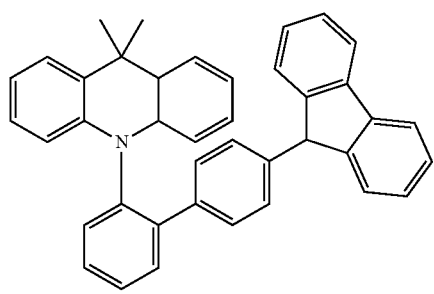
122
-continued
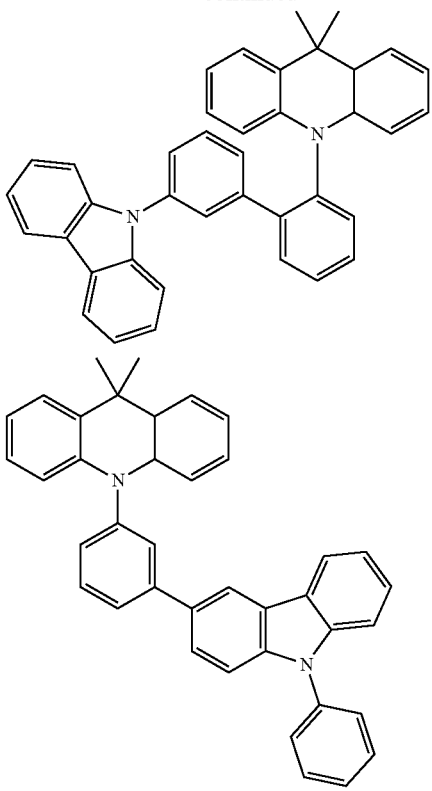
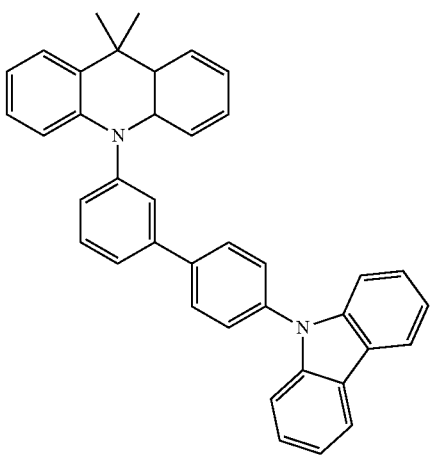
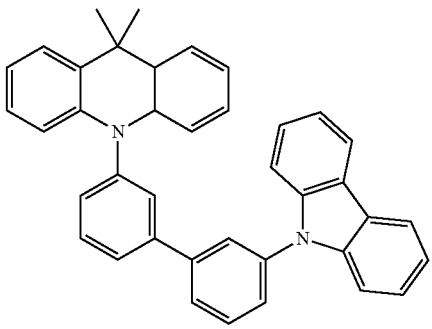 [SMILES: CC1(C)c2ccccc2N(c2cccc(-c3cccc(-n4c5ccccc5c5ccccc54)c3)c2)C2C=CC=CC21]

Glass Mixture 75 comprises the following structures:
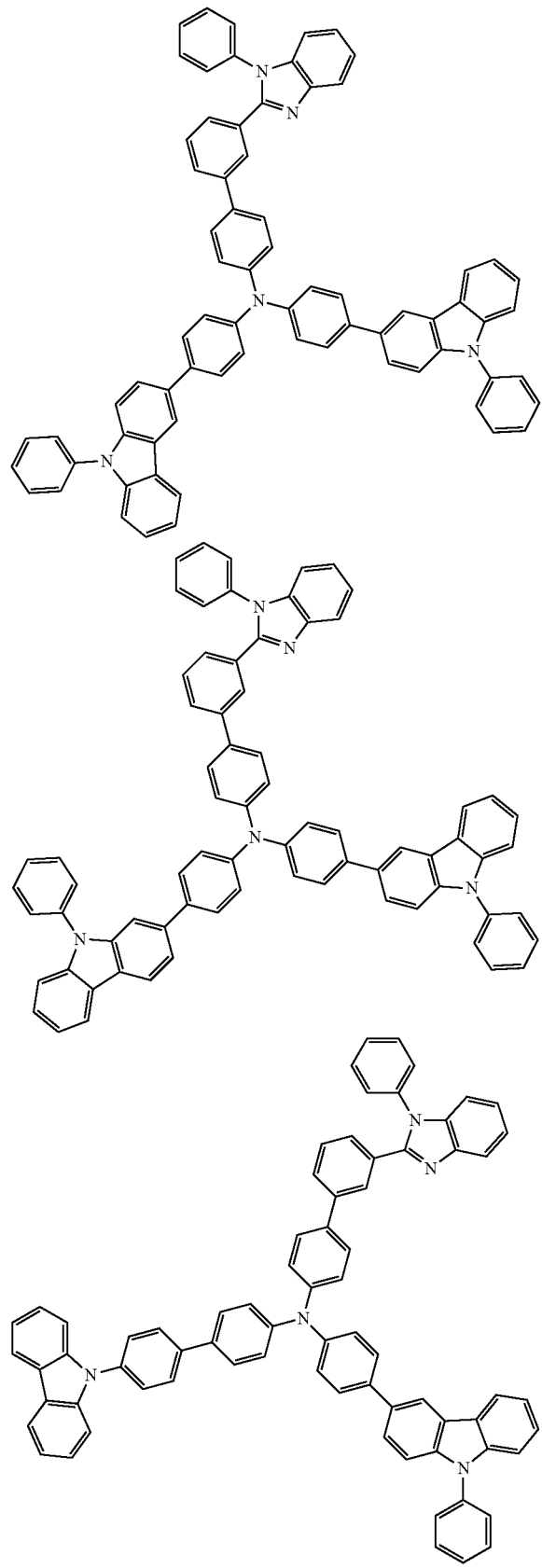
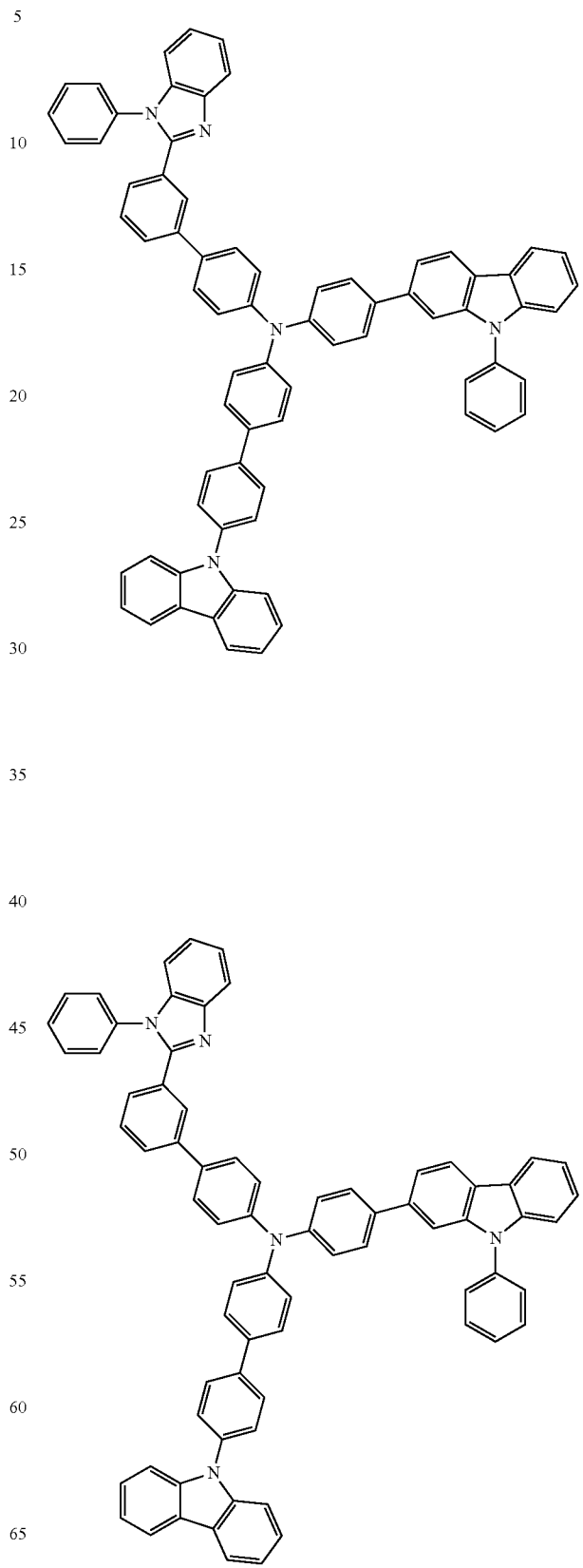

125
-continued
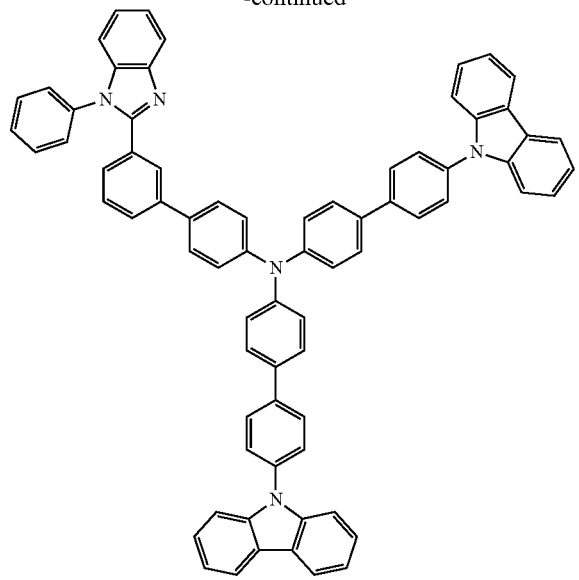
Glass Mixture 80 comprises the following structures:
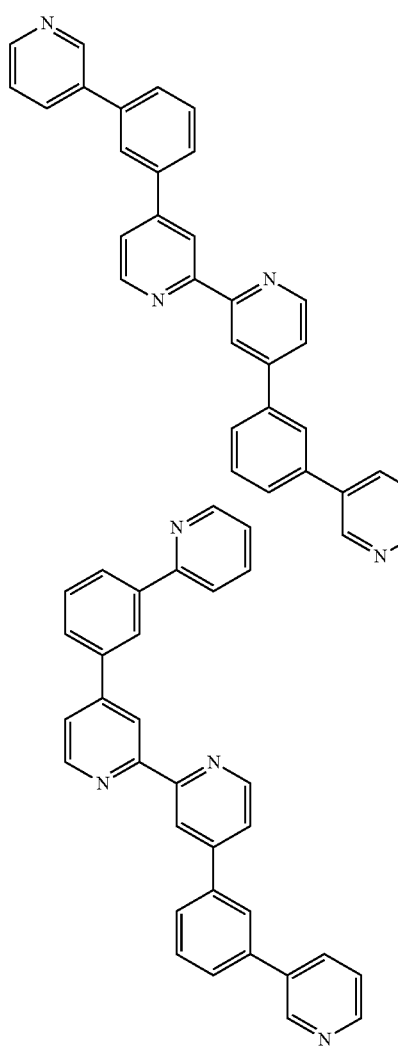
126
-continued
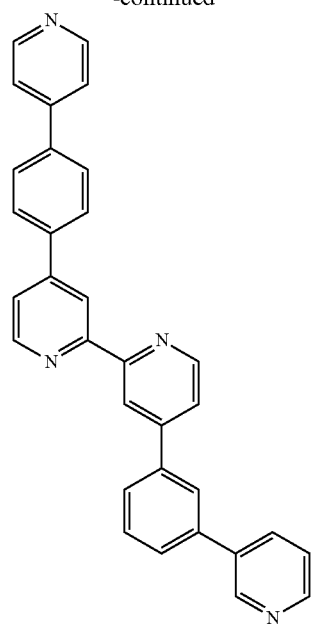
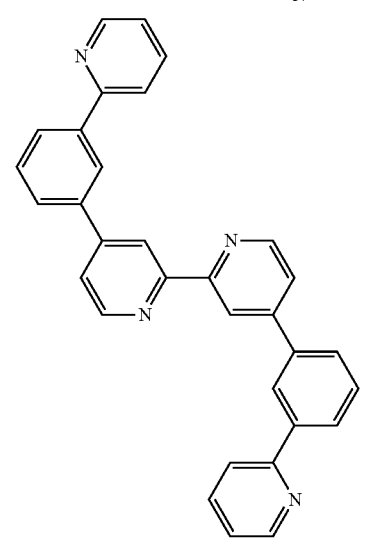
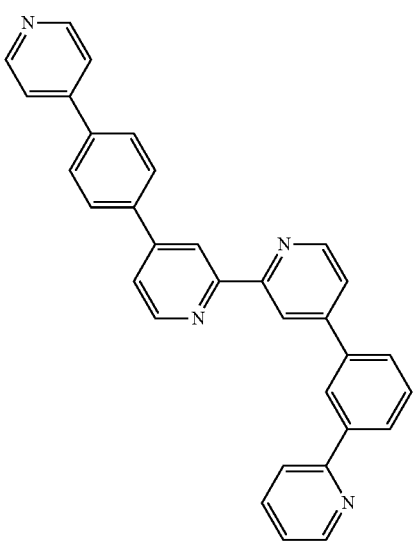

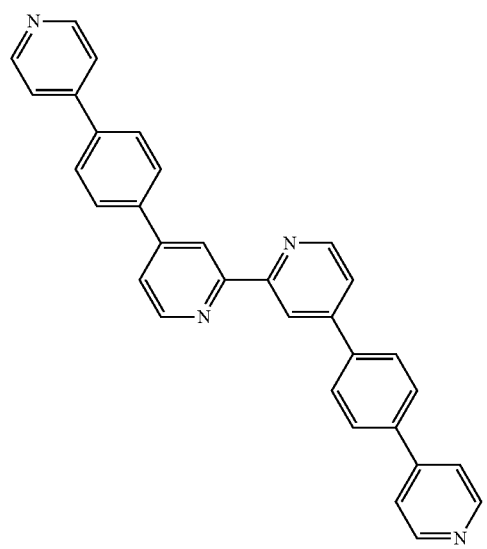
Glass Mixture 85 comprises the following structures:
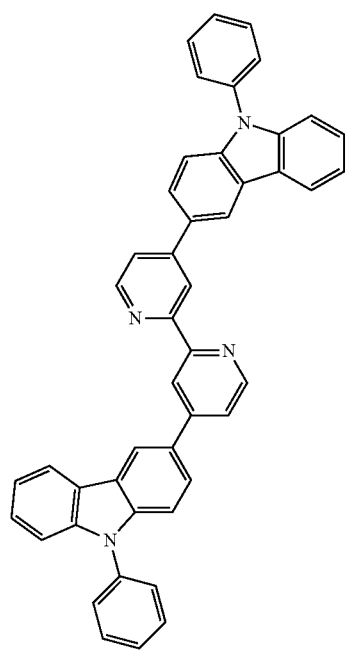
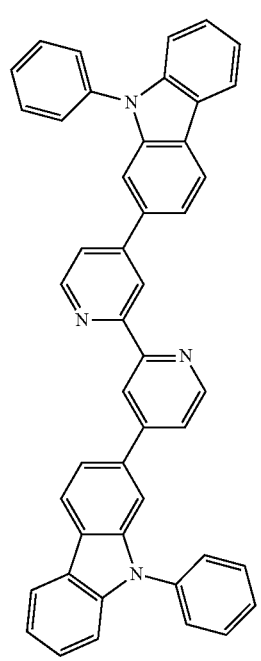
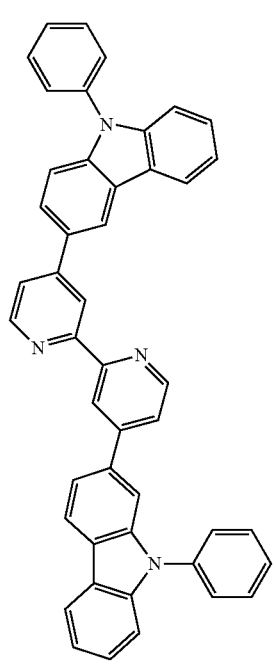

-continued
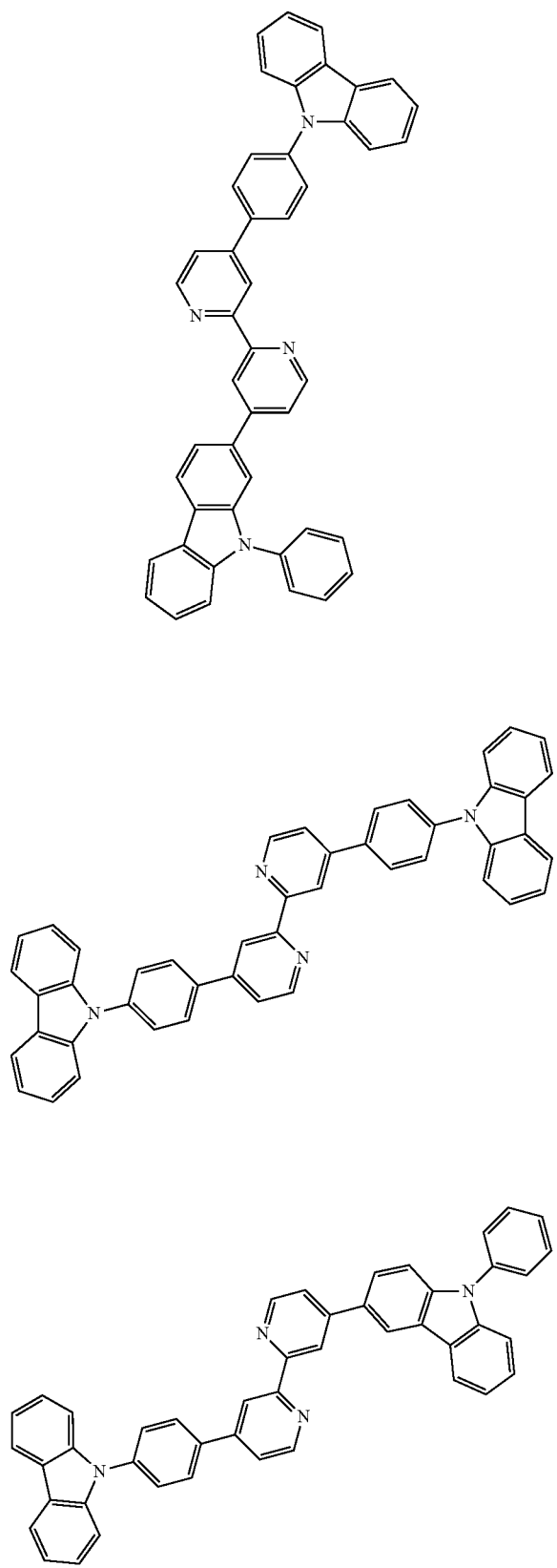
Glass Mixture 90 comprises the following structures:
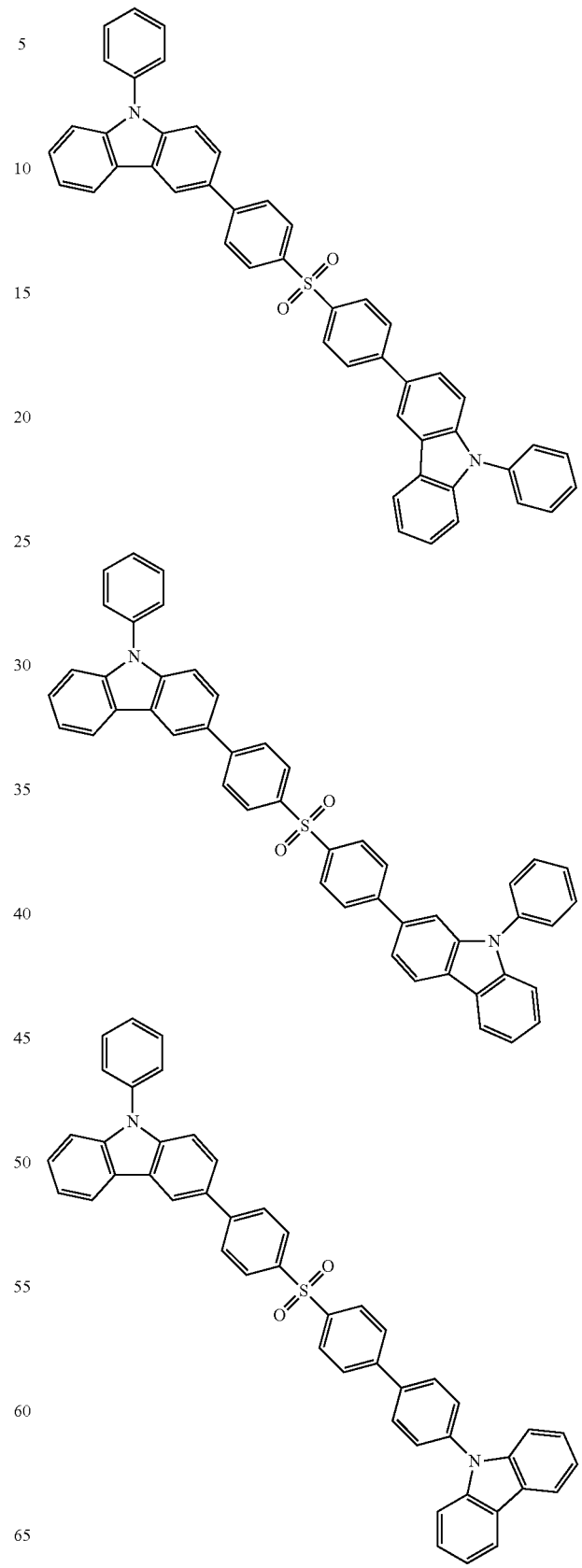

-continued
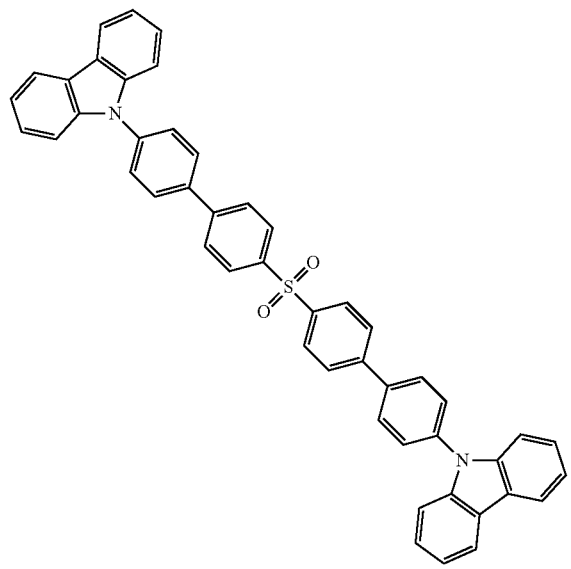
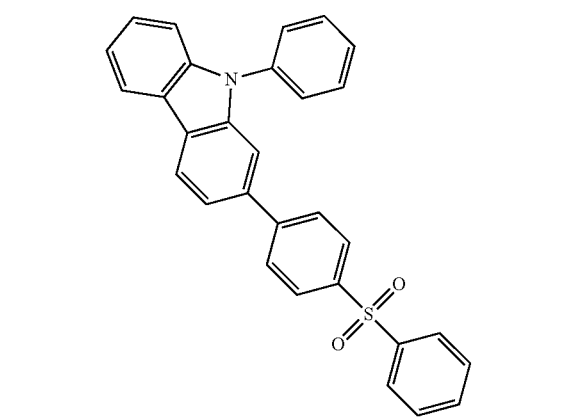
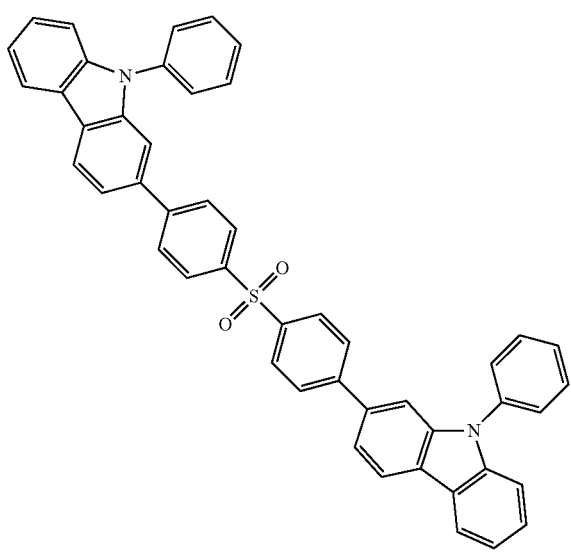
Glass Mixture 95 comprises the following structures:
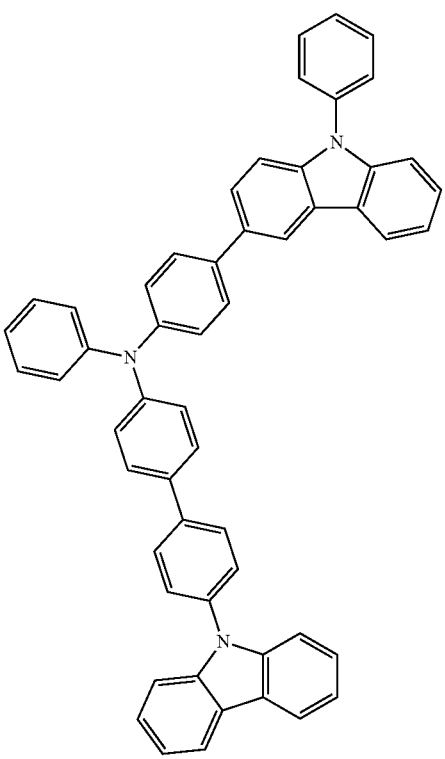

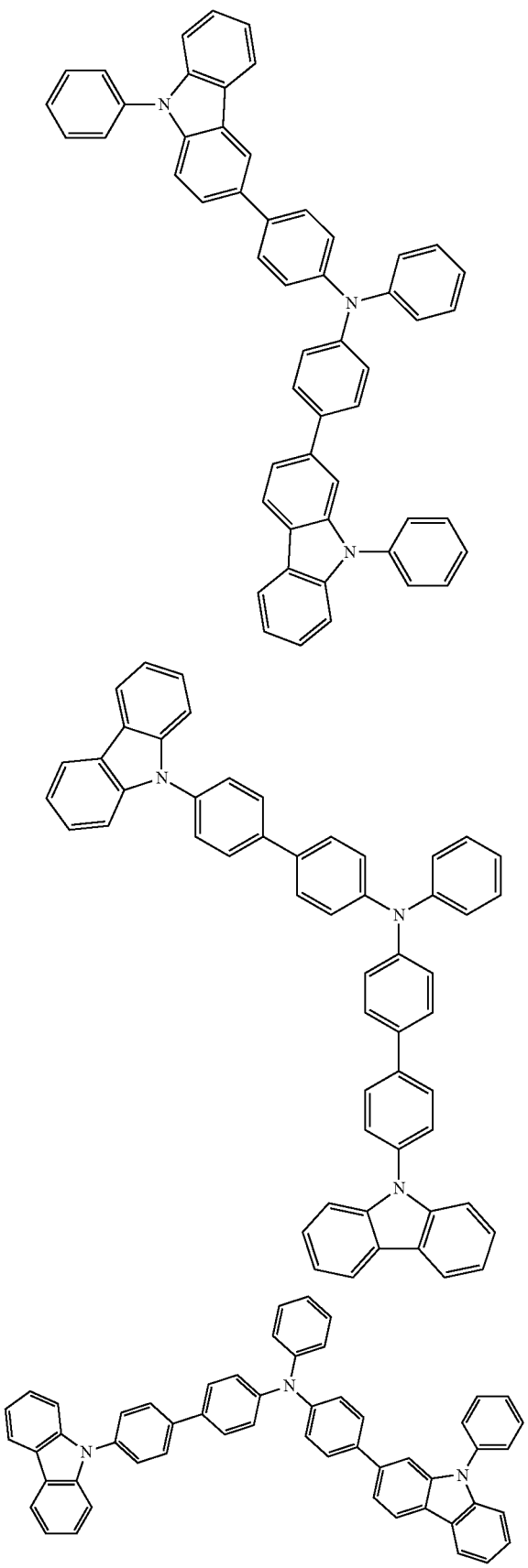
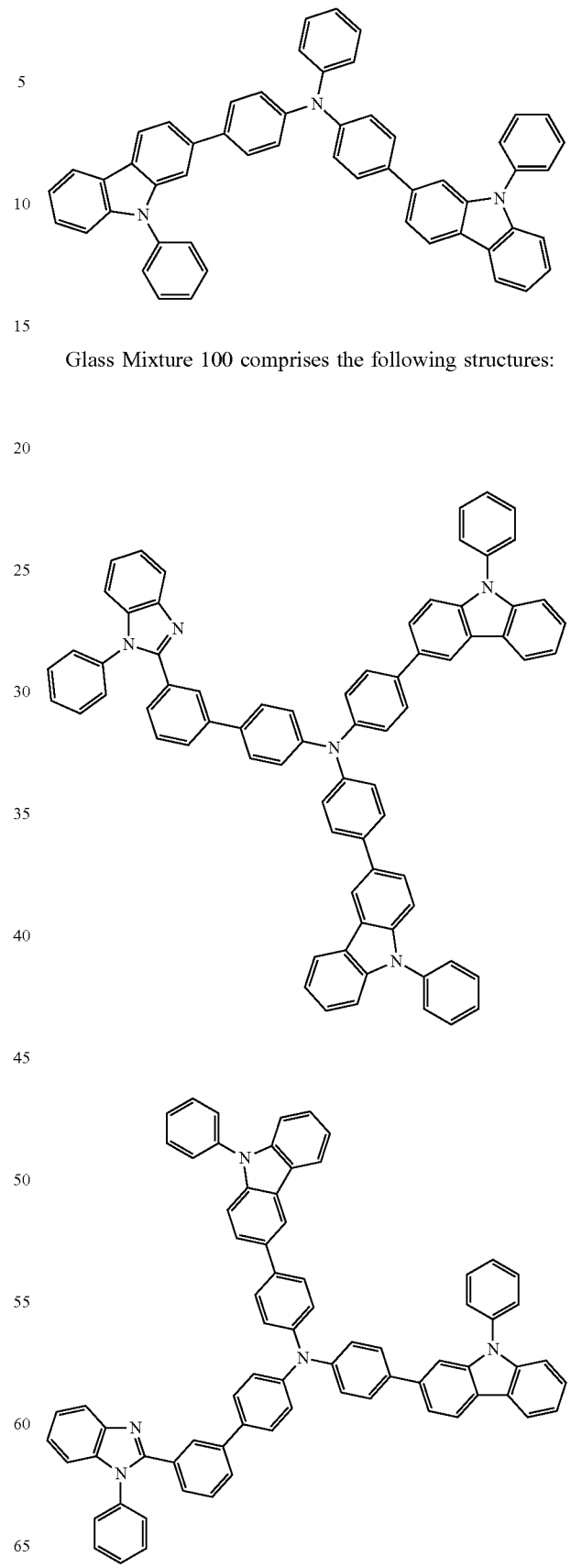
Glass Mixture 100 comprises the following structures:

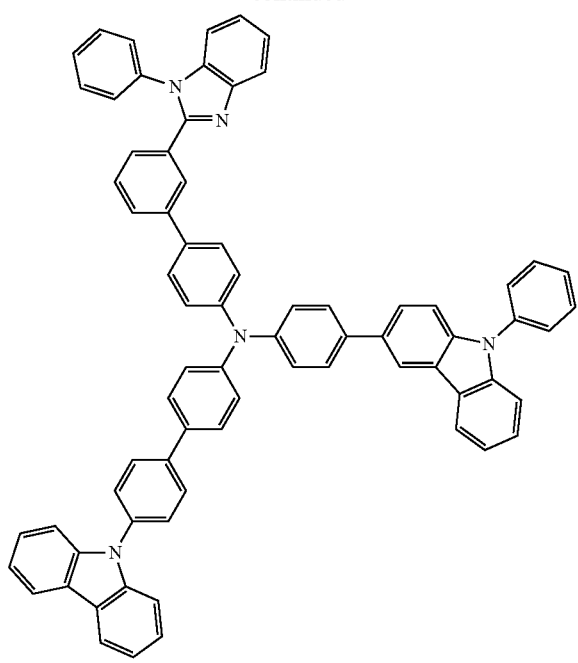
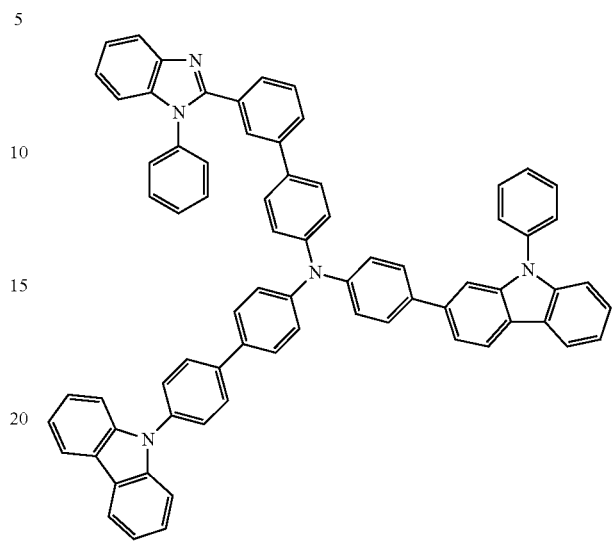
Glass Mixture 105 comprises the following structures:
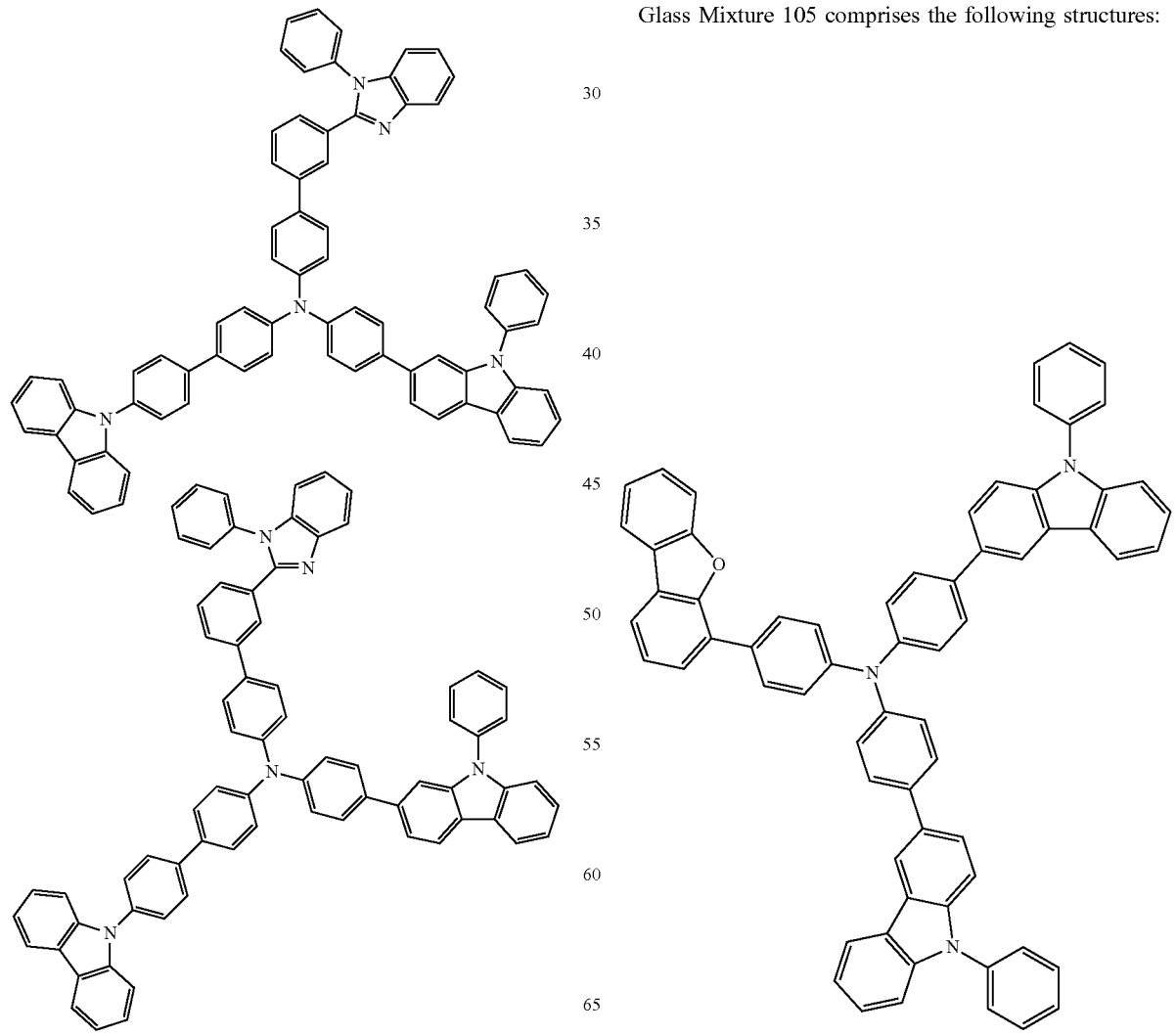

137
-continued
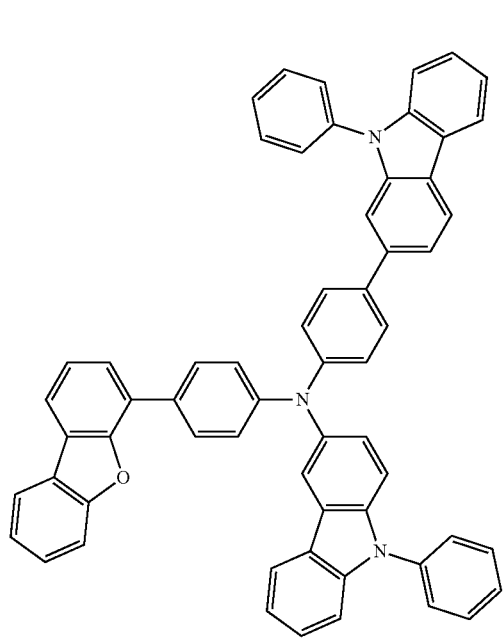
138
-continued
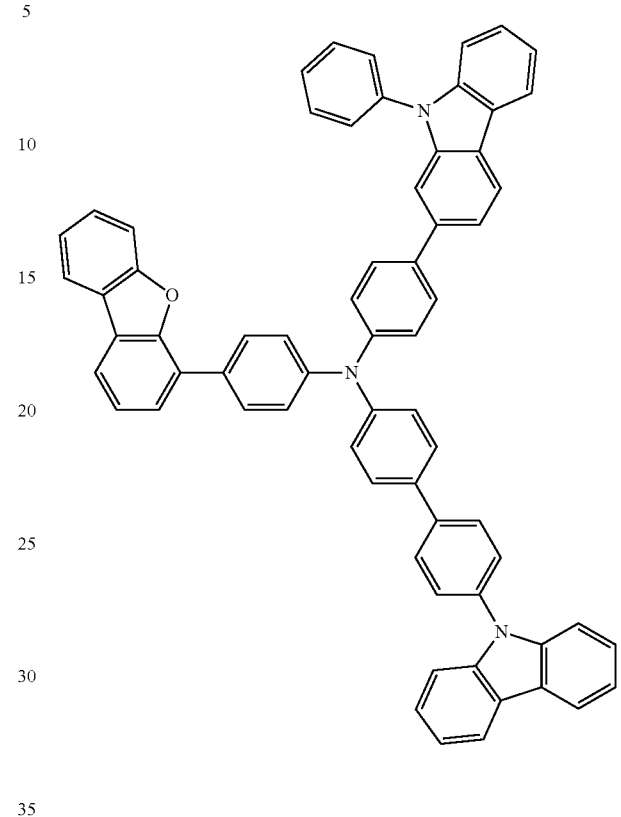
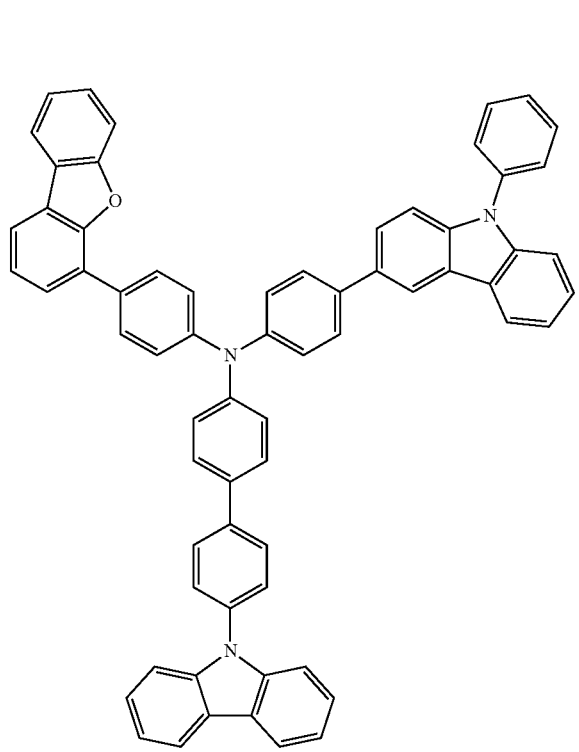
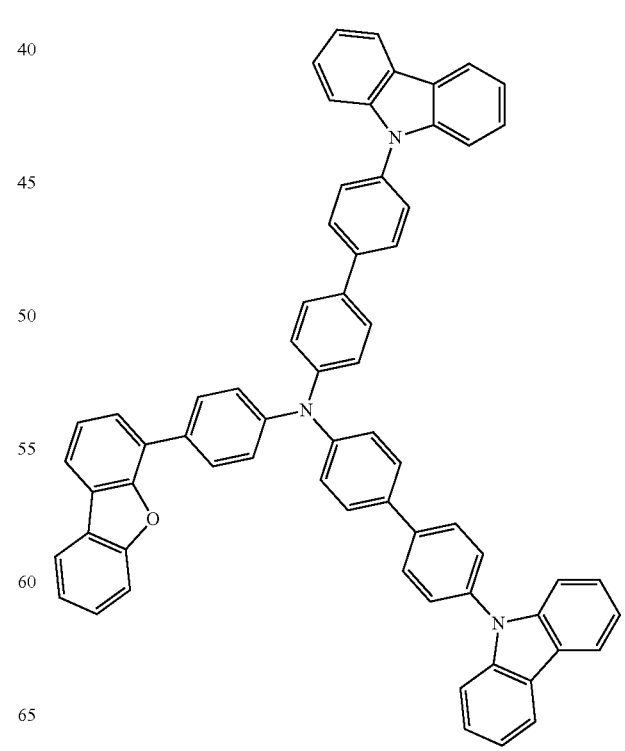

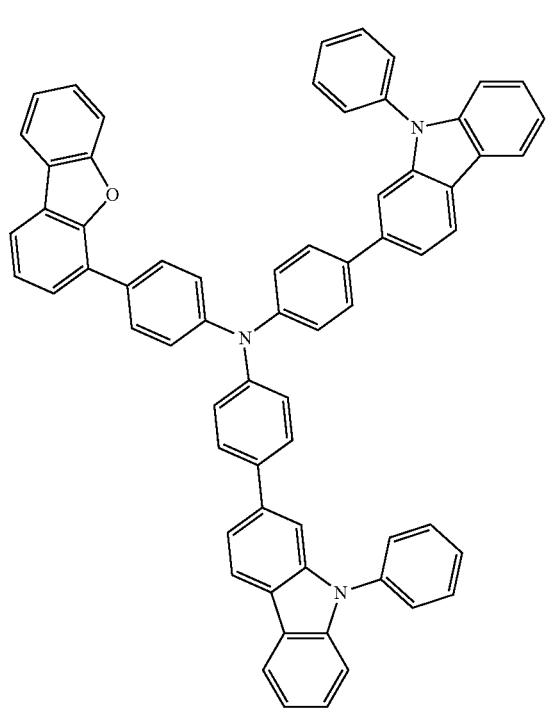
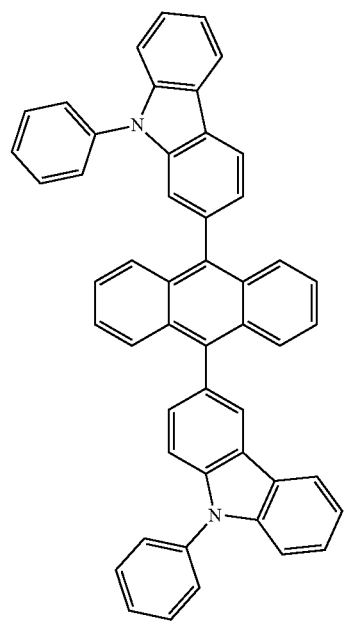
Glass Mixture 110 comprises the following structures:
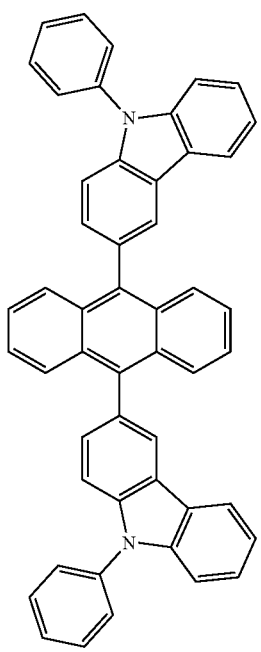
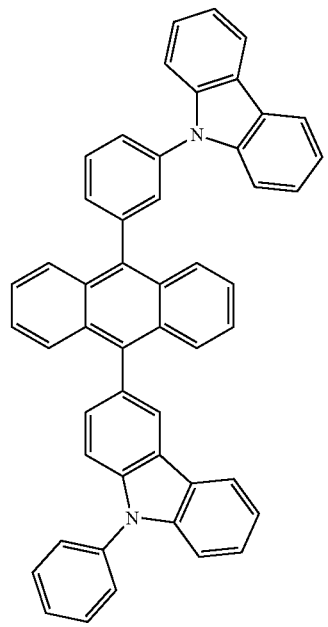

Glass Mixture 115 comprises the following structures:
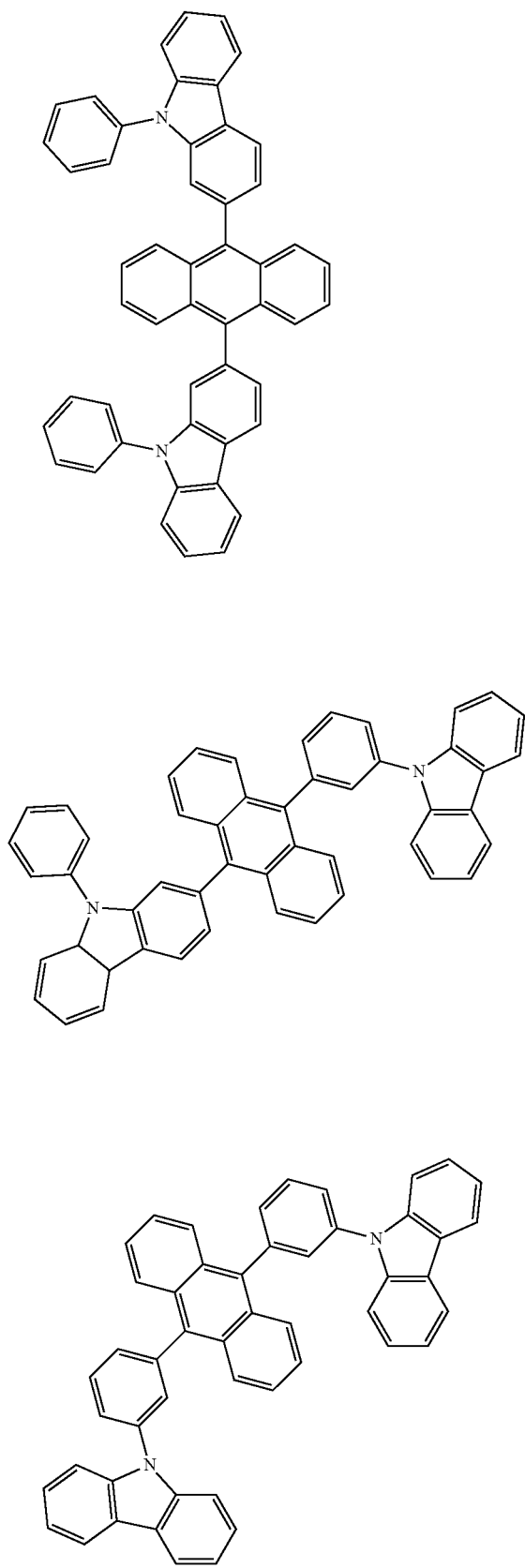
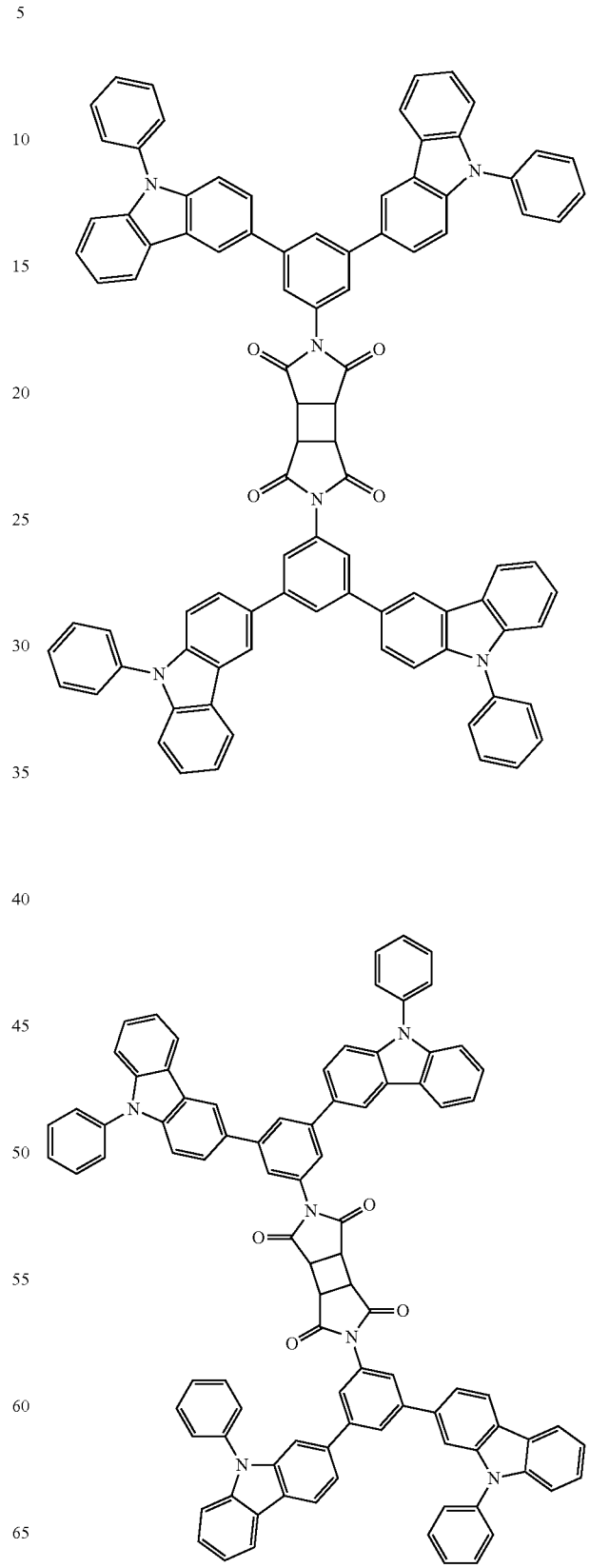

143
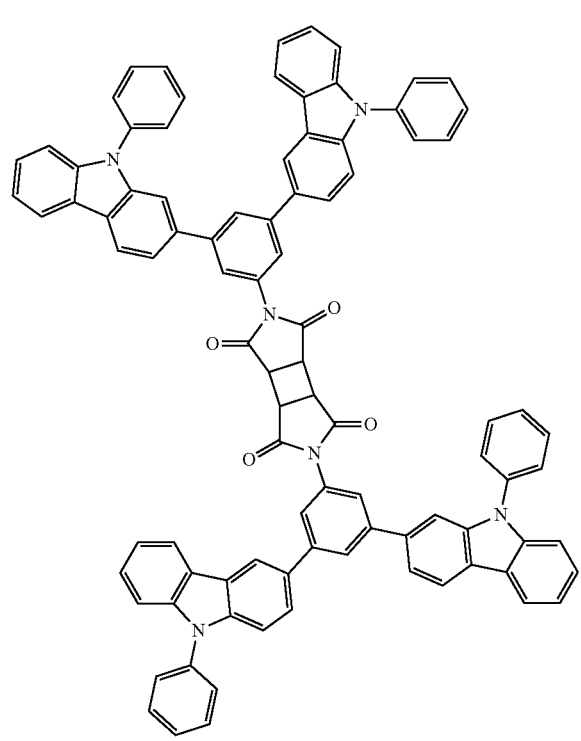
144
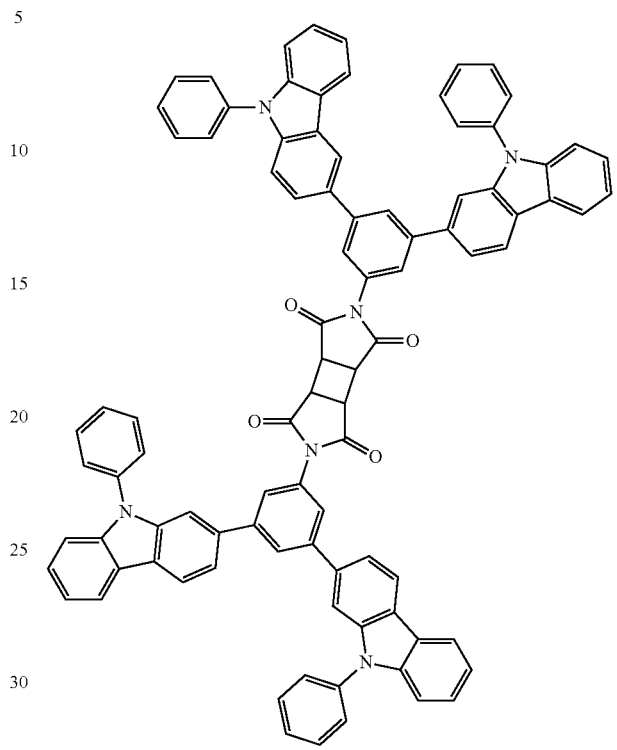
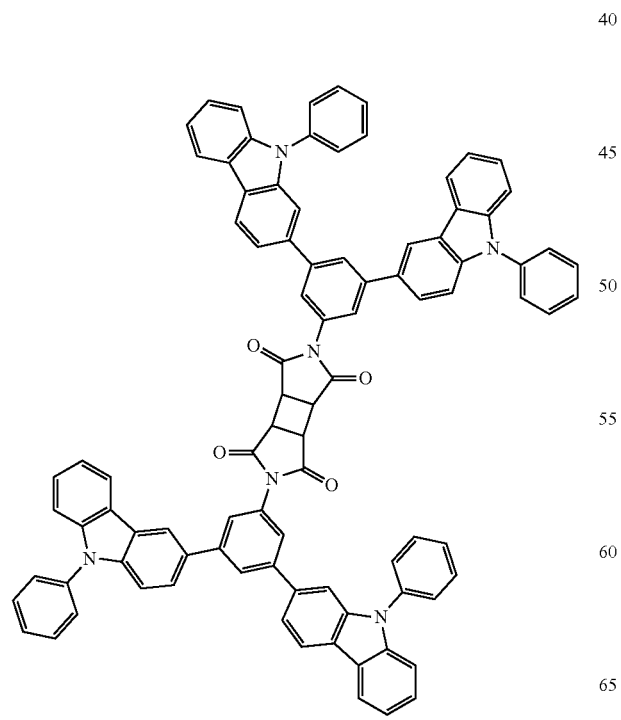
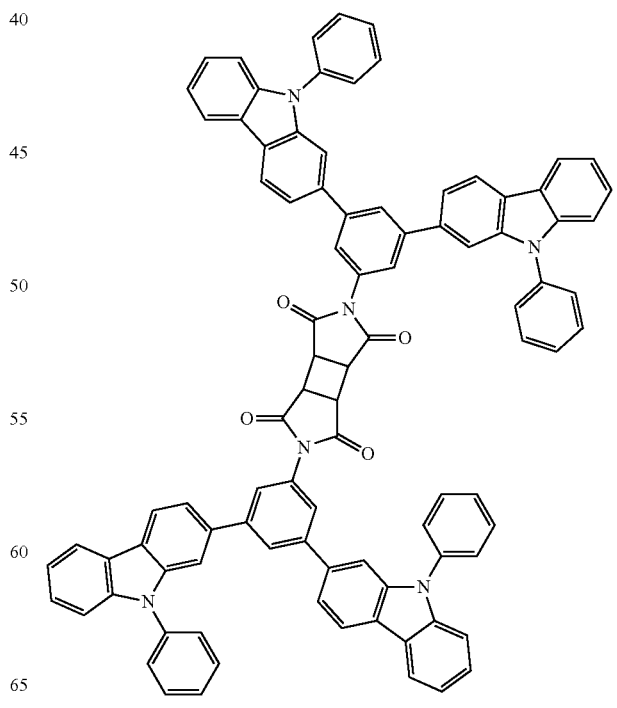

Glass Mixture 120 comprises the following structures:
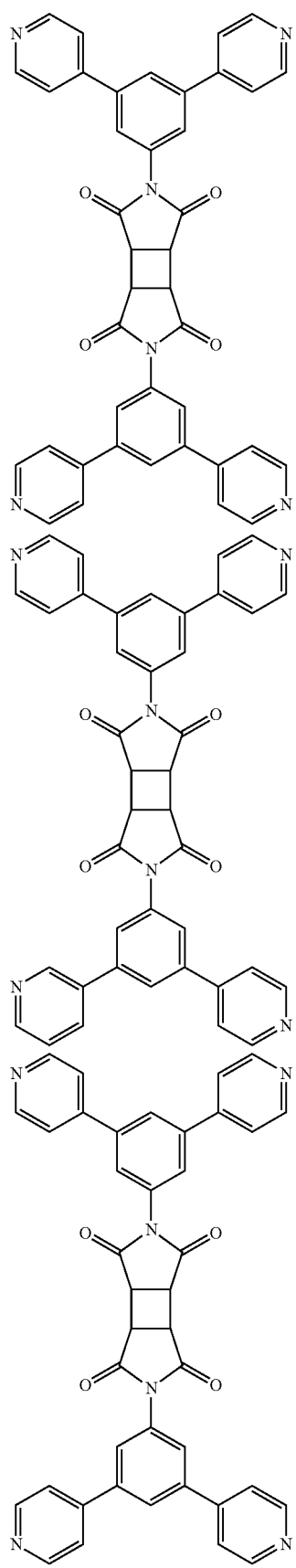
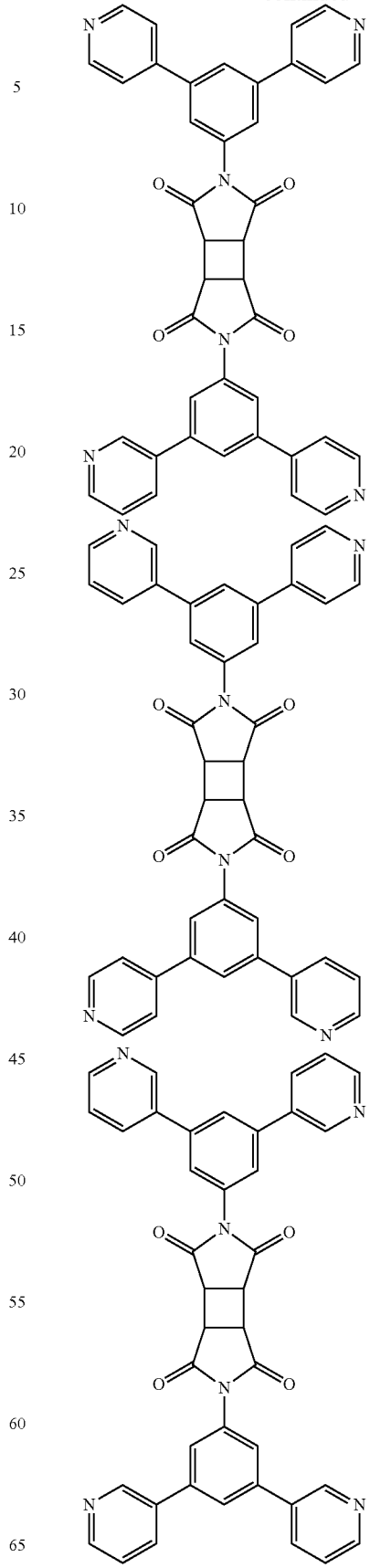
-continued Glass Mixture 121 comprises the following structures:
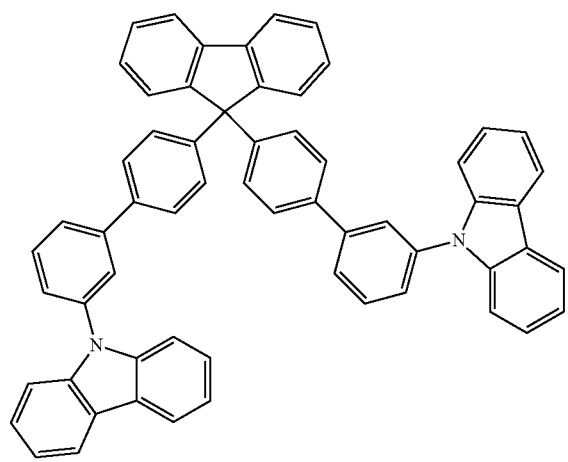
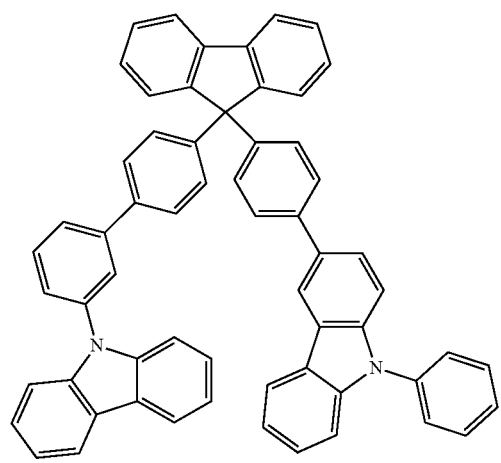
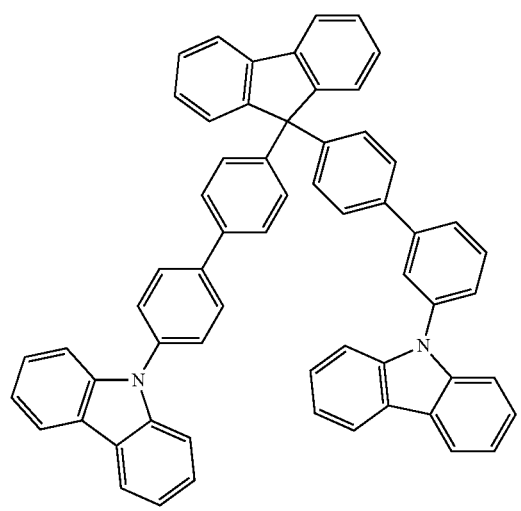
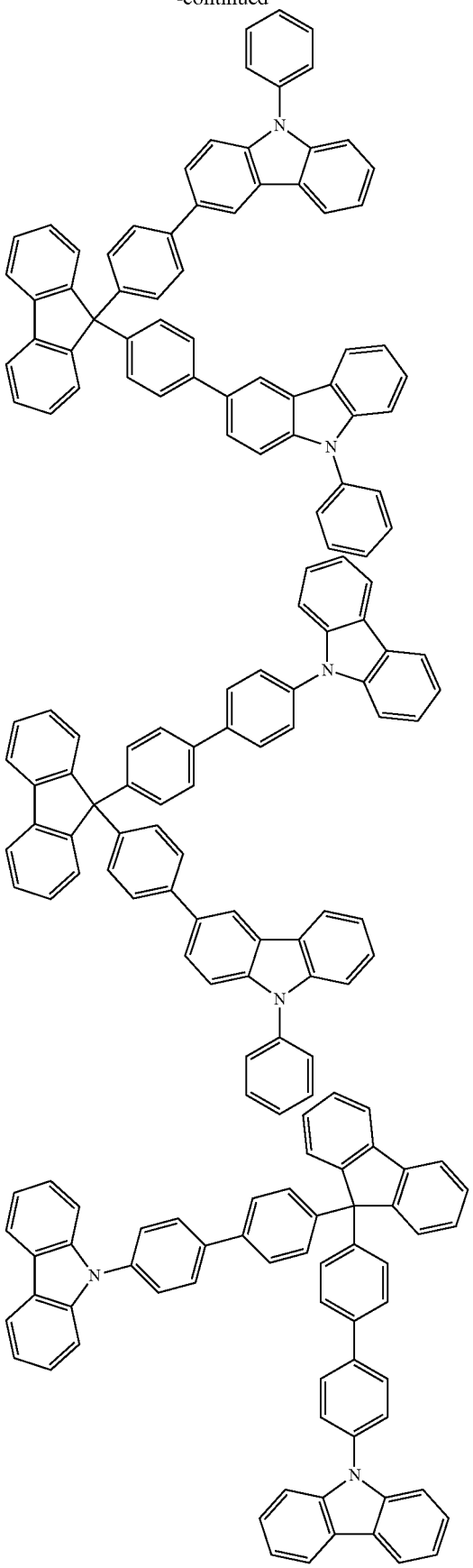

Glass Mixture 122 comprises the following structures:
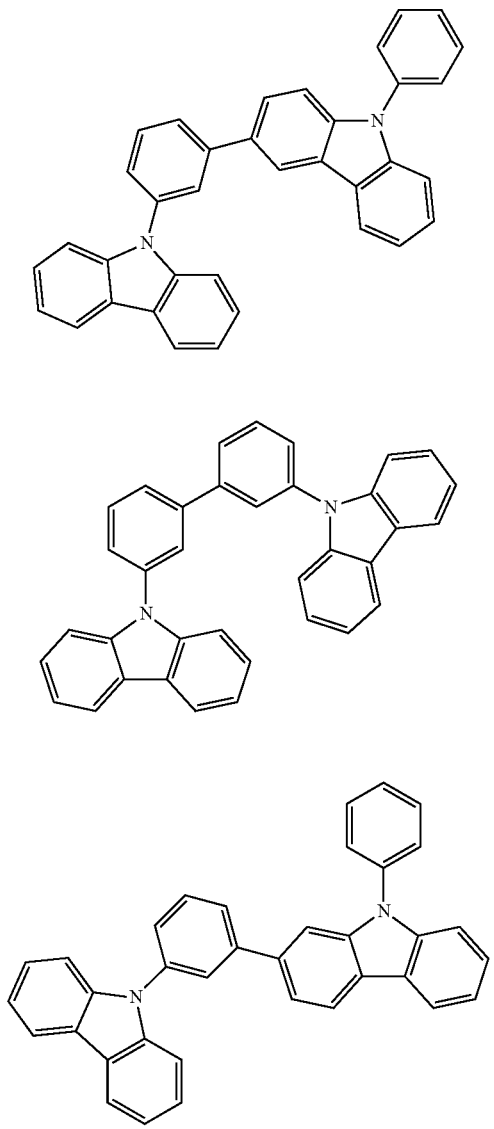
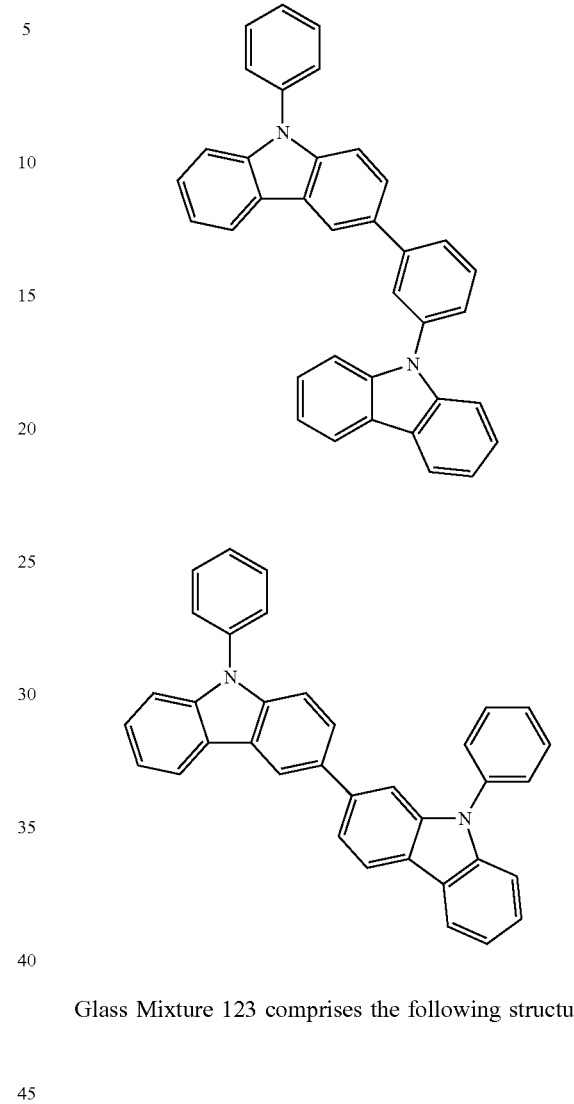
Glass Mixture 123 comprises the following structures:
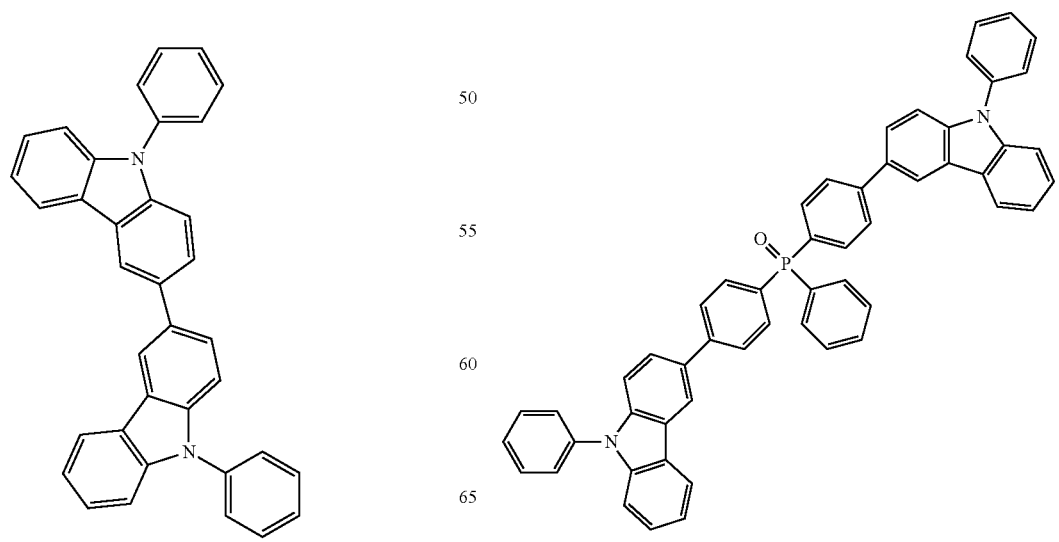

151
-continued
152
-continued
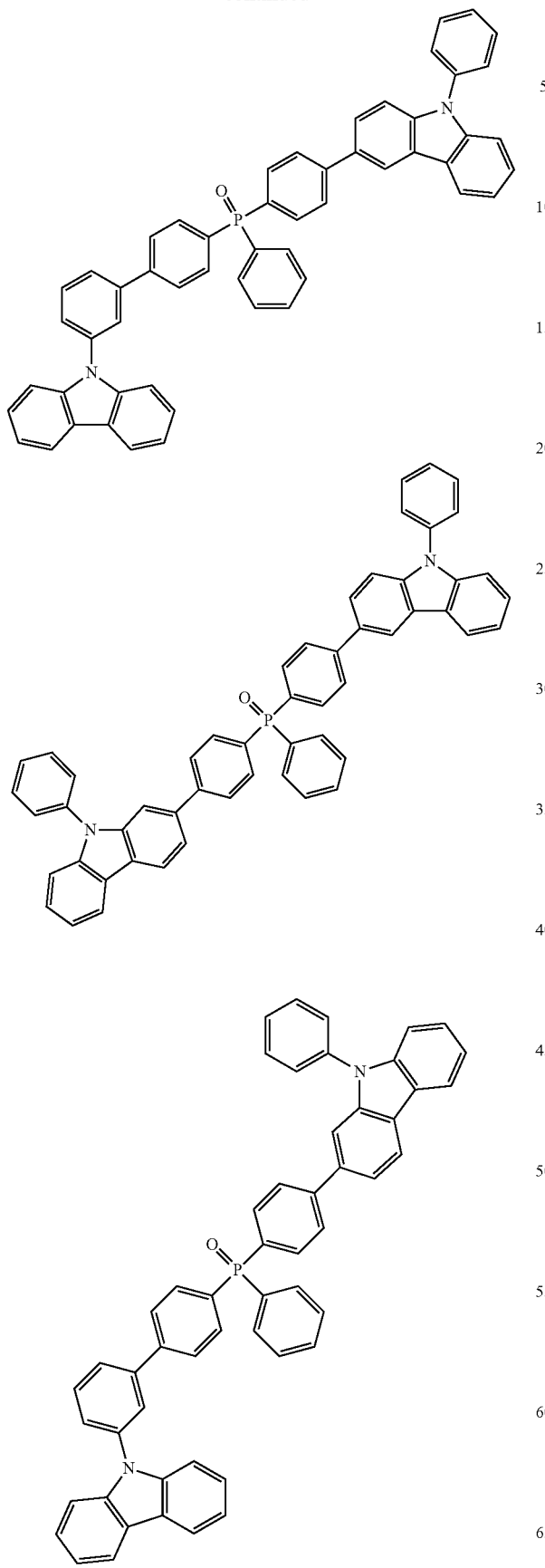
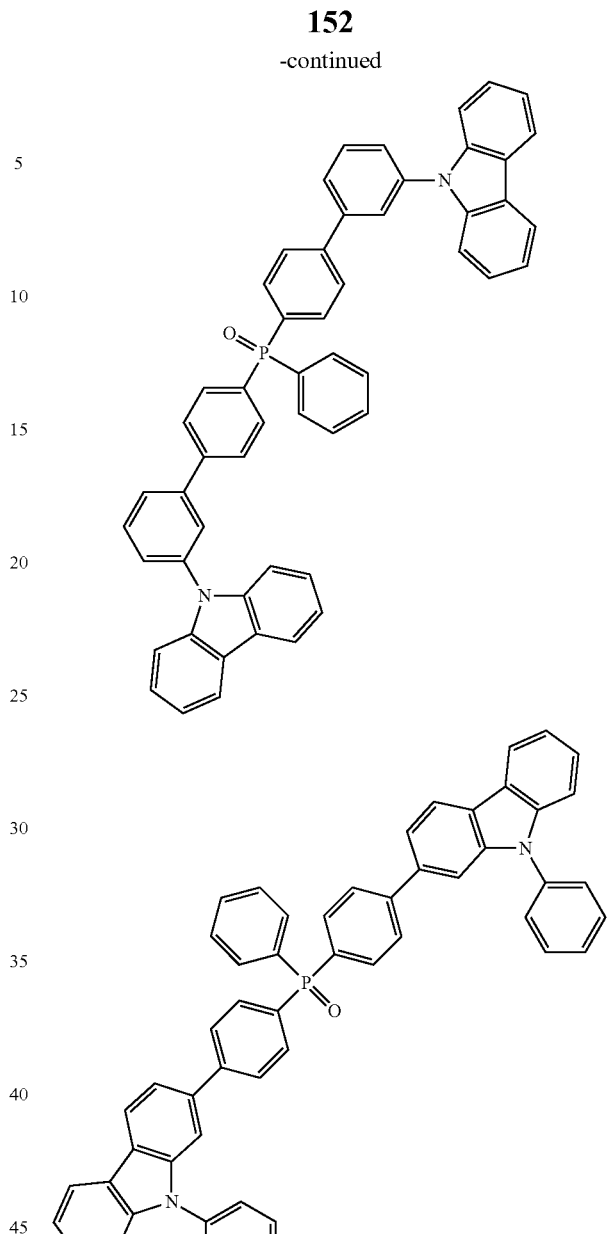
Glass Mixture 124 comprises the following structures:
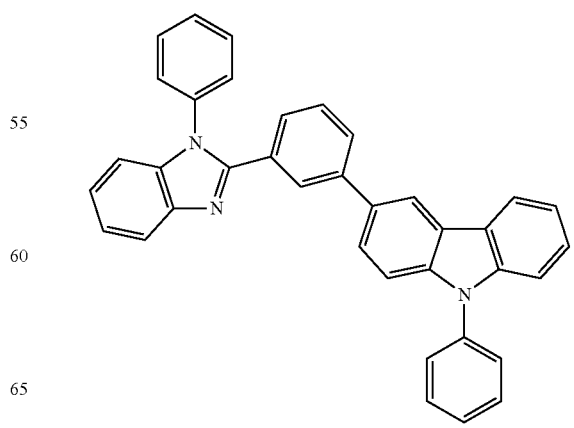

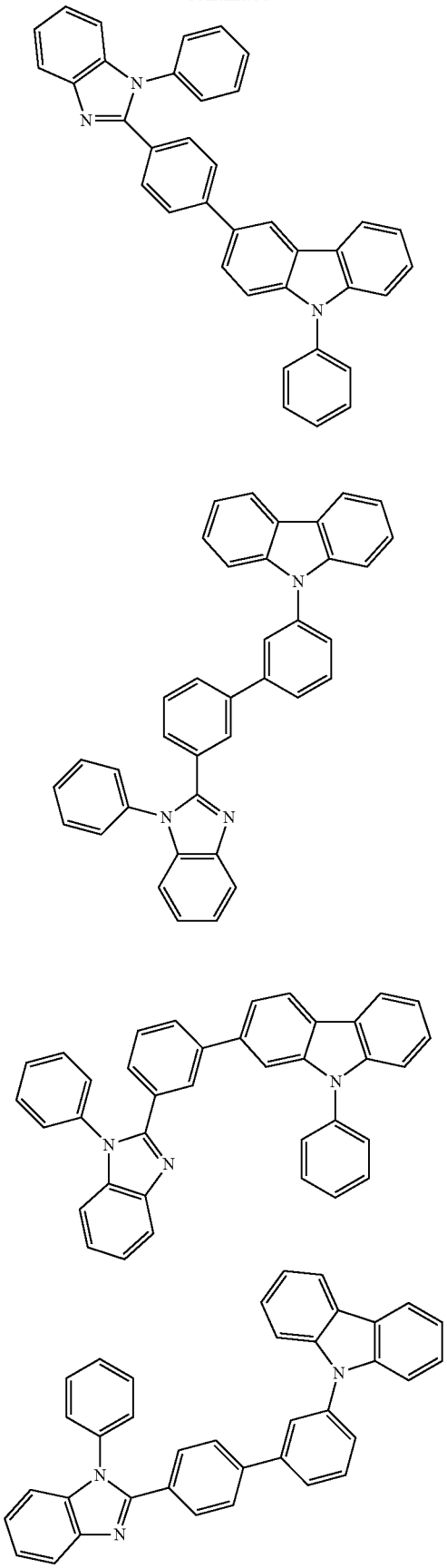
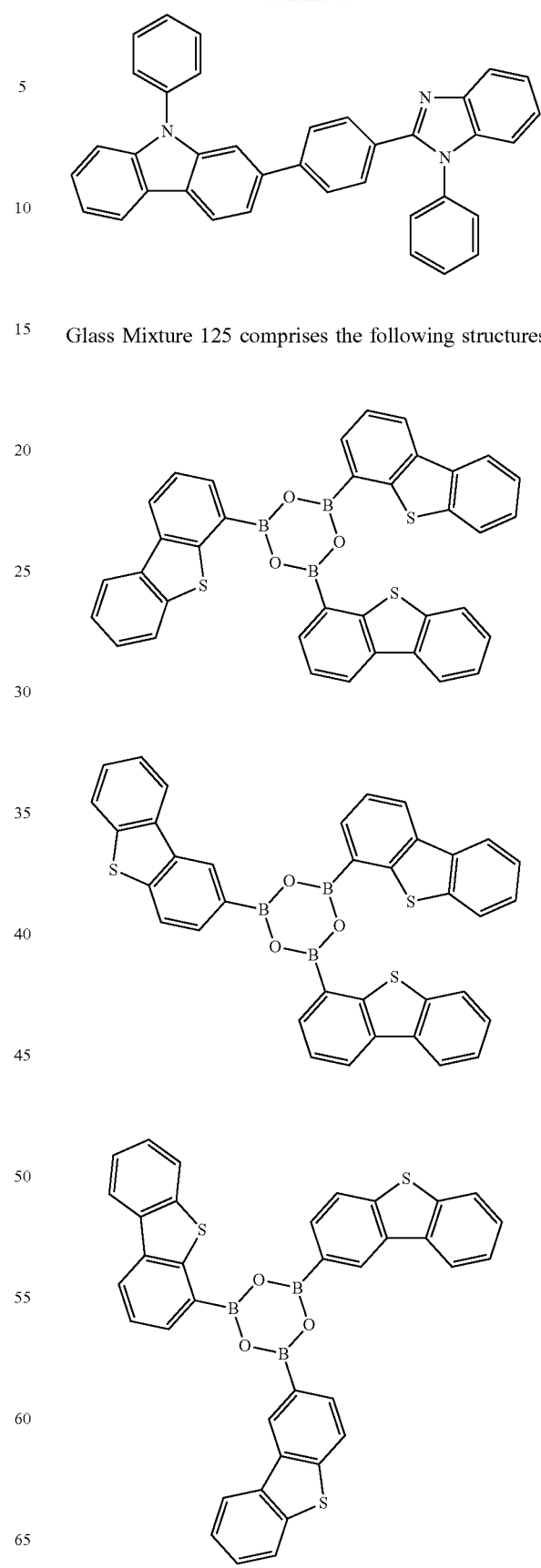
Glass Mixture 125 comprises the following structures:

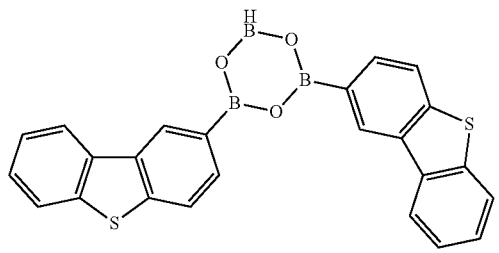
Glass Mixture 126 comprises the following structures:
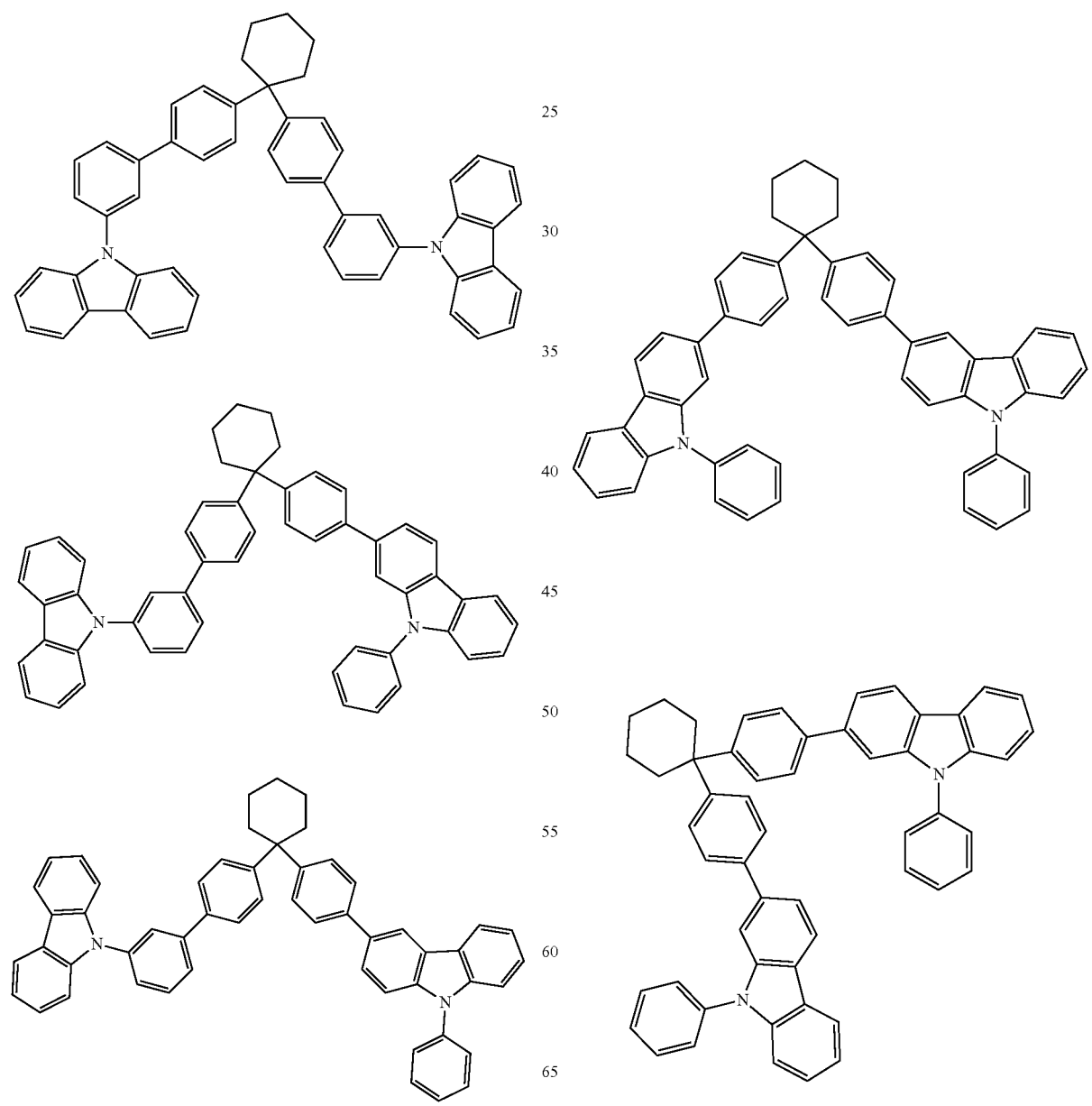

Glass Mixture 127 comprises the following structures:
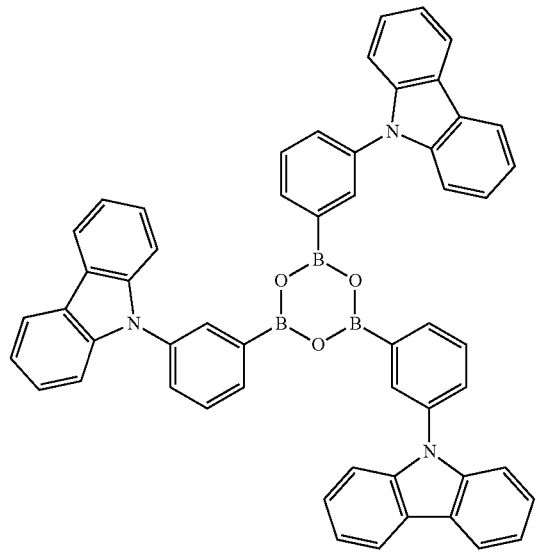
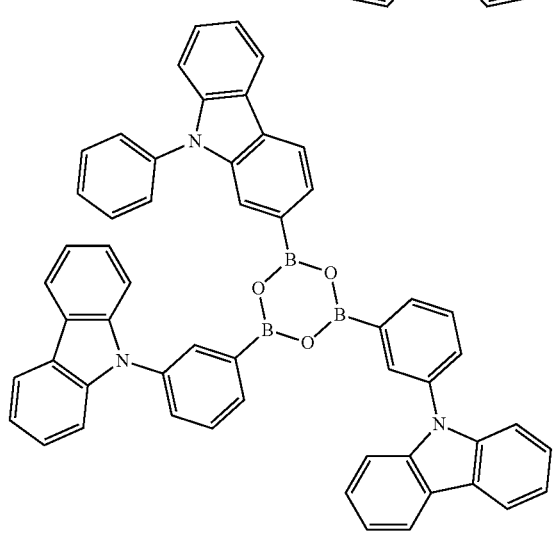
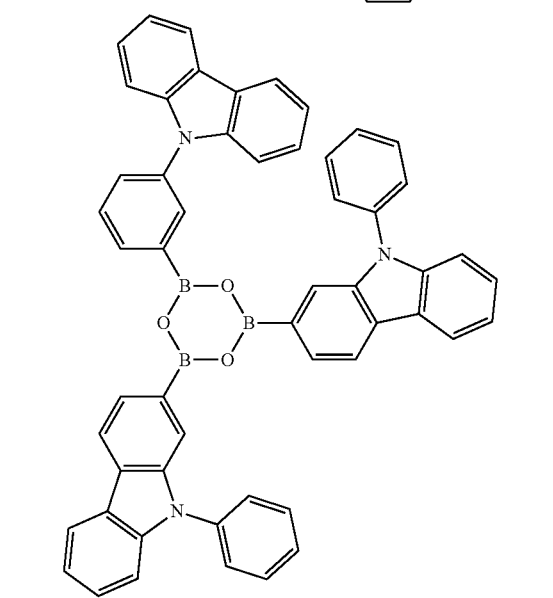
-continued
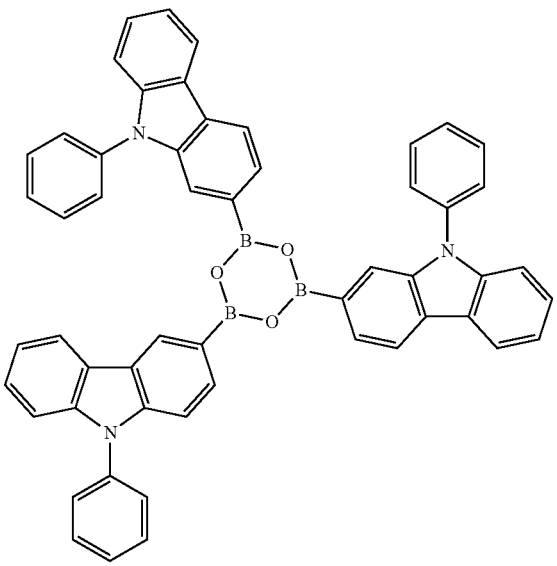
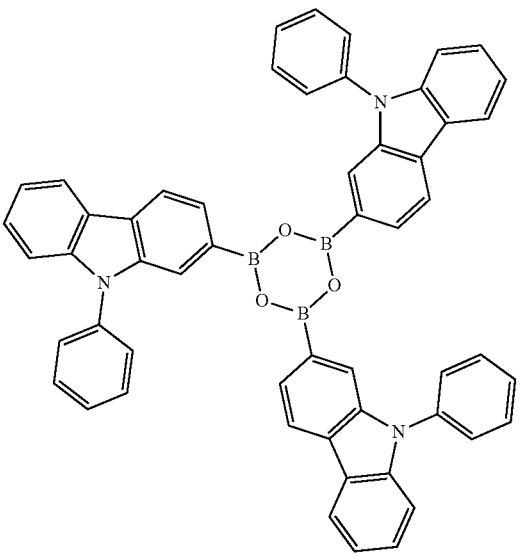
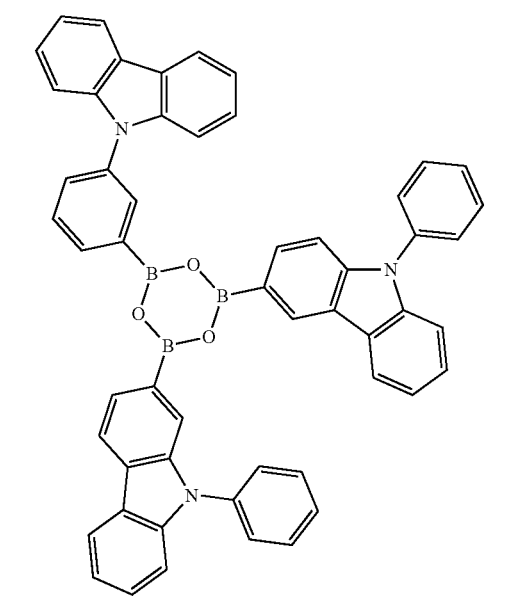

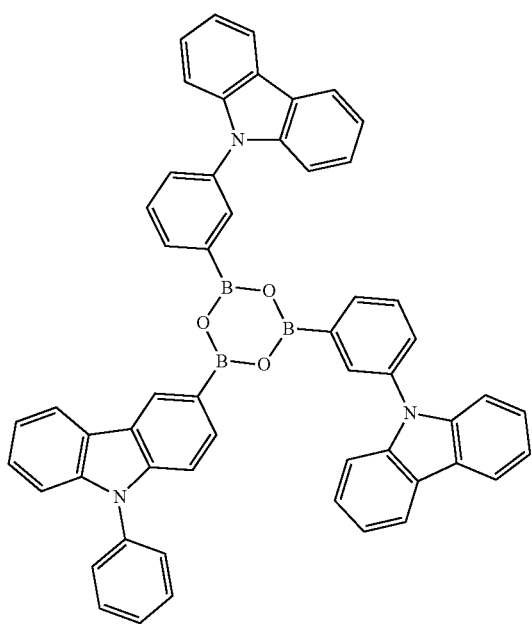
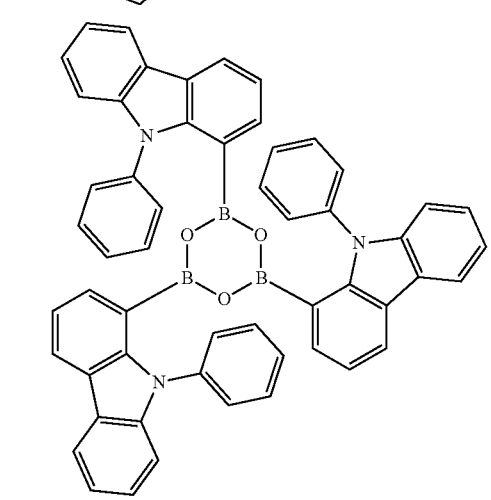
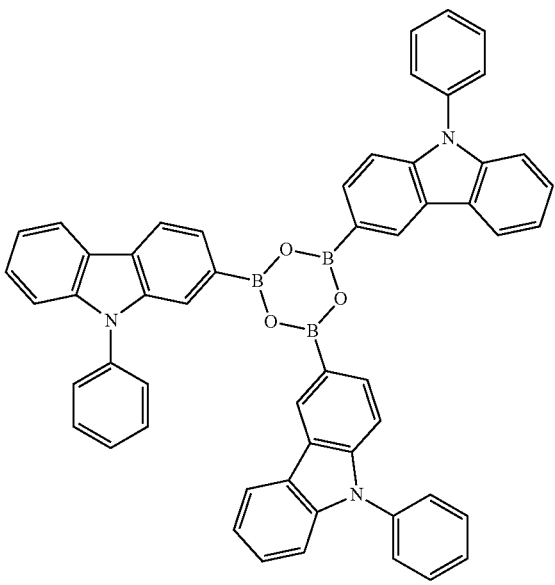
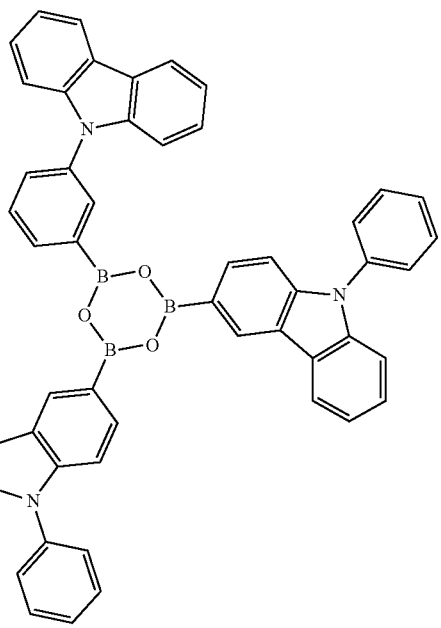
Glass Mixture 128 comprises the following structures:

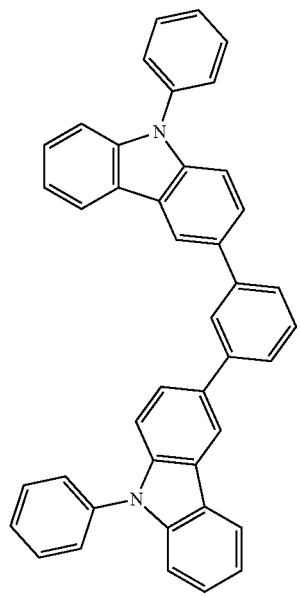
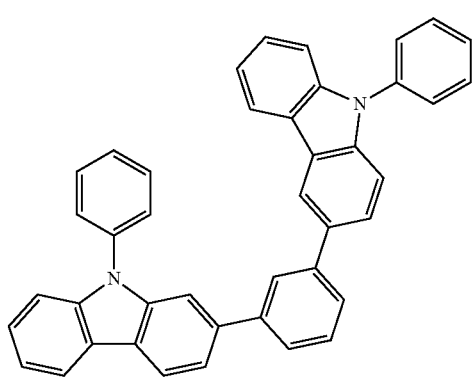
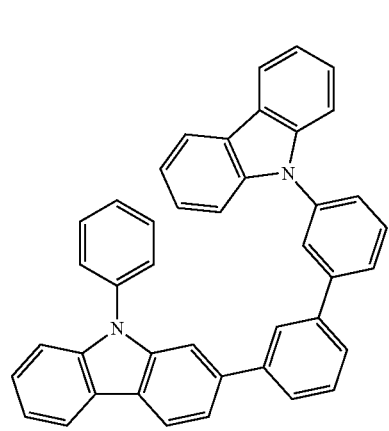
Glass Mixture 129 comprises the following structures:
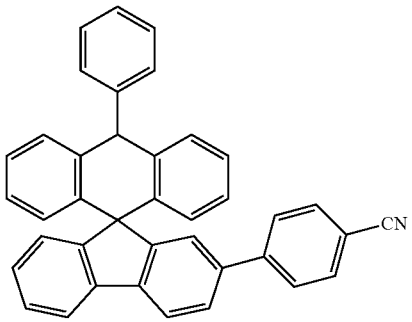
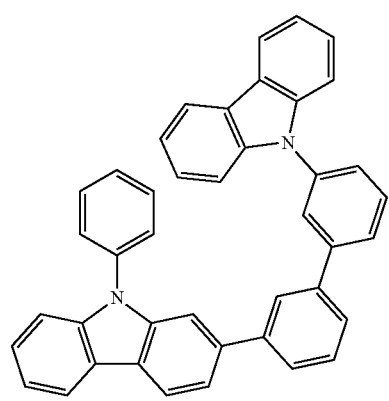
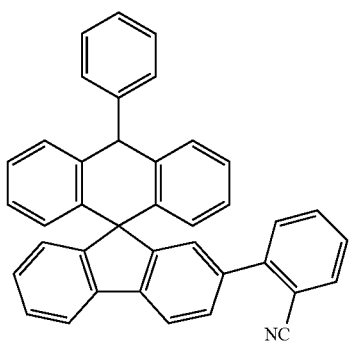

163
-continued
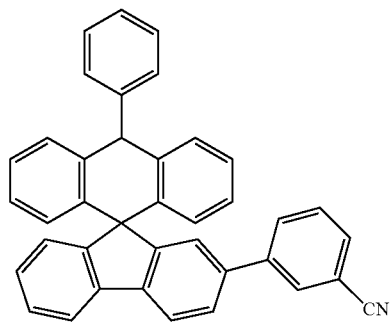
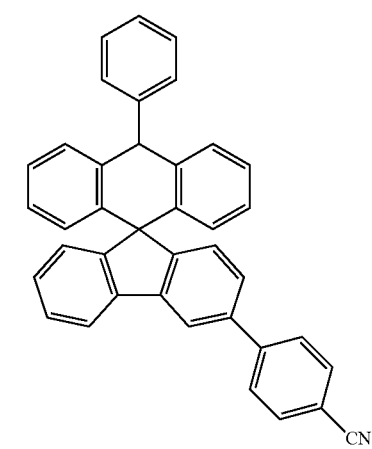
164
-continued
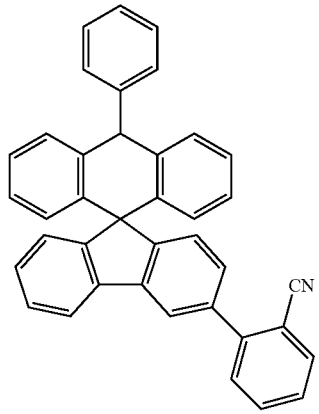
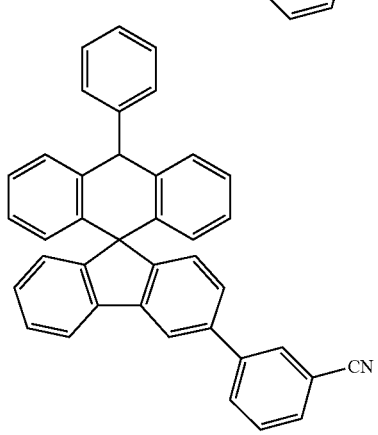
Glass Mixture 130:
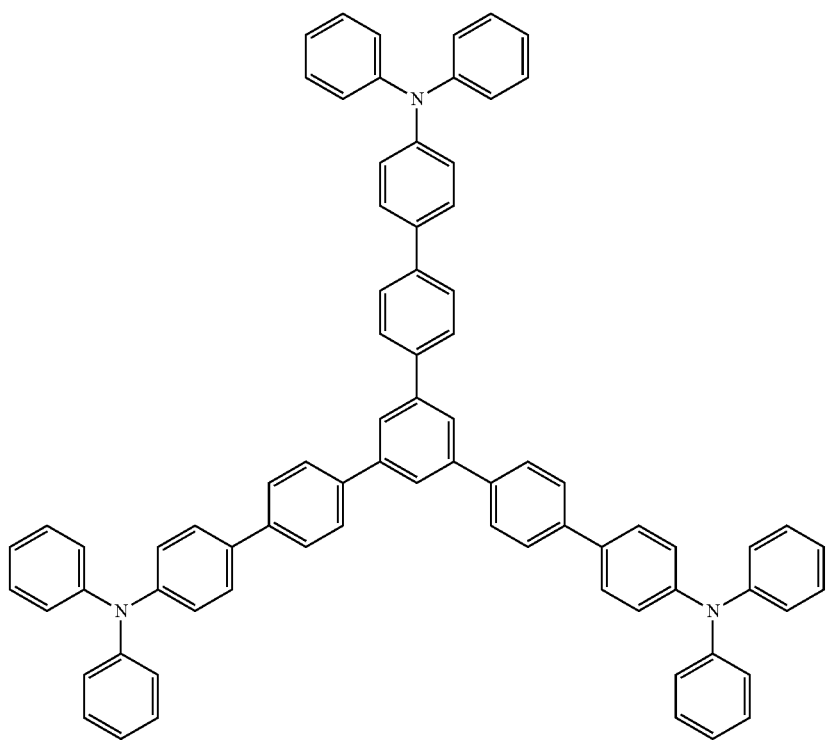

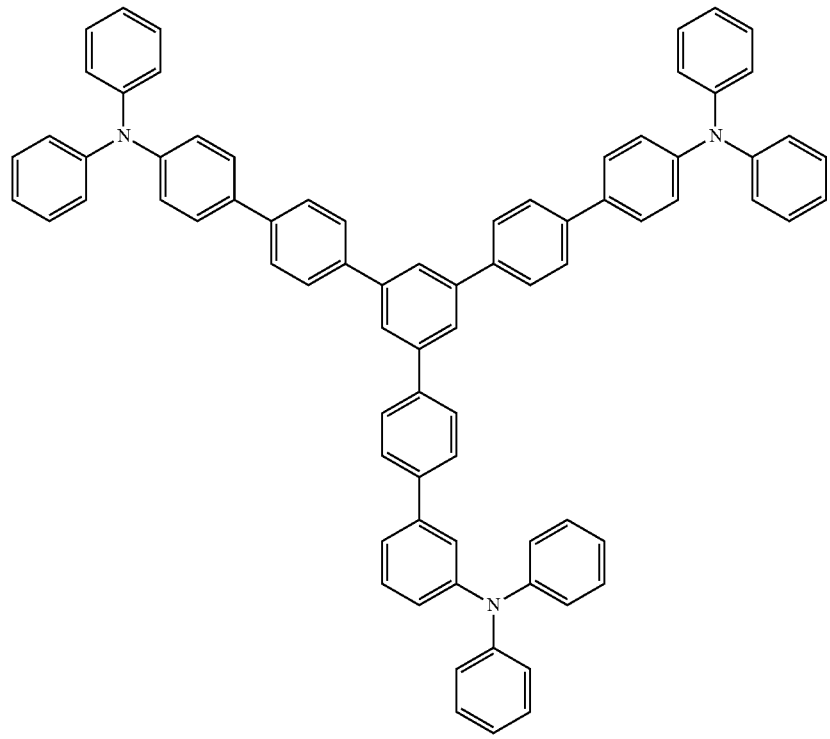
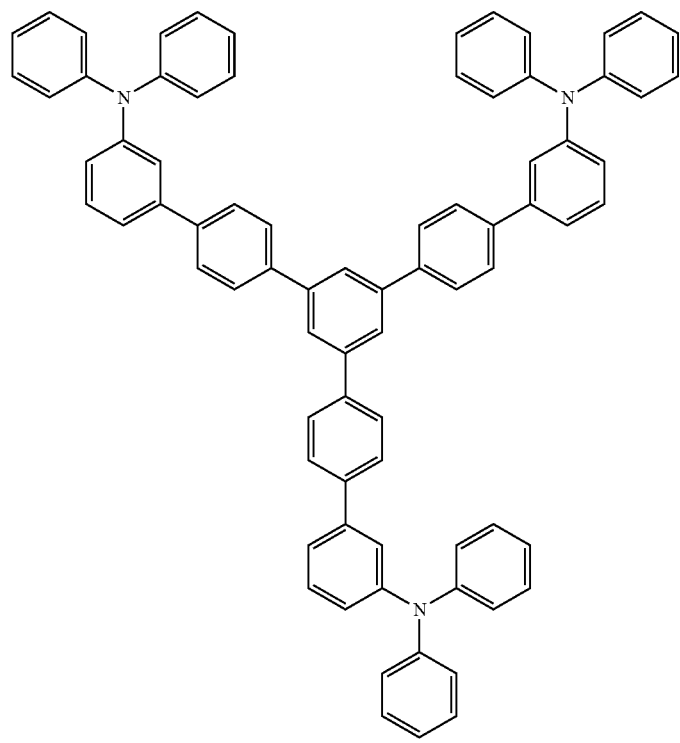

-continued
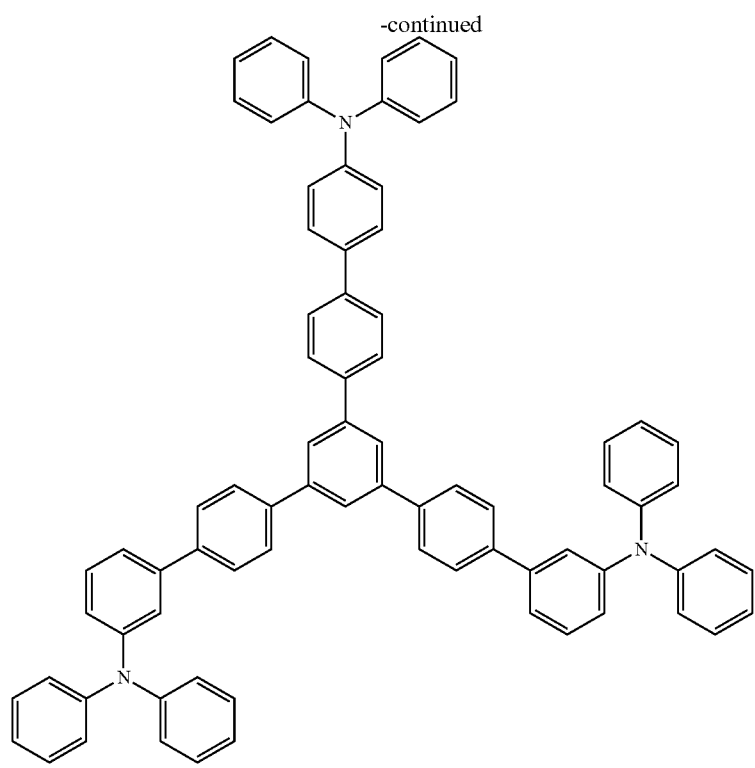
Glass Mixture 132 comprises the following structures:
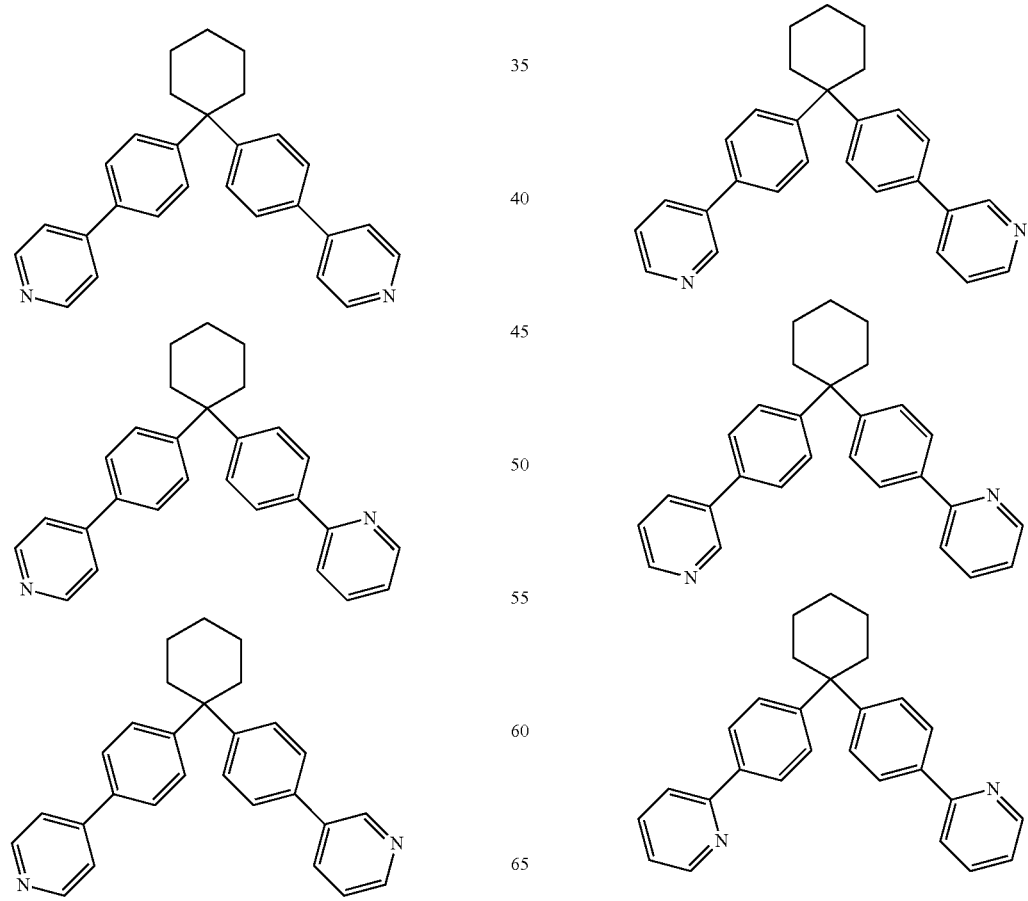

Glass Mixture 133 comprises the following structures:
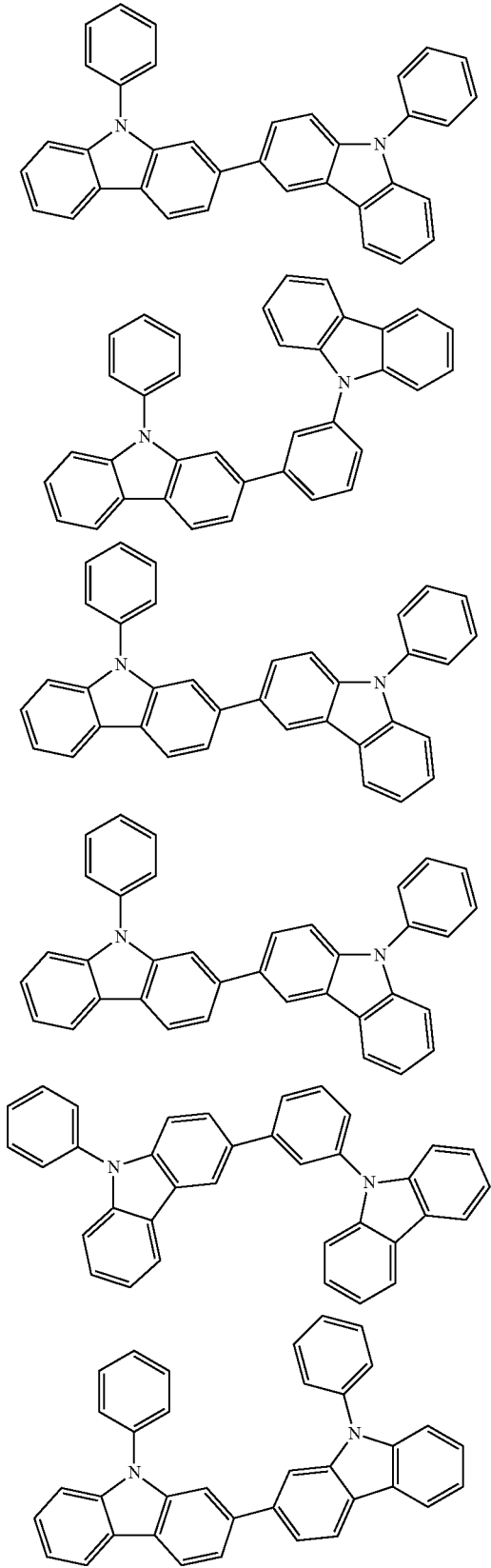
Glass Mixture 134 comprises the following structures:
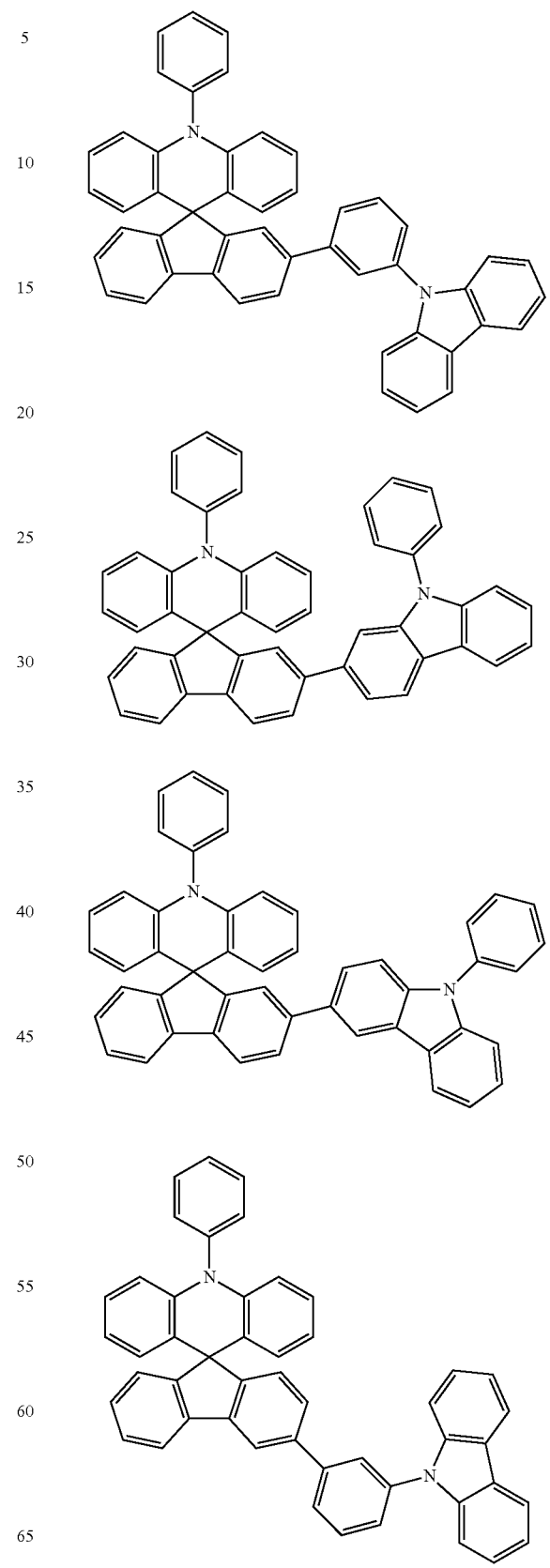

-continued
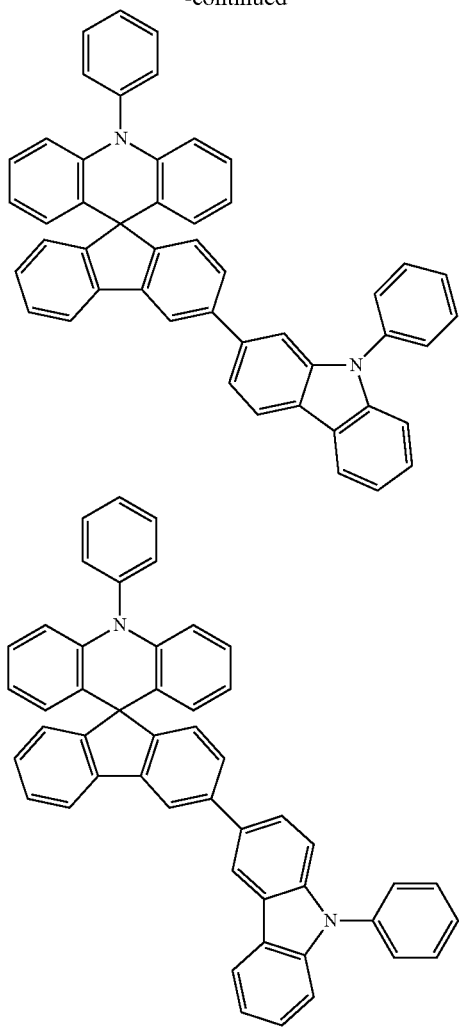
Glass Mixture 135 comprises the following structures:
-continued
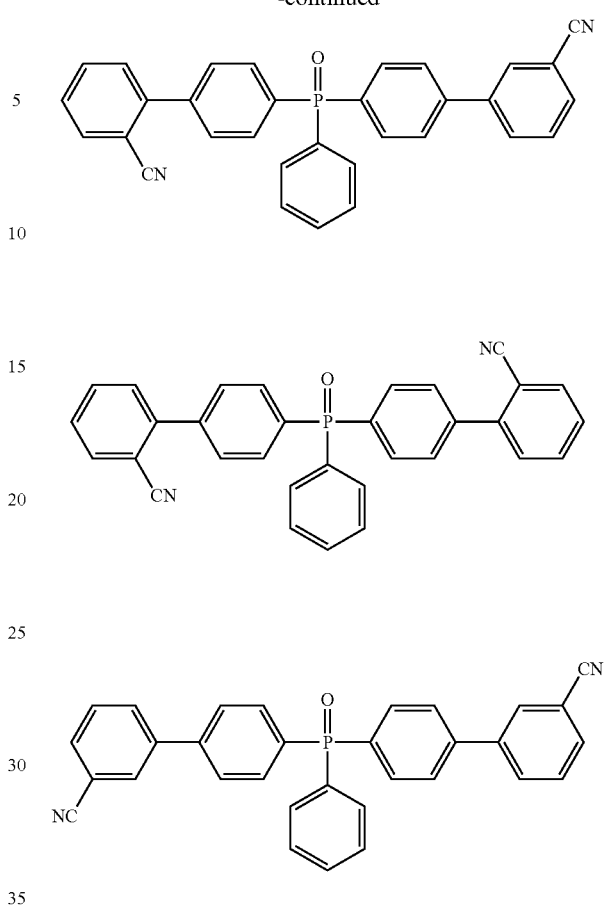
4. The OLED multilayer electroluminescent device according to claim 1, wherein the high-entropy non-crystallizable molecular glass mixture is selected from the group consisting of:
glass mixtures 4, wherein glass mixture 4 comprises the following structures:
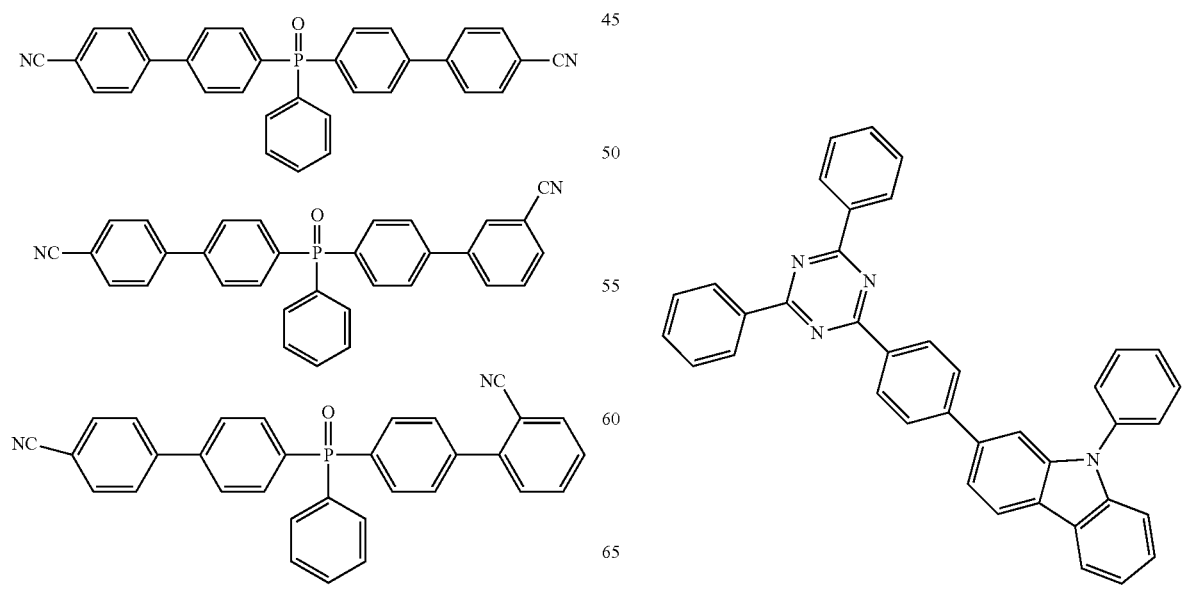

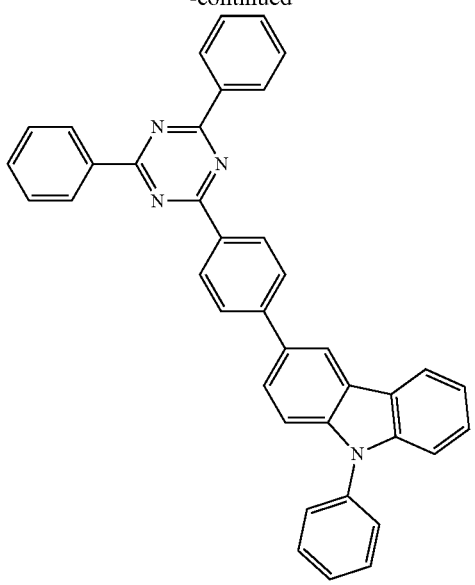
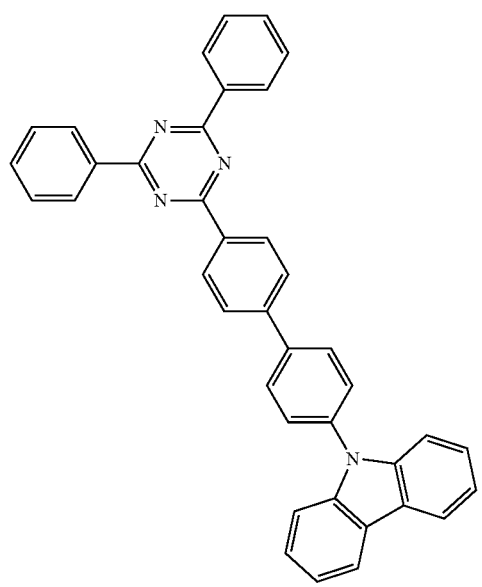
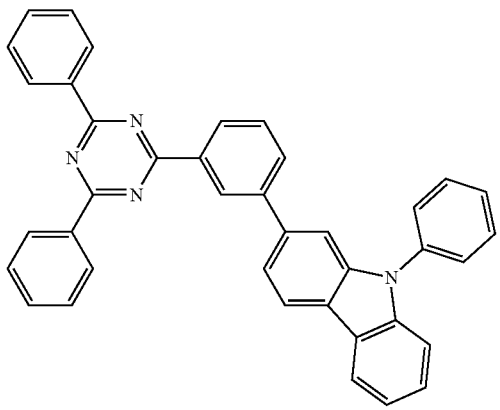
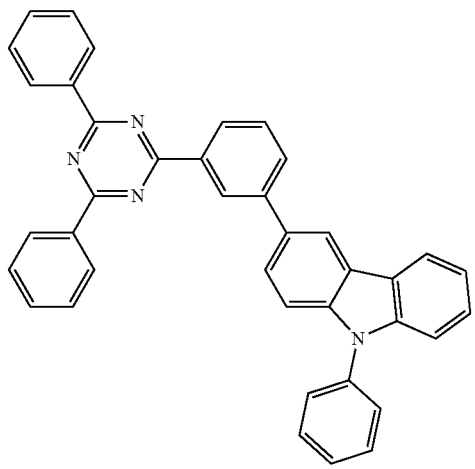
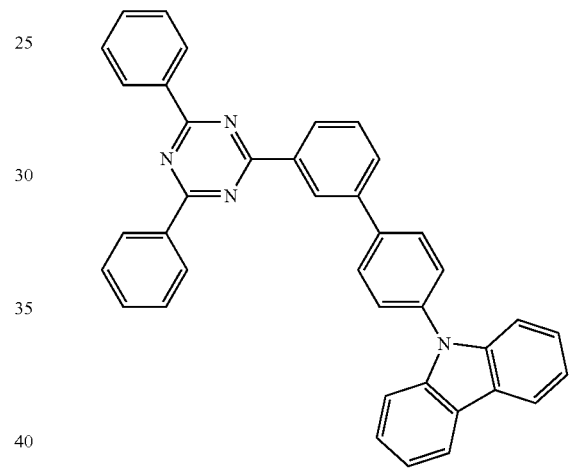
and glass mixture 22, wherein glass mixture 22 comprises the following structures:
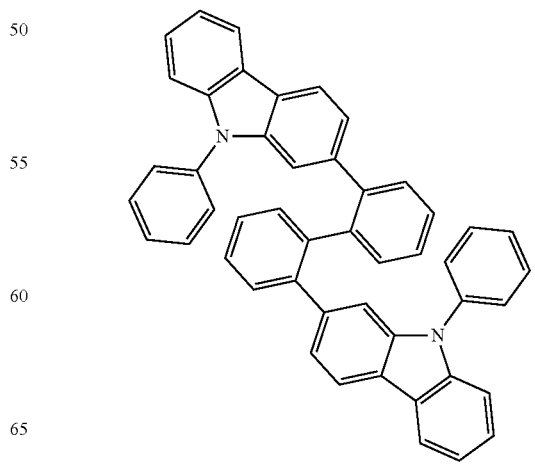

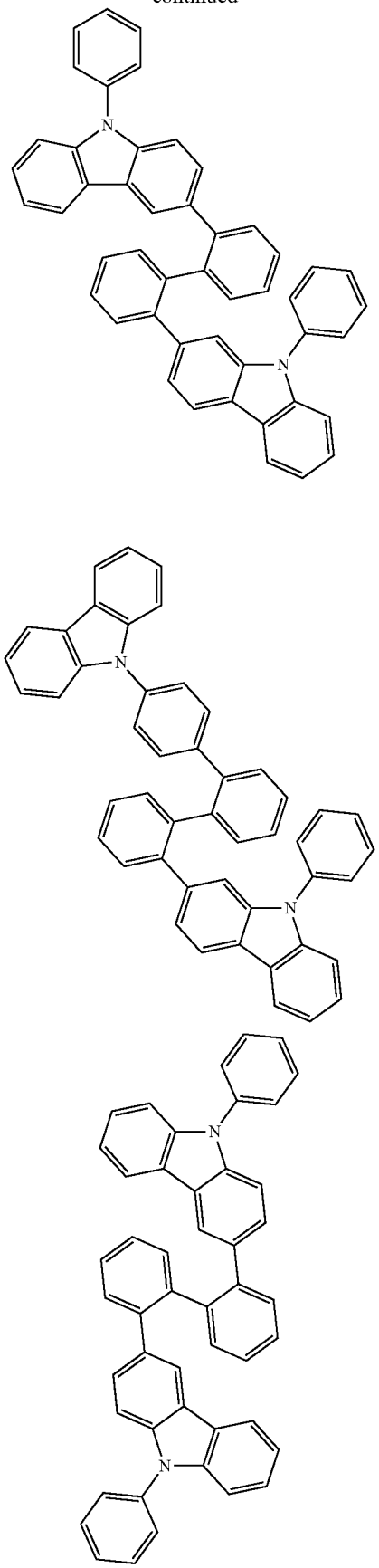

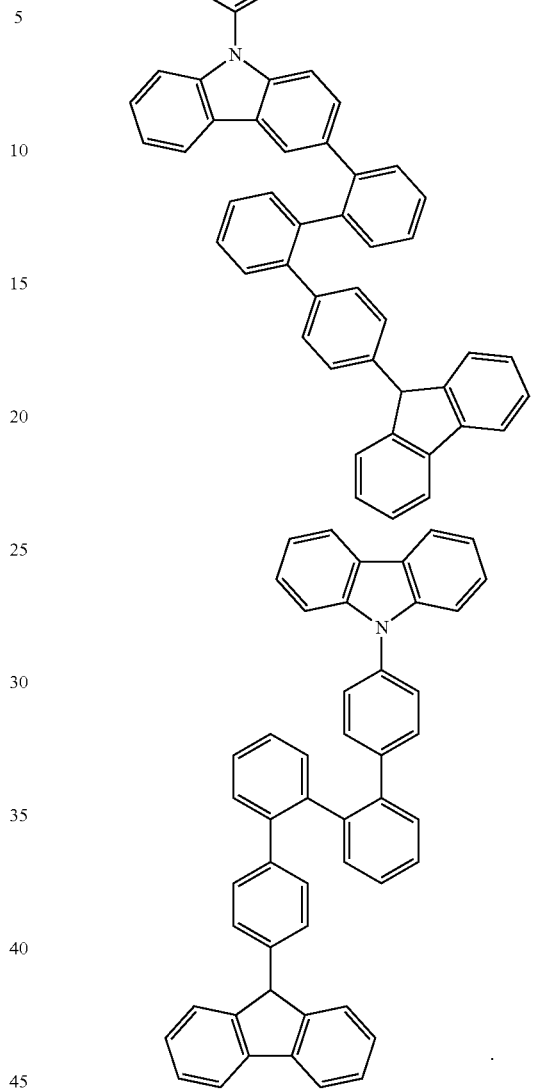

5. The OLED multilayer electroluminescent device according to claim 1, wherein the host material is of from 4 to 75 wt. % of the total weight of the light emitting layer.

6. The OLED multilayer electroluminescent device according to claim 1, wherein the host material is of from 4 to 32 wt. % of the total weight of the light emitting layer.

7. The OLED multilayer electroluminescent device according to claim 1, wherein the emitter dopant is of from 2 to 32 wt. % of the total weight of the light emitting layer.

8. The OLED multilayer electroluminescent device according to claim 3, wherein at least two of the three or more than three components comprising a structure according to formula (1):

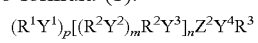

where:
m is zero or one; n is zero to eight; and p is one to eight;
$R^3$ and each $R^1$ independently represents a monovalent aliphatic or cycloaliphatic hydrocarbon group having 1 to 20 carbon atoms or an aromatic group or a multicyclic aromatic nucleus;

each $R^2$, $Z^1$, and $Z^2$ independently represent multivalent aliphatic or cycloaliphatic hydrocarbon groups having 1 to 20 carbon atoms or an aromatic group; and each $Y^1$, $Y^2$, $Y^3$, and $Y^4$ independently represents a triple bond, a double bond, or a single bond link;

provided that at least one of $R^1$, $Z^1$, $R^2$, $Z^2$ and $R^3$ is a multicyclic aromatic nucleus.

9. The OLED multilayer electroluminescent device according to claim 8, wherein the monovalent charge transport moiety is an electron-transport moiety and the multivalent transport moiety is a hole-transport moiety.

10. The OLED multilayer electroluminescent device according to claim 8, wherein the monovalent charge transport moiety is a mixture of electron-transport and hole-transport moiety and the multivalent transport moiety is a hole-transport moiety.

11. The OLED multilayer electroluminescent device according to claim 1 further comprising charge-injecting layers disposed between (A) the cathode and the light emitting layer, (B) the anode and the light emitting layer, or (C) both (A) and (B).

* * * * *